United States Patent
Shen et al.

(10) Patent No.: US 7,617,439 B2
(45) Date of Patent: *Nov. 10, 2009

(54) ALGEBRAIC CONSTRUCTION OF LDPC (LOW DENSITY PARITY CHECK) CODES WITH CORRESPONDING PARITY CHECK MATRIX HAVING CSI (CYCLIC SHIFTED IDENTITY) SUB-MATRICES

(75) Inventors: Ba-Zhong Shen, Irvine, CA (US); Joseph Paul Lauer, North Reading, MA (US); Christopher J. Hansen, Sunnyvale, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 519 days.

This patent is subject to a terminal disclaimer.

(21) Appl. No.: 11/292,135

(22) Filed: Dec. 1, 2005

(65) Prior Publication Data

US 2006/0156206 A1 Jul. 13, 2006

Related U.S. Application Data

(60) Provisional application No. 60/642,689, filed on Jan. 10, 2005, provisional application No. 60/674,084, filed on Apr. 22, 2005, provisional application No. 60/675,346, filed on Apr. 27, 2005, provisional application No. 60/700,127, filed on Jul. 18, 2005, provisional application No. 60/708,937, filed on Aug. 17, 2005, provisional application No. 60/716,868, filed on Sep. 14, 2005, provisional application No. 60/721,599, filed on Sep. 29, 2005.

(51) Int. Cl.
*H03M 13/00* (2006.01)
(52) U.S. Cl. .................... 714/784; 714/752; 714/788

(58) Field of Classification Search .................. 714/784, 714/752, 755, 788, 790, 792, 795, 800
See application file for complete search history.

(56) References Cited

U.S. PATENT DOCUMENTS 3,542,756 A 11/1970 Gallager
3,665,396 A 5/1972 Forney, Jr.

(Continued)

OTHER PUBLICATIONS

I. Djurdjevic, J. Xu., K. Abdel-Ghaffar, and S. Lin, "A Class of Low-Density Parity-Check Codes Constructed Based on Reed-Solomon Codes with Two Information Symbols," IEEE Communications Letters, vol. 7, No. 7, Jul. 2003, pp. 317-319.

(Continued)

*Primary Examiner*—Esaw T Abraham
*Assistant Examiner*—Fritz Alphonse
(74) *Attorney, Agent, or Firm*—Garlick Harrison & Markison; Shayne X. Short

(57) ABSTRACT

Algebraic method to construct LDPC (Low Density Parity Check) codes with parity check matrix having CSI (Cyclic Shifted Identity) sub-matrices. A novel approach is presented by which identity sub-matrices undergo cyclic shifting, thereby generating CSI sub-matrices that are arranged forming a parity check matrix of an LDPC code. The parity check matrix of the LDPC code may correspond to a regular LDPC code, or the parity check matrix of the LDPC code may undergo further modification to transform it to that of an irregular LDPC code. The parity check matrix of the LDPC code may be partitioned into 2 sub-matrices such that one of these 2 sub-matrices is transformed to be a block dual diagonal matrix; the other of these 2 sub-matrices may be modified using a variety of means, including the density evolution approach, to ensure the desired bit and check degrees of the irregular LDPC code.

42 Claims, 27 Drawing Sheets

U.S. PATENT DOCUMENTS

| | | | | |
|---|---|---|---|---|
| 3,668,632 | A | * | 6/1972 | Oldham, III ................ 714/775 |
| 4,295,218 | A | | 10/1981 | Tanner |
| 6,430,233 | B1 | | 8/2002 | Dillon et al. |
| 6,473,010 | B1 | | 10/2002 | Vityaev et al. |
| 6,567,465 | B2 | | 5/2003 | Goldstein et al. |
| 6,633,856 | B2 | | 10/2003 | Richardson et al. |
| 2002/0188906 | A1 | * | 12/2002 | Kurtas et al. ................ 714/755 |
| 2003/0037298 | A1 | * | 2/2003 | Eleftheriou et al. ......... 714/752 |
| 2003/0104788 | A1 | | 6/2003 | Kim |
| 2007/0033497 | A1 | * | 2/2007 | Shen et al. ................ 714/784 |

OTHER PUBLICATIONS

H. Zhong, and T. Zhang, "Block-LDPC: A Practical LDPC Coding System Design Approach," IEEE Transactions on Circuits and Systems, vol. 52, No. 4, Apr. 2005, pp. 766-775.

Sang-Min Kim, and K. K. Parhi "Overlapped Decoding For A Class Of Quasi-Cyclic LDPC Codes," IEEE 2004, pp. 113-117.

J. Campello, D. S. Modha, and S. Rajagopalan, "Designing LDPC Codes Using Bit-Filling," ICC 2001, 2001 IEEE International Conference on Communications, vol. 1 of 10, Jun. 2001, pp. 55-59.

T. J. Richardson, and R. L. Urbanke. "The Capacity of Low-Density Parity-Check Codes Under Message-Passing Decoding," IEEE Transactions on Information Theory, vol. 47, No. 2, Feb. 2001. pp. 599-618.

F. J. MacWilliams, "The Theory of Error-Correcting Codes" 1997, North-Holland Mathematical Library, pp. 300-305.

Lei Chen, "Construction of Quasi-Cyclic LDPC Codes Based on the Minimum Weight Codewords of Reed-Solomon Codes" International Symposium, IEEE, Jun. 2004. pp. 239.

Shu Lin, "Structured Low-Density Parity-Check Codes: Algebraic Constructions" Jul. 2004, pp. 1-67.

Amin Shokrollahi, "LDPC Codes: An Introduction" Internet Article, Apr. 2003, pp. 1-34.

J. I. Hall, "Notes on Coding Theory," Dept. of Mathematics, Michigan State University, East Lansing, MI 48824 USA, Jan. 3, 2003—"Chapter 5: Generalized Reed-Solomon Codes" Internet Article, Jan. 3, 2003, pp. 63-76.

R. G. Gallager, "Low density parity check codes," IRE Trans. Info. Theory, vol. IT-8, pp. 21-28, Jan. 1962.

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

"Joint proposal for LDPC Codes," Hughes Network System, ST Microelectronics and Texas Instrument, WWiSE Advanced Coding "Ad hoc" meeting, May 6, 2005.

Paul Gray and Keith Chugg, "F-LDPC for 802.11n advanced ECC," TrellisWare Technologies, Inc, (TWT-018), May 6, 2005.

\* cited by examiner

Fig. 23

ALGEBRAIC CONSTRUCTION OF LDPC (LOW DENSITY PARITY CHECK) CODES WITH CORRESPONDING PARITY CHECK MATRIX HAVING CSI (CYCLIC SHIFTED IDENTITY) SUB-MATRICES

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/642,689, entitled "Construction of LDPC (Low Density Parity Check) codes using generalized R-S (Reed-Solomon) code," filed Monday, Jan. 10, 2005 (01/10/2005), pending.

2. U.S. Provisional Application Ser. No. 60/674,084, entitled "Construction of Irregular LDPC (Low Density Parity Check) codes using RS (Reed-Solomon) codes or GRS (Generalized Reed-Solomon) code," filed Friday, Apr. 22, 2005 (04/22/2005), pending.

3. U.S. Provisional Application Ser. No. 60/675,346, entitled "Construction of Irregular LDPC (Low Density Parity Check) codes using RS (Reed-Solomon) codes or GRS (Generalized Reed-Solomon) code," filed Wednesday, Apr. 27, 2005 (04/27/2005), pending.

4. U.S. Provisional Application Ser. No. 60/700,127, entitled "Algebraic construction of LDPC (Low Density Parity Check) codes with corresponding parity check matrix having CSI (Cyclic Shifted Identity) sub-matrices," filed Monday, Jul. 18, 2005 (07/18/2005), pending.

5. U.S. Provisional Application Ser. No. 60/708,937, entitled "Algebraic construction of LDPC (Low Density Parity Check) codes with corresponding parity check matrix having CSI (Cyclic Shifted Identity) sub-matrices," filed Wednesday, Aug. 17, 2005 (08/17/2005), pending.

6. U.S. Provisional Application Ser. No. 60/716,868, entitled "Algebraic construction of LDPC (Low Density Parity Check) codes with corresponding parity check matrix having CSI (Cyclic Shifted Identity) sub-matrices," filed Wednesday, Sep. 14, 2005 (09/14/2005), pending.

7. U.S. Provisional Application Ser. No. 60/721,599, entitled "Algebraic construction of LDPC (Low Density Parity Check) codes with corresponding parity check matrix having CSI (Cyclic Shifted Identity) sub-matrices," filed Thursday, Sep. 29, 2005 (09/29/2005), pending.

Incorporation by Reference

The following U.S. Utility Patent Applications are hereby incorporated herein by reference in their entirety and made part of the present U.S. Utility Patent Application for all purposes:

1. U.S. Utility patent application Ser. No. 11/190,333, entitled "Construction of LDPC (Low Density Parity Check) codes using GRS (Generalized Reed-Solomon) code," filed Wednesday, Jul. 27, 2005 (07/27/2005), now U.S. Pat. No. 7,536,629.

2. U.S. Utility patent application Ser. No. 11/264,997, entitled "Construction of Irregular LDPC (Low Density Parity Check) codes using RS (Reed-Solomon) codes or GRS (Generalized Reed-Solomon) code," filed Wednesday, Nov. 2, 2005 (11/2/2005), now U.S. Pat. No. 7,549,105.

BACKGROUND OF THE INVENTION

1. Technical Field of the Invention

The invention relates generally to communication systems; and, more particularly, it relates to coding that may be employed to encode and/or decode coded signals for use in such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.1 In emerging standard).

For any of these particular communication system application areas, near-capacity achieving error correction codes are very desirable. The latency constraints, which would be involved by using traditional concatenated codes, simply preclude their use in such applications in very high data rate communication system application areas.

Clearly, there continues to be a need in the art for some alternative coding types and modulation implementations that can provide near-capacity achieving error correction. LDPC codes offer such performance. Clearly, there also continues to be a need in the art for means by which such LDPC codes may be designed for use in such communication system application areas.

There is no generally agreed "best" method to follow for the construction of LDPC codes with good performance. In the following reference [a], an LDPC code is constructed based on two codewords of an RS (Reed-Solomon) code.

[a] I. Djurdjevic, J. Xu., K. Abdel-Ghaffar, and S. Lin, "A Class of Low-Density Parity-Check Codes Constructed Based on Reed-Solomon Codes with Two Information Symbols," *IEEE Communications Letters*, Vol. 7, No. 7, July 2003, pp. 317-319.

However, these LDPC codes presented using the approach of this prior art reference are of a very narrow type and there is very little, if any, flexibility presented by this approach by which other types of LDPC codes may be designed. This lack of flexibility presents a significant challenge for any design of such LDPC codes and/or communication devices to be implemented using such LDPC codes. Clearly, there seems to be a continual need for additional and better types of codes for use in various communication systems to provide for better means of error correction and better BER (Bit Error Rate) while operating at various amounts of SNR (Signal to Noise Ratio).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 23 illustrates an embodiment of the permutation of one of the LDPC codes whose performance is depicted below within FIG. 24 (i.e., LDPC code ($C_8$)), and specifically the small loops existent therein.

DETAILED DESCRIPTION OF THE INVENTION

Figure 1:
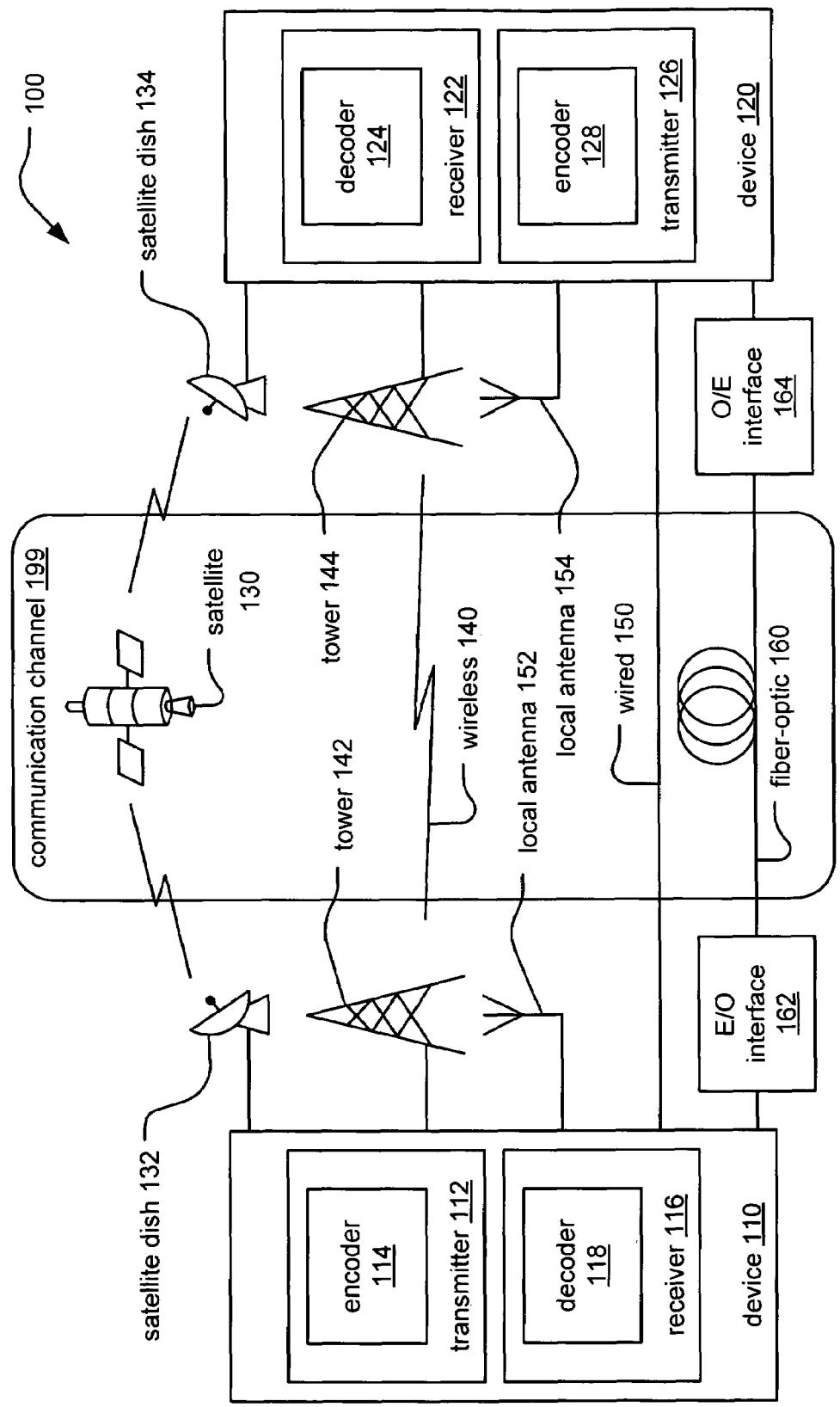
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
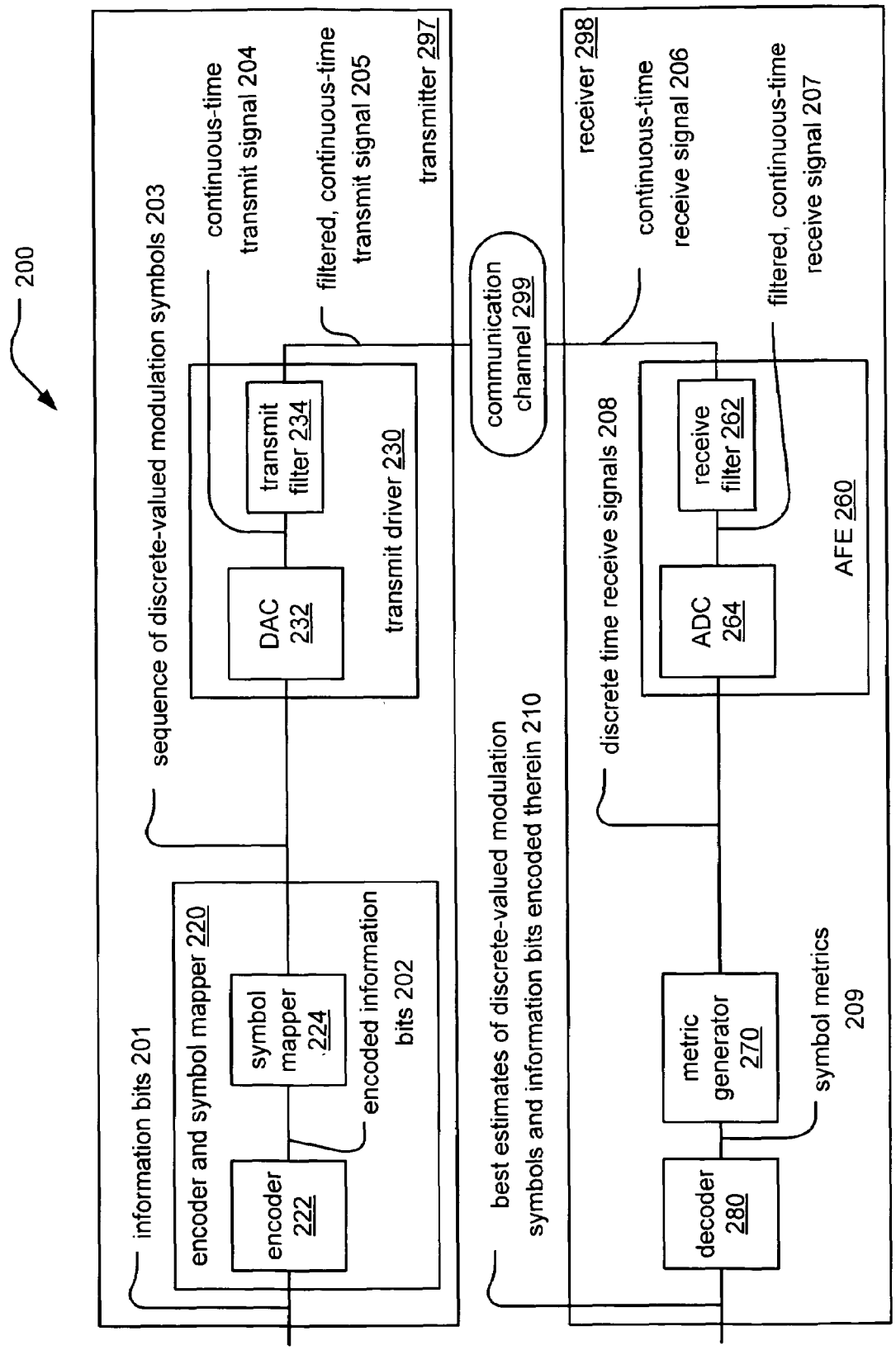

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
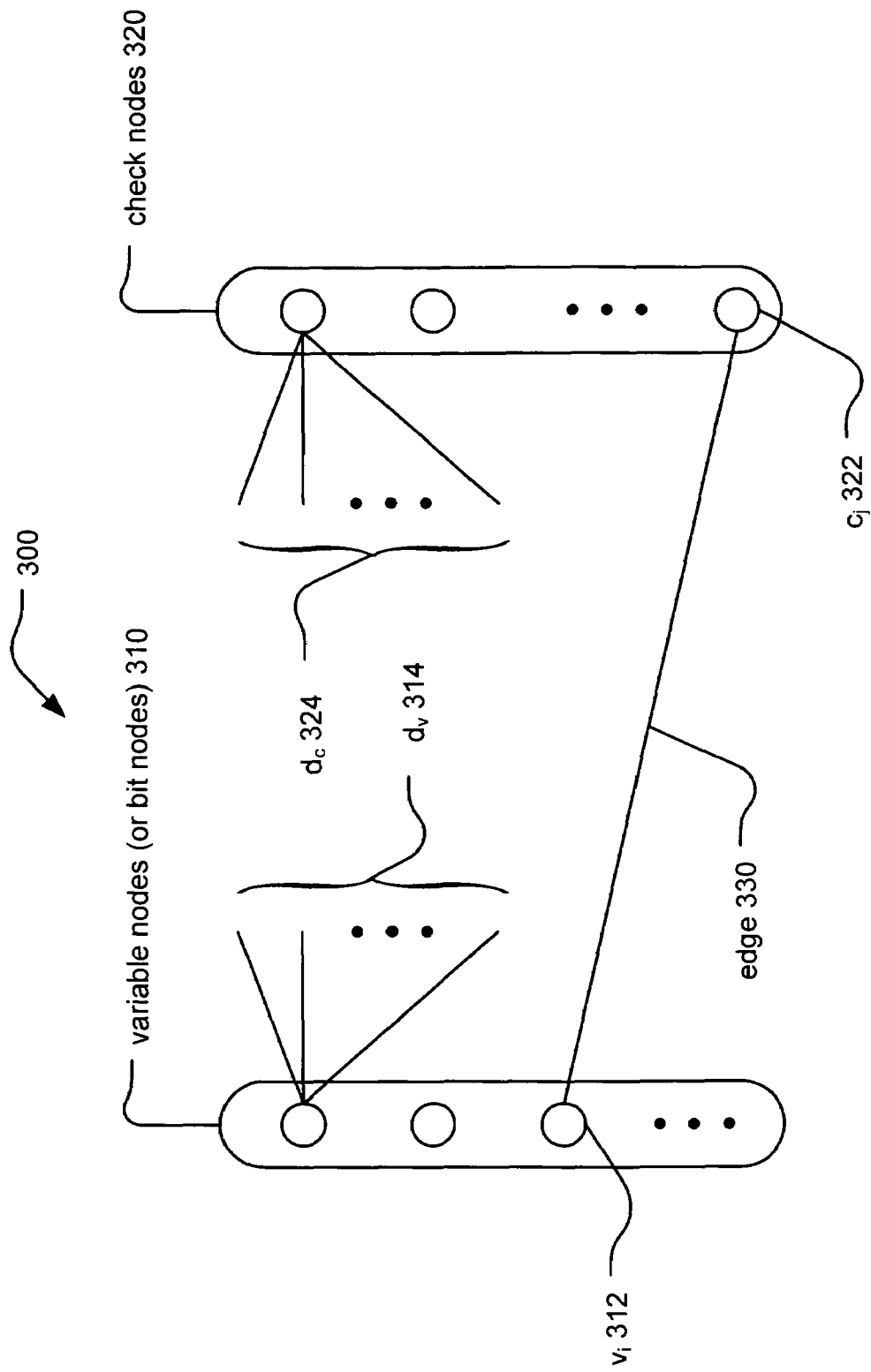
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or .alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i,j)$. However, on the other hand, given an edge $e=(i,j)$, the nodes of the edge may alternatively be denoted as by $e=(v(e),c(e))$ (or $e=(b(e),c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and}$$

$$\rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

Two methods are presented below that may operate using at least one LDPC code that has been constructed in accordance with certain aspects and/or embodiments of the invention.

Figure 4:
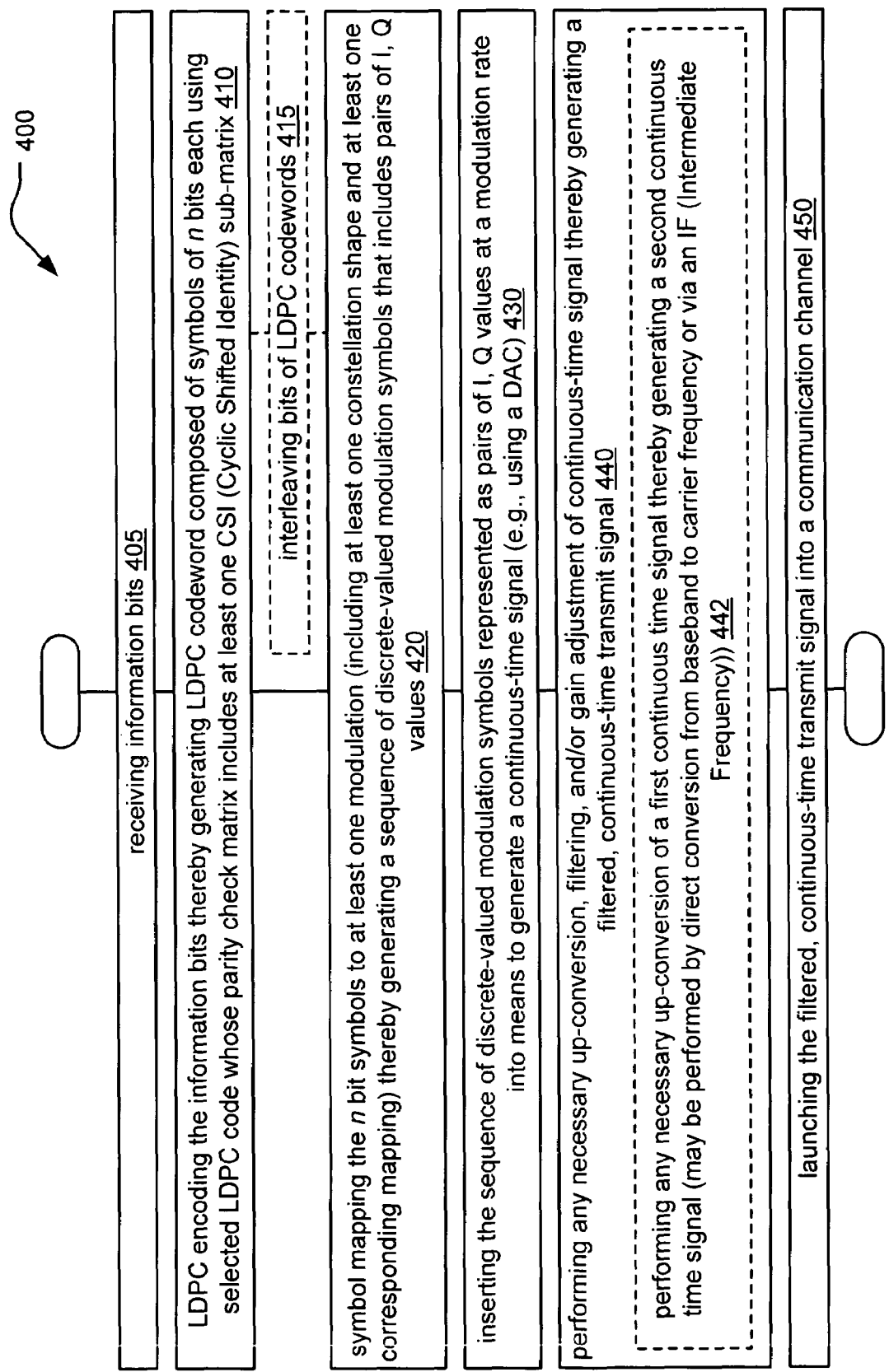
FIG. 4 illustrates an embodiment of a method for transmit processing of an LDPC coded signal generated using a selected LDPC code whose parity check matrix includes at least one CSI sub-matrix.

FIG. 4 illustrates an embodiment of a method for transmit processing 400 of an LDPC coded signal generated using a selected LDPC code whose parity check matrix includes at least one CSI sub-matrix. This diagram shows a method that may be viewed as being performed at a transmitter end of a communication channel.

This method also may be viewed as involving the generation of an LDPC coded signal as well as any operations to that are required to comport the LDPC coded signal to a communication channel into which a corresponding continuous-time transmit signal is to be launched.

Initially, this method involves receiving information bits, as shown in a block 405. These information bits correspond to the actual information that is desired to be transmitted from one end of a communication channel to the other. At the other end, an effort to making best estimates of these original information bits is made. Continuing on, this method involves LDPC encoding the information bits thereby generating an LDPC codeword composed of symbols of n bits each, as shown in a block 410. This encoding may be performed using a selected LDPC code whose parity check matrix includes at least one CSI (Cyclic Shifted Identity) sub-matrix. In some instances, the method may also involve interleaving the bits of a LDPC codeword after encoding them using an LDPC code, as shown in a block 415.

Then, as shown in a block 420, the method then continues on by symbol mapping the n bit symbols to at least one modulation (that includes at least one constellation shape and at least one corresponding mapping). In some embodiments, these n bit symbols are mapped to a number of different modulation types thereby generating a variable modulation and/or code rate signal whose modulation and/or code rate may vary as frequently as on a frame by frame basis or even as frequently as on a symbol by symbol basis. This symbol mapping of the n bit symbols to at least one modulation thereby generates a sequence of discrete-valued modulation symbols that includes pairs of I, Q values (or higher dimensional constellation). It is also noted that n is an integer. At this point, the sequence of discrete-valued modulation symbols may be viewed as being an LDPC coded modulation signal (being in completely digital form at this point).

The method then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). Each of these 2 diagram illustrated and described below show some possible method alternatives by which the receive processing of such a received continuous-time signal (e.g., at a receiver end of a communication channel) may be performed in an effort ultimately to make best estimates of the information bits that had been encoded therein.

Figure 5:
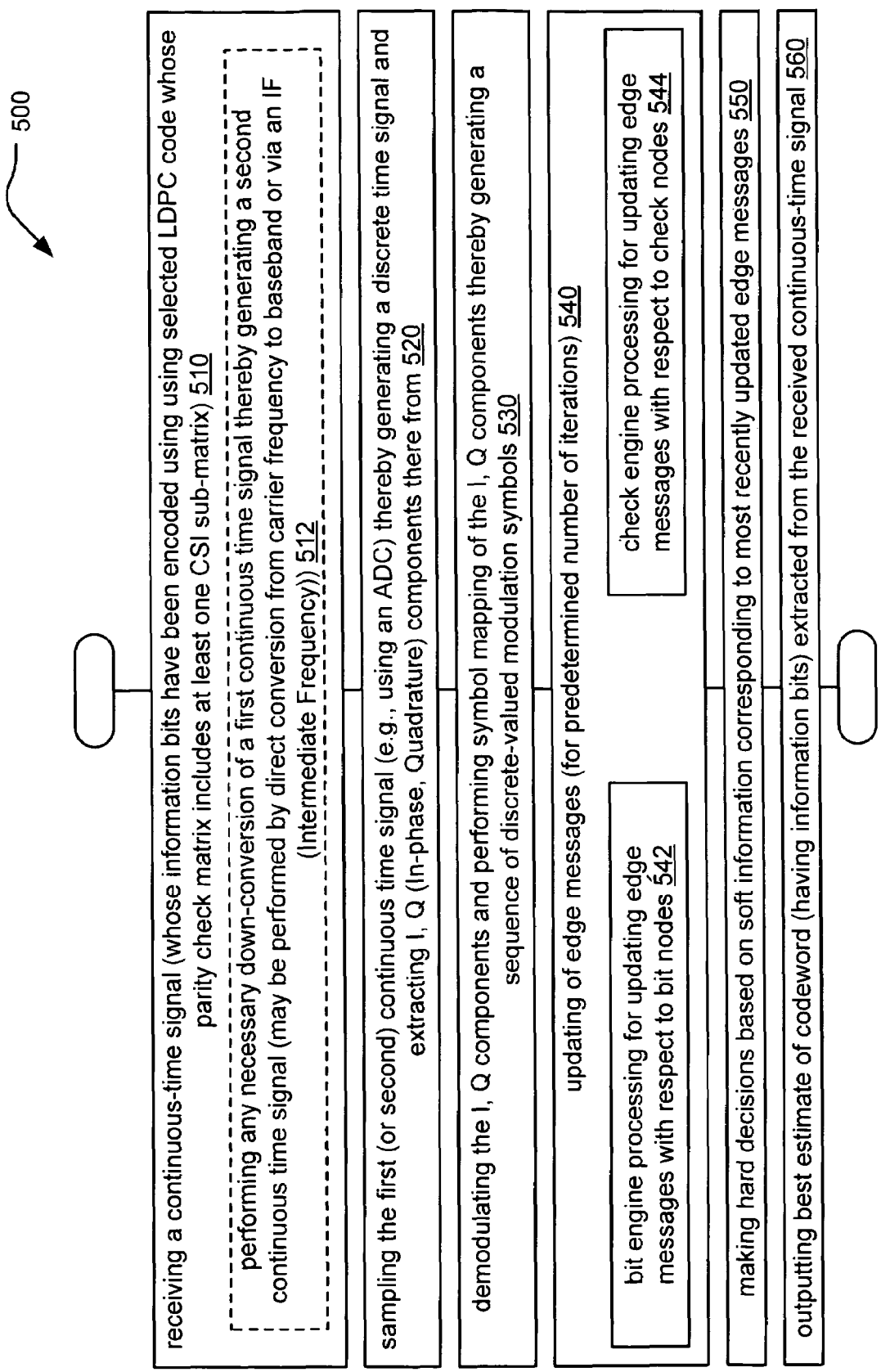
FIG. 5 illustrates an embodiment of a method for receive processing of an LDPC coded signal that has been generated using a selected LDPC code whose parity check matrix includes at least one CSI sub-matrix.

FIG. 5 illustrates an embodiment of a method for receive processing 500 of an LDPC coded signal that has been generated using a selected LDPC code whose parity check matrix includes at least one CSI sub-matrix. The method initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method.

The method also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method then involves demodulating the I, Q components and performing symbol mapping of the I, Q components thereby generating a sequence of discrete-valued modulation symbols, as shown in a block 530.

The next step of the method of this embodiment involves performing updating of edge messages for a predetermined number of iterations, as shown in a block 540. This step may be viewed as performing the LDPC decoding in accordance with any of the various embodiments described above. This LDPC decoding generally involves bit engine processing for updating edge messages with respect to bit nodes (as shown in a block 542) as well as check engine processing for updating edge messages with respect to check nodes (as shown in a block 544).

After the final decoding iteration of the predetermined number of decoding iterations (or until all syndromes of the LDPC code are equal to zero in an alternative embodiment), the method involves making hard decisions based on soft information corresponding to most recently updated edge messages with respect to the bit nodes, as shown in a block 550. The method ultimately involves outputting a best estimate of the codeword (that includes the information bits) that has been extracted from the received continuous-time signal, as shown in a block 560.

As mentioned above in the Djurdjevic, et al. reference [a], a narrow type of LDPC codes is constructed based on two codewords of an RS (Reed-Solomon) code.

In "Construction of LDPC (Low Density Parity Check) codes using GRS (Generalized Reed-Solomon) code," (U.S. Ser. No. 11/190,333), that has been incorporated herein by reference above, a generalized approach is presented by which LDPC codes may be generated using GRS (Generalized Reed-Solomon).

Using an RS code or GRS code to construct a regular LDPC code provides a good estimate of the minimum distance of the code. The error floor of this kind of regular LDPC code appears at a lower error rate. However, it is well known in the art that regular LDPC codes are not as good as irregular LDPC codes for achieving channel capacity (or Shannon limit) within a communication system.

In "Construction of Irregular LDPC (Low Density Parity Check) codes using RS (Reed-Solomon) codes or GRS (Generalized Reed-Solomon) code," (U.S. Ser. No. 11/264,997), that has been incorporated herein by reference above, an approach is presented by which LDPC codes may be constructed that have good performance for both error floor and achieving capacity. The approach presents a means to construct irregular LDPC codes based on RS or GRS codes which have performance even closer to the Shannon limit that previous LDPC codes. The parity check matrix of such an LDPC code obtained from the above-mentioned approach is constructed using square sub-matrices of a given size. Those sub-matrices are either permutation matrices obtained from identity matrices or all zero-valued matrices (e.g. matrices having all 0-valued (zero-valued) elements). However, the arbitrary permutation of these matrices may cause complications and increased complexity in hardware (e.g., communication device) that is implemented to decode LDPC coded signals that have been generated using such an LDPC code.

One possible approach, that is presented herein, that can simplify the hardware design of such hardware (e.g., a communication device) that is implemented to decode LDPC coded signals is to make all of the permutation matrices to be CSI (Cyclic Shifted Identity) matrices. Herein, an approach is presented by which LDPC codes may be constructed using RS codes or GRS code such that the corresponding parity check matrices of these LDPC codes consist either of all zero-valued sub-matrices (e.g. sub-matrices having all 0-valued (zero-valued) elements) or sub-matrices that have been generated using cyclic shifting of identity matrices (e.g., sub-matrices that are CSI (Cyclic Shifted Identity) matrices).

One of the several attributes of employing an LDPC code whose parity check matrix, H, includes CSI sub-matrices is the reduction in complexity provided by the CSI characteristics of the one or more sub-matrices. For example, only one value needs to be stored per sub-matrix, and it is much easier to implement cyclic shifting (i.e., in the actual hardware of a communication device) than the permuting that is required when decoding other types of LDPC coded signals.

In many of the embodiments described below, the low density parity check matrix, H, of an LDPC code is shown as having the following properties: $H=[H_1 \ H_2]$. A designer is provided no restriction at all when designing the left hand side matrix, $H_1$. For example, when designing an irregular LDPC code according to any of the embodiments presented herein, a designer can perform any desired puncturing to the left hand side matrix, $H_1$. However, a designer is provided many alternative embodiments, and variations thereof, below when designing the right hand side matrix, $H_2$. Row and column permuting can be performed to the entire low density parity check matrix, H, or only to one of the left hand side matrix, $H_1$, or the right hand side matrix, $H_2$, without departing from the scope and spirit of the invention.

Dimensional 2 (2-D) RS and GRS Codes

Finite Field

Much of the LDPC code generation is described herein in the context of a finite field (e.g., a Galois field). Consider a finite field (Galois field) GF(q), where $q=p^m$ and p is a prime number and integer m>0. Let a be a primitive element of this field. Then, the Galois field may be defined as follows:

$$GF(q) = \{0, \alpha, \ldots, \alpha^{q-1}\} \quad \text{(EQ 1)}$$

Dimension Two (2-D) GRS Codes or Shortened RS Codes

Let $p \leq q-1$. Let C be a dimension two (2-D) shortened RS code of length ρ. Then, it is well known that the minimum distance of such an RS code is $\rho-2+1=\rho-1$. Moreover, the codewords in this code have weight (i.e., the number of non-zero elements) of either ρ or ρ−1.

In the above-mentioned Djurdjevic, et al. reference [a], one way to construct such a code is given and can be described as follows:

Define, a polynomial such that $$g(x) = (x-\alpha)(x-\alpha^2)\ldots(x-\alpha^{\rho-2}) = \sum_{i=0}^{\rho-2} g_i x^i \quad \text{(EQ 2)}$$

where $g_{\rho-2}=1$. Then using this polynomial to generate a 2-D code with the following generator matrix.

$$G = \begin{bmatrix} g_0 & g_1 & \cdots & g_{\rho-3} & 1 & 0 \\ 0 & g_0 & \cdots & g_{\rho-4} & g_{\rho-3} & 1 \end{bmatrix} \quad \text{(EQ 3)}$$

When employing GRS code, the integer ρ can be any number between 1 to q. When taking a location set $L=\{\alpha^{i_0}, \ldots, \alpha^{i_{\rho-1}}\} \subseteq GF(q)$ (i.e., a subset of finite field (Galois field) GF(q), which may include the entire finite field (Galois field) GF(q)) and taking a non-zero elements set, $V=\{v_0, v_1, \ldots, v_{\rho-1}\}$, that include the ρ non-zero elements $v_0, v_1, \ldots, v_{\rho-1}$ from the Galois field, GF(q), then a k-D GRS code (i.e., $GRS_k(L, V)$) can be generated as follows:

$$GRS_k(L,V) = \{(v_0 f(\alpha^{i_0})), (v_1 f(\alpha^{i_1})), \ldots, (v_{\rho-1} f(\alpha^{i_{\rho-1}})) \\ | f \in GF(q)[x], \deg(f) < k\} \quad \text{(EQ 4)}$$

where GF(q)[x] is a polynomial ring over GF(q). Similarly, the codewords in this k-D GRS code have weight (number of non-zero elements) either ρ or ρ−1.

It is noted GRS code is maximum-distance separable (MDS). In this description above, if a 2-D GRS code is considered (i.e., k=2), the GRS code ($GRS_k(L,V)$) is a (n,2, n−1) code with a minimum distance, $d_{min}$=n−1. This implies that there is at most 1 component that is the same between any two different codewords of the GRS code ($GRS_k(L, V)$).

An LDPC can be defined directly by its low density parity check matrix, H. Once the low density parity check matrix, H, of an LDPC code is provided, all of the necessary information exists for the implementation of a communication system employing such an error correcting code) (at least with respect to the error correcting code aspects thereof). That is to say, once the low density parity check matrix, H, is available for use in decoding processing at, a receiving end of a communication channel, a corresponding generator matrix, G, of the LDPC code may be generated straightforwardly from the low density parity check matrix, H. Having this information allows a designer to implement the encoding processing (using any one generator matrix, G, that corresponds to the LDPC code) at the transmitter end of the communication channel and also to decoding processing (using the low density parity check matrix, H, of the LDPC code) at the receiver end of the communication channel.

Alternatively, the very same low density parity check matrix, H, of the LDPC code can also be employed to encoding of information bits. In such an embodiment, the same low density parity check matrix, H, is employed during both encoding and decoding. There are approaches known in the art by which a low density parity check matrix, H, can be employed to perform encoding processing (e.g., using back substitution).

The iterative decoding processing of any LDPC code can be carried out using parallel processing (e.g., at least some degree of parallel processing). However, when the block size of the LDPC code becomes too large, the only available means of parallel processing involves partially parallel processing. For example, the low density parity check matrix, H, of the LDPC code can be represented as follows:

$$H = \begin{bmatrix} P_{1,1} & P_{1,2} & \cdots & P_{1,\rho} \\ P_{2,1} & P_{2,2} & \cdots & P_{2,\rho} \\ \vdots & \vdots & \ddots & \vdots \\ P_{\gamma,1} & P_{\gamma,2} & \cdots & P_{\gamma,\rho} \end{bmatrix},$$

where each sub-matrix, $P_{i,j}$, is an s×s matrix that is one of the following:
1. all all-zero sub-matrix (e.g., a sub-matrix including all 0 valued elements);
2. a CSI (Cyclic Shifted Identity) sub-matrix; or
3. 2 or more CSI sub-matrices added together.

The processing that is involved transforming from GRS code to an LDPC code is described in more detail below.

Location Map

Denote a non-zero elements set of Galois field as follows: $GF^*(q)=GF(q)/\{0\}$. This non-zero elements set of Galois field, $GF^*(q)$, indicates that there is no zero element (i.e., no element 0 or no all-zero vector in this finite field) therein (i.e., $GF^*(q)$ includes no all zero valued vector). Therefore, if the Galois, field, GF(q), includes q elements, then the non-zero elements set of Galois field, $GF^*(q)$, includes (q−1) elements. Thus, if α is a primitive element of the finite field (Galois field) GF(q), then the non-zero elements set of Galois field includes the following property.

$GF^*(q)=\{1=\alpha^0, \alpha^2, \alpha^2, \ldots, \alpha^{q-2}\}=\langle\alpha\rangle$ (EQ 5)

Moreover, we have $\alpha^{q-1}=1$.

As can be seen, there is no zero-valued element in the non-zero elements set of Galois field, $GF^*(q)$.

A location set, $L=\{\alpha_0,\alpha_1,\ldots,\alpha_{\rho-1}\}\underline{\subseteq}GF^*(q)$, and a non-zero elements set, $V=\{v_0,v_1,\ldots,v_{\rho-1}\}\subseteq GF^*(q)$, that include ρ non-zero elements $v_0,v_1,\ldots,v_{\rho-1}$ are both selected from the non-zero elements set of Galois field, $GF^*(q)$. That is to say, each of the location set, L, and the non-zero elements set, V, is either a corresponding subset of non-zero elements set of Galois field, $GF^*(q)$. Either of the location set, L, and the non-zero elements set, V, can include the entire non-zero elements set of Galois field, $GF^*(q)$.

Then, a plurality of degree 1 polynomial functions is generated. These polynomial functions can be represented as follows:

$f_i(x)=a_i x+b_i$, where i=0, . . . , σ−1, and such that $f_i \neq \beta \cdot f_j, \forall \beta \in GF^*(q)\backslash\{1\}$, for i≠j.

As can be seen, each of the degree 1 polynomial functions, $f_i$, is a function of one corresponding coefficient, $a_i$, and one corresponding constant, $b_i$. In addition, none of the degree 1 polynomial functions, $f_i$, is a multiple of one another by any value, β, such that β is an element of the non-zero elements set of Galois field, $GF^*(q)$ excluding the value of 1.

It is also noted that the values of $a_i$, and $b_i$ are determined according to conditions that are set out and described in more detail below. Generally speaking, each of these values of $a_i$ and $b_i$ is determined by the location set, L, and the non-zero elements set, V, that are described above. These values of $a_i$ and $b_i$ can be selected by a designer to achieve the type of code structure that is desired for a particular application.

According to this, when considering a 2-D GRS code, the codewords of a 2-D GRS code, $GRS_2(L,V)$, can be generated as follows:

$c_i=(c_{i,0},\ldots,c_{i,\rho-1})=(v_0 \cdot f_i(\alpha_0),\ldots,v_{\rho-1}\cdot f_i(\alpha_{\rho-1}))$
$\in GRS_2(L,V)$ As can be seen, each codeword of the GRS code, $C_{GRS}$, includes a number of elements, $c_{i,j}$. Moreover, each codeword element, $c_{i,j}$, is a product of one element of the non-zero elements set, V (e.g., $v_i$), and one degree 1 polynomial that is evaluated at one element of the location set, L (e.g., $f_i(\alpha_j)$).

From this, the following properties also are true:

$\{\beta\cdot c_i|\beta\in GF^*(q)\}\cap\{\beta\cdot c_j|\beta\in GF^*(q)\}=\emptyset$, for i≠j, where "∅" indicates the "empty set".

Therefore, the following relationship is also true.

$d(\beta\cdot c_i,\gamma\cdot c_j)\geq\rho-1$, for i≠j, where $\beta,\gamma\in GF^*(q)$.

From this, the GRS code (shown here as $C_{GRS}$) can be defined as follows:

$C_{GRS}=\{c_i|i=0,\ldots,\sigma-1\}$

The mapping from the GRS code, $C_{GRS}$, to the LDPC code is performed by mapping the field elements of the GRS code, $C_{GRS}$, to various CSI matrices that subsequently compose the sub-matrices of a low density parity check matrix, H. This can be viewed as mapping each element of each codeword of the GRS code (e.g., $c_{i,j}$) according to a CSI (Cyclic Shifted Identity) mapping thereby generating a number of CSI sub-matrices. One generated, these CSI sub-matrices are arranged according to a desired manner to generate a low density parity check matrix, H, that correspond to an LDPC code.

Over the non-zero elements set of Galois field, $GF^*(q)=\{1=\alpha^0,\alpha^1,\alpha^2,\ldots\alpha^{q-2}\}=\langle\alpha\rangle$, an elementary vector $e_i$ can be defined in the binary space $\{0,1\}^{q-1}$ to be a vector of size q-1 such that its all components are 0 except the i-th component. Thus $$e_0=(1,0,\ldots,0), e_1=(0,1,\ldots,0),\ldots, e_{q-2}=(0,0,\ldots 1) \quad (EQ\ 6)$$

Define a location map $M:GF^*(q) \to \{0,1\}^{q-1}$ such that $M(\alpha^i)=e_i$. Obviously, the location map is a one to one map.

CSI (Cyclic Shifted Identity) Matrix Construction

A $(q-1)\times(q-1)$ identity matrix, $I_{q-1}$, is defined to be a matrix such that the entries (i.e., elements) in the diagonal are 1 and the rest of the entries are all 0. Therefore, $$I_{q-1} = \begin{bmatrix} e_0 \\ e_1 \\ \ldots \\ e_{q-2} \end{bmatrix} \quad (EQ\ 7)$$

A CSI (Cyclic Shifted Identity) matrix is obtained by cyclically shifting the every row in the same position. For example, shift 1 position of $I_{q-1}$, we obtain $$\begin{bmatrix} e_1 \\ e_2 \\ \ldots \\ e_{q-2} \\ e_0 \end{bmatrix} \quad (EQ\ 8)$$

Let $\gamma \in GF^*(q)$ and $GF^*(q)=\langle\alpha\rangle$. Then it is obvious that $\alpha^i\gamma \neq \alpha^j\gamma$ if $0 \leq i,j \leq q-2$ and $i \neq j$. Define the following $(q-1)\times(q-1)$ binary matrix according to the CSI mapping:

$$CSI_S(\gamma) = \begin{bmatrix} M(\gamma) \\ M(\alpha\gamma) \\ \ldots \\ M(\alpha^{q-2}\gamma) \end{bmatrix} \quad (EQ\ 9)$$

Suppose $\gamma \in \alpha^{j_0}$, then $\alpha^i\gamma = \alpha^{(i+i_0)mod(q-1)}$. Thus, $M(\alpha^i\gamma) = e_{(i+i_0)mod(q-1)}$. This shows that $CSI_S(\gamma)$ is the matrix obtained by cyclic shifting the $i_0$-th position of $I_{q-1}$.

EXAMPLE 1

Let $q=7$ and $a=3$. Then we have $\alpha^2=2, \alpha^3=6, \alpha^4=4, \alpha^5=5, \alpha^6=1=\alpha^0$. Thus, $$GF^*(7)=\{1,2,3,4,5,6\}=\{,\alpha^0,\alpha^1,\alpha^2,\alpha^3,\alpha^4,\alpha^5\} \quad (EQ\ 10)$$

Take $\gamma=\alpha^3 \in GF^*(7)$, Then we have $$\alpha\gamma=\alpha^4, \alpha^2\gamma=\alpha^5, \alpha^3\gamma=1=\alpha^0, \alpha^4\gamma=\alpha, \alpha^5\gamma=\alpha^2 \quad (EQ\ 11)$$

Thus, $$CSI_S(\gamma) = \begin{bmatrix} 0 & 0 & 0 & 1 & 0 & 0 \\ 0 & 0 & 0 & 0 & 1 & 0 \\ 0 & 0 & 0 & 0 & 0 & 1 \\ 1 & 0 & 0 & 0 & 0 & 0 \\ 0 & 1 & 0 & 0 & 0 & 0 \\ 0 & 0 & 1 & 0 & 0 & 0 \end{bmatrix} \quad (EQ\ 12)$$

From this, a low density parity check matrix, $H(C_{GRS})$, being a function of the GRS code, $C_{GRS}$, can be defined as follows:

$$H(C_{GRS}) = \begin{bmatrix} CSI(c_{0,0}) & CSI(c_{0,1}) & \cdots & CSI(c_{0,n-1}) \\ CSI(c_{1,0}) & CSI(c_{1,1}) & \cdots & CSI(c_{1,n-1}) \\ \vdots & \vdots & \ddots & \vdots \\ CSI(c_{n-k-1,0}) & CSI(c_{n-k-1,1}) & \cdots & CSI(c_{n-k-1,n-1}) \end{bmatrix},$$

which is a $\sigma(q-1)\times\rho(q-1)$ binary matrix with density $\leq 1/(q-1)^2$.

This low density parity check matrix, $H(C_{GRS})$, therefore defines a corresponding LDPC code, $LDPC(C_{GRS})$, since $$d(\beta \cdot c_i, \gamma \cdot c_j) \geq n-1, \text{ for } i \neq j, \text{ where } \beta, \gamma \in GF^*(q).$$

This LDPC code, $LDPC(C_{GRS})$, can be employed within any of a wide variety of communication systems that employ error correcting coding. No two rows in the low density parity check matrix, $H(C_{GRS})$, have more than 1 component in common. Because of this, the girth of the bipartite graph generated from the LDPC code, $LDPC(C_{GRS})$, is greater than or equal to 6 (i.e., girth $(LDPC(C_{GRS}) \geq 6))$.

When considering the columns (i.e., not the sub-matrices) of the low density parity check matrix, $H(C_{GRS})$, the following can be supposed:

$$H(C_{GRS})=[h_0\ h_1\ \ldots\ h_{N-1}] \text{ and let } H_{cols}=\{h_0,\ldots,h_{N-1}\}.$$

From this, a MLDS (minimal linear dependent set), S; can be defined as follows:

$$S=\{h_{i_0},\ldots,h_{i_{l-1}}\} \subseteq H_{cols},$$

such that each of the column element vectors, $h_{i_0},\ldots,h_{i_{l-1}}$, are linearly dependent to one another but the elements of any sub-set of S are linearly independent.

Define $\delta(S)=\max\{\|S\|-1, \max\{weight(h)|h\in S\}\}$

Theorem 1 Let $d_{min}$ be the minimum distance of the LDPC code, $LDPC(C_{GRS})$, and let $\delta=\min\{\delta(S)|MLDS \subseteq H_{cols}\}$, then $d_{min} \leq \delta+1$.

Regular LDPC Code Construction

LDPC Matrix of Regular LDPC Code

A location set, $L=\{\alpha_0,\alpha_1,\ldots,\alpha_{\rho-1}\} \subseteq GF^*(q)$, and a non-zero elements set, $V=\{v_0,v_1,\ldots,v_{\rho-1}\} \subseteq GF^*(q)$, that include $\rho$ non-zero elements $v_0,v_1,\ldots,v_{\rho-1}$ are both selected from the non-zero elements set of Galois field, $GF^*(q)$. That is to say, each of the location set, L, and the non-zero elements set, V, is either a corresponding subset of non-zero elements set of Galois field, $GF^*(q)$. Either of the location set, L, and the non-zero elements set, V, can include the entire non-zero elements set of Galois field, $GF^*(q)$.

Then, a plurality of degree 1 polynomial functions is generated. These polynomial functions can be represented as follows:

$f_i(x)=a_i \cdot x - b_i$ such that the root of $f_i(x)$ does not belong to the location set, L. The values, $A_i$, $B_i$, belong to the Galois field, $GF(q)$.

According to this, a GRS code, $C_{GRS}$, can be defined as follows:

$$C_{GRS}=\{c_i=(c_{i,0},\ldots c_{i,\rho-1})=(v_0 \cdot f_i(\alpha_0),\ldots,v_{\rho-1} \cdot f_i(\alpha_{\rho-1}))|i=0,\ldots,\sigma-1\}$$

Let $C_{GRS}$ be a 2-D RS (or GRS) code of length $\rho$. Let c be a codeword of $C_{GRS}$.

Define $$M(c)=\{\gamma c | \gamma \in GF^{(v)}(q)\} \quad \text{(EQ 13)}$$

where $\gamma(c_0, c_1, \ldots, c_{\rho-1}) = (\gamma c_0, \gamma c_1, \ldots, \gamma c_{\rho-1})$. Take $\theta$ weight-$\rho$ codewords $c_0, \ldots, c_{\theta-1}$ of the RS or GRS code, $C_{GRS}$ such that $$M(c_i) \cap M(c_j) = \emptyset \text{ if } i \neq j \quad \text{(EQ 14)}$$

Then $$\bigcup_{i=0}^{\theta-1} M(c_i) \subseteq C_{GRS},$$

and it has $(q-1)\theta$ codewords. Denote each of the codewords as having corresponding codeword elements, $c_i = (c_{i,0}, \ldots, c_{i,\rho-1})$.

Define a $[(q-1)\theta] \times [(q-1)\rho]$ low density parity check matrix, H, to be $$H = \begin{bmatrix} CSI_s(c_{0,0}) & CSI_s(c_{0,1}) & \cdots & CSI_s(c_{0,\rho-1}) \\ CSI_s(c_{1,0}) & CSI_s(c_{1,1}) & \cdots & CSI_s(c_{1,\rho-1}) \\ \vdots & \vdots & \ddots & \vdots \\ CSI_s(c_{\theta-1,0}) & CSI_s(c_{\theta-1,1}) & \cdots & CSI_s(c_{\theta-1,\rho-1}) \end{bmatrix} \quad \text{(EQ 15)}$$

This low density parity check matrix, H, provides all of the information required to construct the LDPC code, LDPC ($C_{GRS}$).

The column weight of H is $\theta$ and its row weight is $\rho$. Moreover, the density of 1's in this matrix is $1/(q-1)$. Thus, when $q>3$, H is low-density.

Proposition 1 No two (2) rows of the matrix has more than one 1-component in common. In other words, if $H=[h_i]$, where $h_i$ is a row-vector, for any pair $i_1, i_2$ such that $i_1 \neq i_2$, $h_{i_1}$ and $h_{i_2}$ has only one non-zero component in common.

Proof: Since $c_0, \ldots, c_{\theta-1}$ are distinct codewords of C and $M(c_i) \cap M(c_j) = \emptyset$ if $i \neq j$, the distance of two codewords if $\gamma_1 c_i$ and $\gamma_2 c_j$ are at least $\rho-1$ when either $\gamma_1 \neq \gamma_2$ or $i \neq j$. Therefore, $\gamma_1 c_i$ and $\gamma_2 c_j$ have at most one component, say in position $k_0$ in common. Thus $\gamma_1 c_{i,k} \neq \gamma_2 c_{j,k}$ for all k except $k=k_0$. Since L is one to one map, we have $$L(\lambda_1 c_{i,k}) \neq L(\lambda_2 c_{j,k}) \text{ for all } k \text{ except } k=k_0 \quad \text{(EQ 16)}$$

This proves the proposition since $L(\lambda_1 c_{i,k_0})$ has only one non-zero component.

We now use this low-density matrix to define a low-density parity-check (LDPC) code.

Then we have the following direct consequence of Proposition 1.

Proposition 2 The bipartite graph of the LDPC code defined by H has no cycle 4. This means girth of the bipartite graph is greater than or equal to 6.

Proposition 3 The minimum distance of the LDPC code defined by H is at least $\theta+1$. Moreover, if $\theta$ is an even number then the minimum distance is at least $\theta+2$ (Note: the above-mentioned Djurdjevic, et al. reference [a] provides a detailed proof of this).

Due to the higher minimum distances of this LDPC code, the BER (Bit Error Rate) curve of the regular code can provide a relatively lower error floor.

Find Codewords of 2-D GRS Code with All Non-Zero Components Satisfying (EQ 14)

Consider the field GF(q). Take $p<q-1$ and $\theta \leq (q-1)-\rho$. Suppose $GF^*(q) = \langle \alpha \rangle$. Take $\rho$ distinct elements $\alpha_0, \ldots, \alpha_{\rho-1} \in GF^*(q)$. Then a 2-D block size $\rho$ GRS code can be defined as follows:

$$C = \{(v_0 f(\alpha_0)), \ldots, (v_{\rho-1} f(\alpha_{\rho-1})) | f \in GF(q)[x], \deg(f) < 2\} \quad \text{(EQ 17)}$$

where $v_0, \ldots, v_{\rho-1}$ are $\rho$ fixed elements in $GF^*(q)$. Now take another $\theta$ distinct elements $$\beta_0, \ldots, \beta_{\theta-1} \in GF^*(q)/\{\alpha_0, \ldots, \alpha_{\rho-1}\} \quad \text{(EQ 18)}$$

Define degree polynomials $f_i(x) = x - \beta_i$, $i = 0, \ldots, \theta-1$. Then by (EQ 18) for each i we have $$f_i(\alpha_j) \neq 0 \text{ for } j = 0, \ldots, \rho-1 \quad \text{(EQ 19)}$$

Therefore the codewords $i_1, i_2 \in \{0, \ldots, \theta-1\}$ such that $i_1 \neq i_2$. Then, $\alpha^j v_k f_{i_1}(\alpha_k) \neq \alpha^j v_k f_{i_2}(\alpha_k)$. Otherwise, $\alpha^j(\alpha_k - \beta_{i_1}) = \alpha^j(\alpha_k - \beta_{i_2})$ which implies that $\beta_{i_1} = \beta_{i_2}$, a contradiction. Therefore, $M(c_{i_1}) \cap M(c_{i_2}) = \emptyset$. Thus the codewords $c_0, \ldots, c_{\theta-1}$ satisfy (EQ 14) and using these codewords, we can construct a regular LDPC code.

EXAMPLE 2

Consider $GF^*(7) = \langle \alpha \rangle$ with $\alpha = 3$. Take these 3 elements, $\alpha_i = \alpha^i, i = 0, 1, 2$ and another 3 elements $\beta_i = \alpha^{3+i}, i = 0, 1, 2$. Define $f_i(x) = x - \beta_i$. Then we have the following 3 2-D GRS codewords, namely, $$c_0 = [(1-\alpha^3), (\alpha-\alpha^3), (\alpha^2-\alpha^3)] = (2,4,3) = (\alpha^2, \alpha^4, \alpha) \quad \text{(EQ 20)}$$

$$c_1 = [(1-\alpha^4), (\alpha-\alpha^4), (\alpha^2-\alpha^4)] = (4,6,5) = (\alpha^4, \alpha^3, \alpha^5) \quad \text{(EQ 21)}$$

$$c_2 = [(1-\alpha^5), (\alpha-\alpha^5), (\alpha^2-\alpha^5)] = (3,5,4) = (\alpha, \alpha^5, \alpha^4) \quad \text{(EQ 22)}$$

The 18 distinct codewords are as follows:

$$\begin{bmatrix} c_0 = (\alpha^2, \alpha^4, \alpha) \\ \alpha c_0 = (\alpha^3, \alpha^5, \alpha^2) \\ \alpha^2 c_0 = (\alpha^4, 1, \alpha^3) \\ \alpha^3 c_0 = (\alpha^5, \alpha, \alpha^4) \\ \alpha^4 c_0 = (1, \alpha^2, \alpha^5) \\ \alpha^5 c_0 = (\alpha, \alpha^3, 1) \end{bmatrix} \begin{bmatrix} c_1 = (\alpha^4, \alpha^3, \alpha^5) \\ \alpha c_1 = (\alpha^5, \alpha^3, 1) \\ \alpha^2 c_1 = (1, \alpha^5, \alpha) \\ \alpha^3 c_1 = (\alpha, 1, \alpha^2) \\ \alpha^4 c_1 = (\alpha^2, 1, \alpha^3) \\ \alpha^5 c_1 = (\alpha^3, \alpha^2, \alpha^4) \end{bmatrix} \quad \text{(EQ 23)}$$

$$\begin{bmatrix} c_2 = (\alpha, \alpha^5, \alpha^4) \\ \alpha c_2 = (\alpha^2, 1, \alpha^5) \\ \alpha^2 c_2 = (\alpha^3, \alpha, 1) \\ \alpha^3 c_2 = (\alpha^4, \alpha^2, \alpha) \\ \alpha^4 c_2 = (\alpha^5, \alpha^3, \alpha^2) \\ \alpha^5 c_2 = (1, \alpha^4, \alpha^3) \end{bmatrix}$$

Based on this, we can have the following LDPC (Low Density Parity Check) matrix, H, constructed by 6×6 individual CSI sub-matrices.

$$H = \begin{bmatrix} CSI_s(\alpha^2) & CSI_s(\alpha^4) & CSI_s(\alpha) \\ CSI_s(\alpha^4) & CSI_s(\alpha^3) & CSI_s(\alpha^5) \\ CSI_s(\alpha) & CSI_s(\alpha^5) & CSI_s(\alpha^4) \end{bmatrix} \quad \text{(EQ 24A)}$$

$$H = \begin{bmatrix}
0 & 0 & 1 & 0 & 0 & 0 & 0 & 0 & 0 & 0 & 1 & 0 & 0 & 1 & 0 & 0 & 0 & 0 \\
0 & 0 & 0 & 1 & 0 & 0 & 0 & 0 & 0 & 0 & 0 & 1 & 0 & 0 & 1 & 0 & 0 & 0 \\
0 & 0 & 0 & 0 & 1 & 0 & 1 & 0 & 0 & 0 & 0 & 0 & 0 & 0 & 0 & 1 & 0 & 0 \\
0 & 0 & 0 & 0 & 0 & 1 & 0 & 1 & 0 & 0 & 0 & 0 & 0 & 0 & 0 & 0 & 1 & 0 \\
1 & 0 & 0 & 0 & 0 & 0 & 0 & 0 & 1 & 0 & 0 & 0 & 0 & 0 & 0 & 0 & 0 & 0 \\
0 & 1 & 0 & 0 & 0 & 0 & 0 & 0 & 0 & 1 & 0 & 0 & 1 & 0 & 0 & 0 & 0 & 0 \\
0 & 0 & 0 & 0 & 1 & 0 & 0 & 0 & 0 & 1 & 0 & 0 & 0 & 0 & 0 & 0 & 0 & 1 \\
0 & 0 & 0 & 0 & 0 & 1 & 0 & 0 & 0 & 0 & 1 & 0 & 1 & 0 & 0 & 0 & 0 & 0 \\
1 & 0 & 0 & 0 & 0 & 0 & 0 & 0 & 0 & 0 & 0 & 1 & 0 & 1 & 0 & 0 & 0 & 0 \\
0 & 1 & 0 & 0 & 0 & 0 & 1 & 0 & 0 & 0 & 0 & 0 & 0 & 0 & 1 & 0 & 0 & 0 \\
0 & 0 & 1 & 0 & 0 & 0 & 0 & 1 & 0 & 0 & 0 & 0 & 0 & 0 & 0 & 1 & 0 & 0 \\
0 & 0 & 0 & 1 & 0 & 0 & 0 & 0 & 1 & 0 & 0 & 0 & 0 & 0 & 0 & 0 & 1 & 0 \\
0 & 1 & 0 & 0 & 0 & 0 & 0 & 0 & 0 & 0 & 0 & 1 & 0 & 0 & 0 & 0 & 1 & 0 \\
0 & 0 & 1 & 0 & 0 & 0 & 1 & 0 & 0 & 0 & 0 & 0 & 0 & 0 & 0 & 0 & 0 & 1 \\
0 & 0 & 0 & 1 & 0 & 0 & 0 & 1 & 0 & 0 & 0 & 0 & 1 & 0 & 0 & 0 & 0 & 0 \\
0 & 0 & 0 & 0 & 1 & 0 & 0 & 0 & 1 & 0 & 0 & 0 & 0 & 1 & 0 & 0 & 0 & 0 \\
0 & 0 & 0 & 0 & 0 & 1 & 0 & 0 & 0 & 1 & 0 & 0 & 0 & 0 & 1 & 0 & 0 & 0 \\
1 & 0 & 0 & 0 & 0 & 0 & 0 & 0 & 0 & 0 & 1 & 0 & 0 & 0 & 0 & 1 & 0 & 0
\end{bmatrix} \quad \text{(EQ 24B)}$$

Clearly, by comparing (EQ 24A) and (EQ 24B), it can be seen that the CSI sub-matrix, $I_s(\alpha^2)$, undergoes cyclic shifting of the $2^{nd}$ row (i.e., where $i_0=2$, from $\alpha^{i_0}=\alpha^2$). Similarly, the CSI sub-matrix, $I_s(\alpha^4)$, undergoes cyclic shifting of the $4^{th}$ row (i.e., where $i_0=4$, from $\alpha^{i_0}=\alpha^4$), and so on for the other of the 6×6 individual CSI sub-matrices.

A block size 18 regular LDPC code constructed by this parity check matrix has a bit degree of 3 and check degree of 3. The bipartite graph of this graph has no cycle 4; there are no size 4 loops in the corresponding LDPC bipartite graph of this LDPC code. This minimum distance of the code is at least 4.

Irregular LDPC Code Construction

As mentioned above, irregular LDPC codes have multiple degrees of bit nodes and check nodes. By choosing good degree distributions, an LDPC code (or an irregular LDPC code) can be selected that achieves close to the Shannon limit.

By puncturing (i.e., replacing one or more elements of a parity check matrix, H, or replacing one of more CSI sub-matrices of a parity check matrix, H, by an all zero-valued sub-matrix (e.g., sub-matrix having all 0-valued (zero-valued) elements)) according to a given degree distribution, an irregular LDPC code can be obtained. Special irregular LDPC codes have attracted more industry in the communications industry in recent times because of their ability to achieve closer to the Shannon limit than regular LDPC codes.

In order to achieve both near capacity (or Shannon limit) and a lower error floor, the regular LDPC constructed by H in (EQ 15) of Regular LDPC code construction may be modified to an irregular LDPC code by replacing some of CSI sub-matrices, $CSI_s(c)$, with all zero-valued matrices (e.g., matrices with all zero elements). Alternatively, rather than puncture an entire CSI sub-matrix, only selected elements of certain of the CSI sub-matrices, $CSI_s(c)$, can be punctured (i.e., replaced with 0s).

Form of LDPC Matrix of Irregular LDPC Code

Consider constructing a code over $GF^*(q)$. The block size of the code will be $\rho(q-1)$. Given a code rate R, one may choose an integer $\theta$ such that $R=\theta/\rho$. Then construct an $\theta(q-1)\times\rho(q-1)$ matrix H of form (EQ 15). The largest bit degree of the irregular LDPC code will be $\theta$. Denote $H=[H_1\ H_2]$, where $H_2$ is a $\theta(q-1)\times\theta(q-1)$ sub-matrix, i.e., $$H_2 = \begin{bmatrix} CSI_s(c_{0,\rho-\theta}) & CSI_s(c_{0,\rho-\theta+1}) & \cdots & CSI_s(c_{0,\rho-1}) \\ CSI_s(c_{1,\rho-\theta}) & CSI_s(c_{1,\rho-\theta+1}) & \cdots & CSI_s(c_{1,\rho-1}) \\ \vdots & \vdots & \ddots & \vdots \\ CSI_s(c_{\theta-1,\rho-\theta}) & CSI_s(c_{\theta-1,\rho-\theta+1}) & \cdots & CSI_s(c_{\theta-1,\rho-1}) \end{bmatrix} \quad \text{(EQ 25)}$$

If $\theta>2$, then we modify $H_2$ to the following block dual diagonal matrix:

$$\overline{H}_2 = \begin{bmatrix} CSI_s(c_{0,\rho-\theta}) & CSI_s(c_{0,\rho-\theta+1}) & 0 & 0 & \cdots & 0 & 0 \\ 0 & CSI_s(c_{1,\rho-\theta+1}) & CSI_s(c_{1,\rho-\theta+2}) & 0 & \cdots & 0 & 0 \\ & & & & \cdots & & \\ 0 & 0 & 0 & 0 & \cdots & CSI_s(c_{\theta-2,\rho-2}) & CSI_s(c_{\theta-2,\rho-1}) \\ 0 & 0 & 0 & 0 & \cdots & 0 & CSI_s(c_{\theta-1,\rho-1}) \end{bmatrix}, \quad \text{(EQ 26)}$$

or $$\overline{H}_2 = \begin{bmatrix} CSI_s(c_{0,\rho-\theta}) & 0 & 0 & 0 & \cdots & 0 & 0 \\ CSI_s(c_{1,\rho-\theta}) & CSI_s(c_{1,\rho-\theta+1}) & 0 & 0 & \cdots & 0 & 0 \\ 0 & CSI_s(c_{2,\rho-\theta+1}) & CSI_s(c_{2,\rho-\theta+2}) & 0 & \cdots & 0 & 0 \\ & & & & \cdots & & \\ 0 & 0 & 0 & 0 & \cdots & CSI_s(c_{\theta-2,\rho-2}) & 0 \\ 0 & 0 & 0 & 0 & \cdots & CSI_s(c_{\theta-1,\rho-2}) & CSI_s(c_{\theta-1,\rho-1}) \end{bmatrix} \quad \text{(EQ 27)}$$

Clearly, $\overline{H}_2$ has a column weight 2 or 1. Due to the construction of this parity LDPC matrix, it is easy to prove the following property.

Proposition 3 The rank of $\overline{H}_2$ is $\theta(q-1)$.

We now replace $H=[H_1 \; H_2]$ with $[H_1 \; \overline{H}_2]$.

To replace the CSI sub-matrices in $H_1$ with zero-values sub-matrices (EQ, sub-matrices having all 0 valued elements), one may use a number of different theoretical approaches including the density evolution approach. Suppose the least column weight of $\overline{H}_2$ is $\lambda>2$. Then the irregular LDPC code defined by the parity check matrix $\overline{H}=[\overline{H}_1 \; \overline{H}_2]$ has a minimum distance of at least $\lambda+1$.

Proof it is obvious that the matrix $\overline{H}$ also has the property listed in Proposition 1.

Let d be the minimal distance of the LDPC code. Take a minima weight codeword $b=(b_0, \ldots, b_{\rho-1})$ such that $b_{i_1}=b_{i_2}=\ldots=b_{i_d}=1$ and $b_i=0$ for all other i, where $i_1<i_2<\ldots<i_d$. Since the $\theta(q-1)\times\theta(q-1)$ matrix $\overline{H}_2$ has full rank, we have $\{i_1,i_2,\ldots,i_d\} \not\subset \{\rho-\theta,\rho-\theta+1,\ldots,\rho-1\}$. Thus $i_1<\rho-\theta$. Thus the column $i_1$ of $\overline{H}$ must be in the matrix $\overline{H}_1$. Then, $\overline{H}=[h_{j,i}]$ then the column $i_1$ is $h_{i_1}=(h_{0,i_1},\ldots,h_{(q-1)\theta-1,i_1})$. Let $\Lambda$ be the weight of $h_{i_1}$. Then by the assumption we have $\Lambda \geq \lambda$. Let $j_1,\ldots,j_\Lambda$ be the positions such that $h_{j_k,i_1}=1, k=1,\ldots,\Lambda$. Then we have $$\begin{cases} b_{i_1} = b_{i_2}h_{j_1,i_2} + \ldots + b_{i_d}h_{j_1,i_d} \\ b_{i_1} = b_{i_2}h_{j_2,i_2} + \ldots + b_{i_d}h_{j_2,i_d} \\ \quad \ldots \\ b_{i_1} = b_{i_2}h_{j_\Lambda,i_2} + \ldots + b_{i_d}h_{j_\Lambda,i_d} \end{cases}, \text{ i.e.,} \quad \text{(EQ 28)}$$

$$\begin{cases} 1 = h_{j_1,i_2} + \ldots + h_{j_1,i_d} \\ 1 = h_{j_2,i_2} + \ldots + h_{j_2,i_d} \\ \quad \ldots \\ 1 = h_{j_\Lambda,i_2} + \ldots + h_{j_\Lambda,i_d} \end{cases}$$

Let $$H^* = \begin{bmatrix} h_{j_1,i_2} \ldots h_{j_1,i_d} \\ h_{j_2,i_2} \ldots h_{j_2,i_d} \\ \ldots \\ h_{j_\Lambda,i_2} \ldots h_{j_\Lambda,i_d} \end{bmatrix} \quad \text{(EQ 29)}$$

Then H* is a $\Lambda \times (d-1)$ matrix. Since no two (2) rows of the matrix $\overline{H}$ have more than one-component (1-component) in common, every column in H* has at most one non-zero component. However, according to (EQ 28) the number of non-zero elements (i.e. 1) in H* must be $\Lambda$. By the pigeon hole principle $d-1 \geq \Lambda$. Thus, $d \geq \Lambda+1 \geq \lambda+1$.

Using a carefully defined $f_{s,j}(x)$, at least 4 different types of irregular LDPC codes can be constructed as describe below. Differently defined functions, $f_{s,j}(x)$, can result in more or less possible LDPC codes that can be constructed.

Irregular Code I

Let the parity check matrix, H, have the form as follows: $H=[H_1 \; H_2]$, where $H_2$ is $\sigma(q-1) \times \sigma(q-1)$ sub-matrix. The right hand side matrix, $H_2$, initially has the following form:

$$H_2 = \begin{bmatrix} I & & & & I_{-1} \\ I & I & & & \\ & I & I & & \\ & & & \ddots & \\ & & & & I & I \end{bmatrix}$$

The sub-matrices, I, are identity matrices. The sub-matrix, $I_{-1}$, is the identity matrix left shifted by a position of 1.

After performing row and column permuting on the entire parity check matrix, H, the right hand side matrix, $H_2$, is transformed into the following form:

$$H_2 = \begin{bmatrix} 1 & & & & 1 \\ 1 & 1 & & & \\ & 1 & 1 & & \\ & & & \ddots & \\ & & & & 1 & 1 \end{bmatrix}$$

The FIG. 14 below shows the graphical representation of an LDPC code whose parity check matrix, H, has this structure.

As mentioned above, the values of $a_i$ and $b_i$ are determined according to conditions that are set out beforehand. To achieve an LDPC code having these properties, the following approach is made.

Given a location set, $L=\{\alpha_0, \ldots, \alpha_{\rho-1}\}$, take a non-zero elements set, $V=\{v_{\rho-\sigma}, \ldots, v_{\rho-1}\} \in GF^*(q)$, as selected from a non-zero elements set of Galois field, $GF^*(q)$, such that $$v_{\rho-\sigma}\alpha_{\rho-\sigma}-v_{\rho-1}\alpha_{\rho-1} \neq 0, \; v_{\rho-\sigma+i}\alpha_{\rho-\sigma+i}-v_{\rho-\sigma+i+1}\alpha_{\rho-\sigma+i+1} \neq 0; \; i=0,\ldots,\sigma-2$$

EQ 1 (I):
$$\begin{bmatrix} v_{\rho-\sigma} \cdot \alpha_{\rho-\sigma} & v_{\rho-\sigma} \\ v_{\rho-1} \cdot \alpha_{\rho-1} & v_{\rho-1} \end{bmatrix} \begin{pmatrix} a_0 \\ b_0 \end{pmatrix} = \begin{pmatrix} 1 \\ \alpha^{q-2} \end{pmatrix}$$

EQ 2 (I):
$$\begin{bmatrix} v_{\rho-\sigma+i} \cdot \alpha_{\rho-\sigma+i} & v_{\rho-\sigma+i} \\ v_{\rho-\sigma+i+1} \cdot \alpha_{\rho-\sigma+i+1} & v_{\rho-\sigma+i+1} \end{bmatrix} \begin{pmatrix} a_{i+1} \\ b_{+1} \end{pmatrix} = \begin{pmatrix} 1 \\ 1 \end{pmatrix},$$
$i = 0, \ldots, \sigma - 2$ Then, these equations represented by, EQ 1 (I) and EQ 2 (I) above, are solved to find $a_i$ and $b_i$. From these, the function, $f_i(x)$, is determined as follows.

$f_i(x) = a_i \cdot x + b_i$, $i=0, \ldots, \sigma-1$

According to this, the corresponding GRS code, $C_{GRS}$, can be defined as follows:

$C_{GRS} = \{c_i = (v_0 \cdot f_i(\alpha_0), \ldots, v_{\rho-1} \cdot f_1(\alpha_{\rho-1})) | i = 0, \ldots, \sigma-1\}$ From this GRS code, $C_{GRS}$, the individual elements of each of the codewords of the GRS code, $C_{GRS}$, are then subsequently mapped according to the CSI mapping as described above thereby forming the right hand side matrix, $H_2$, as follows:

$$H_2 = \begin{bmatrix} CSI(c_{0,\rho-\sigma}) & & & & CSI(c_{0,\rho-1}) \\ CSI(c_{1,\rho-\sigma}) & CSI(c_{1,\rho-\sigma+1}) & & & \\ & CSI(c_{2,\rho-\sigma+1}) & & & \\ & & \ddots & & \\ & & & CSI(c_{\sigma-1,\rho-2}) & CSI(c_{\sigma-1,\rho-1}) \end{bmatrix}$$

$$H_2 = \begin{bmatrix} I & & & & L_{-1} \\ I & I & & & \\ & I & I & & \\ & & & \ddots & \\ & & & & I & I \end{bmatrix}$$

The left hand side matrix, $H_1$, is formed by puncturing the following:

$$H_1 = \begin{bmatrix} CSI(c_{0,0}) & \cdots & CSI(c_{0,\rho-\sigma-1}) \\ \vdots & \ddots & \vdots \\ CSI(c_{\sigma-1,1}) & \cdots & CSI(c_{\sigma-1,\rho-\sigma-1}) \end{bmatrix}$$

Corollary 2: Let LDPC(H) be the LDPC code generated by the parity check matrix, H, having the form, $H=[H_1 \ H_2]$, and let $\delta$ be the minimum column weight of the left hand side matrix, $H_1$, then the minimum distance, $d_{min}(H)$, is the minimum of either $\sigma+1$ or $\sigma(q-1)$ as follows:

$d_{min}(H) \geq \min\{\delta+1, \sigma(q-1)\}$.

Irregular Code II

Let the parity check matrix, H, have the form as follows: $H = [H_1 \ H_2]$, where $H_2$ is a $\sigma(q-1) \times \sigma(q-1)$ sub-matrix. The right hand side matrix, $H_2$, initially has the following form:

$$H_2 = \begin{bmatrix} I & & & & D \\ I & I & & & \\ & I & I & & \\ & & & \ddots & \\ & & & & I & I \end{bmatrix}$$

The sub-matrices, I, are identity matrices. The sub-matrix, D, has the following form:

$$D = \begin{bmatrix} 0 & 0 & \cdots & 0 & 0 \\ 1 & 0 & \cdots & 0 & 0 \\ \vdots & 1 & \ddots & \vdots & \vdots \\ 0 & 0 & \ddots & 0 & 0 \\ 0 & 0 & \cdots & 1 & 0 \end{bmatrix}$$

The sub-matrix, D, is formed by puncturing the $1^{st}$ line (i.e., $1^{st}$ row) of the sub-matrix, $I_{-1}$. After performing row and column permuting on the entire parity check matrix, H, the right hand side matrix, $H_2$, is transformed into the following form:

$$H_2 = \begin{bmatrix} 1 & & & & \\ 1 & 1 & & & \\ & 1 & 1 & & \\ & & & \ddots & \\ & & & & 1 & 1 \end{bmatrix}$$

The FIG. 12 below shows the graphical representation of an LDPC code whose parity check matrix, H, has this structure. As can be seen, there is a large open loop in that diagram (i.e., no cycle) in the redundancy bit nodes 1240. However, there are in fact loops in the information bit nodes 1210 and the check nodes 1230.

As mentioned above, the values of $a_i$ and $b_i$ are determined according to conditions that are set out beforehand. To achieve an LDPC code having these properties, the following approach is made.

The same approach as provided above (with respect to Irregular Code I) to generate the GRS code, $C_{GRS}$, can be provided here.

From this GRS code, $C_{GRS}$, the individual elements of each of the codewords of the GRS code, $C_{GRS}$, are then subsequently mapped according to the CSI mapping as described above thereby forming the right hand side matrix, $H_2$, as follows:

$$H_2 = \begin{bmatrix} CSI(c_{0,\rho-\sigma}) & & & & CSI(c_{0,\rho-1}) \\ CSI(c_{1,\rho-\sigma}) & CSI(c_{1,\rho-\sigma+1}) & & & \\ & CSI(c_{2,\rho-\sigma+1}) & & & \\ & & \ddots & & \\ & & & CSI(c_{\sigma-1,\rho-2}) & CSI(c_{\sigma-1,\rho-1}) \end{bmatrix}$$

-continued $$H_2 = \begin{bmatrix} I & & & & I_{-1} \\ I & I & & & \\ & I & I & & \\ & & & \ddots & \\ & & & & I & I \end{bmatrix}$$

Then, the 1 in the first row of the sub-matrix, $I_{-1}$, is deleted to obtain the sub-matrix, D. This modified matrix is then denoted by $H_2$ as indicated above.

Similarly, the left hand side matrix, $H_1$, is formed by puncturing the following:

$$H_1 = \begin{bmatrix} CSI(c_{0,0}) & \ldots & CSI(c_{0,\rho-\sigma-1}) \\ \vdots & \ddots & \vdots \\ CSI(c_{\sigma-1,1}) & \ldots & CSI(c_{\sigma-1,\rho-\sigma-1}) \end{bmatrix}$$

Corollary 3: Let LDPC(H) be the LDPC code generated by the parity check matrix, H, having the form, $H=[H_1 \ H_2]$, and let $\delta$ be the minimum column weight of the left hand side matrix, $H_1$, then the minimum distance, $d_{min}(H)$, is given as follows:

$$d_{min}(H) \geq \delta + 1.$$

This is an improvement over the previous Irregular Code I, in that, it will typically have a smaller minimum distance.

Irregular Code III

Within this irregular LDPC code, the following format is desired for the right hand side matrix, $H_2$:

$$\begin{array}{cc} \theta-1 & \theta \\ \downarrow & \downarrow \end{array}$$

$$H_2 = \begin{bmatrix} I & & & & & I_m & \\ I & I & & & & & \\ & \ddots & & & & & \\ & & I & I & & I & \\ & & & \ddots & & & \\ & & & & I & I & \\ & & & & & I & I_m \end{bmatrix} \leftarrow \theta$$

As mentioned above, the values of $a_i$ and $b_i$ are determined according to conditions that are set out beforehand. To achieve an LDPC code having these properties, the following approach is made. The matrix, $I_m$, is a CSI matrix that is cyclic shifted by the number, m.

Given a location set, $L=\{\alpha_0, \ldots, \alpha_{\rho-1}\}$, take a non-zero elements set, $V=\{v_{\rho-\sigma}, \ldots, v_{\rho-1}\} \in GF^*(q)$, as selected from a non-zero elements set of Galois field, $GF^*(q)$, such that $$v_{\rho-\sigma+i}\alpha_{\rho-\sigma+i} - v_{\rho-\sigma+i+1}\alpha_{\rho-\sigma+i+1} \neq 0, \ldots, \sigma-3; \text{ and}$$

$$\alpha_{\rho-1}(v_{\theta-1}-v_\theta) + v_\theta\alpha_\theta - v_{\theta-1}\alpha_{\theta-1} \neq 0.$$

EQ c (III):

$$\begin{bmatrix} v_{\rho-\sigma+i} \cdot \alpha_{\rho-\sigma+i} & v_{\rho-\sigma+i} \\ v_{\rho-\sigma+i+1} \cdot \alpha_{\rho-\sigma+i+1} & v_{\rho-\sigma+i+1} \end{bmatrix} \begin{pmatrix} a_{i+1} \\ b_{i+1} \end{pmatrix} = \begin{pmatrix} 1 \\ 1 \end{pmatrix}, i=0,\ldots,\sigma-3$$

Let $v_{\rho-1}=1/(\alpha_\theta\alpha_{\rho-1}+b_\theta)$, then take $v_{\rho-\sigma} \in GF^*(q)$ such that $v_{\rho-\sigma}\alpha_{\rho-\sigma} - v_{\rho-1}\alpha_{\rho-1} \neq 0$; $i=0,\ldots,\sigma-3$. Then, the following 2 equations are solved.

EQ a (III):

$$\begin{bmatrix} v_{\rho-\sigma} \cdot \alpha_{\rho-\sigma} & v_{\rho-\sigma} \\ v_{\rho-1} \cdot \alpha_{\rho-\sigma} & v_{\rho-1} \end{bmatrix} \begin{pmatrix} a_0 \\ b_0 \end{pmatrix} = \begin{pmatrix} 1 \\ \alpha^m \end{pmatrix}$$

EQ b (III):

$$\begin{bmatrix} v_{\rho-2} \cdot \alpha_{\rho-2} & v_{\rho-2} \\ v_{\rho-1} \cdot \alpha_{\rho-1} & v_{\rho-1} \end{bmatrix} \begin{pmatrix} a_{\sigma-1} \\ b_{\sigma-1} \end{pmatrix} = \begin{pmatrix} 1 \\ \alpha^m \end{pmatrix}$$

As can be seen, the values of $a_0$ and $b_0$ are determined by EQ a (III). The values of $a_{\sigma-1}$ and $b_{\sigma-1}$ are determined by EQ b (III). The values of $a_1, \ldots, a_{\sigma-2}$ (which includes $a_\theta$) and $b_1, \ldots, b_{\sigma-2}$ (which includes $b_\theta$) are determined by EQ c (III).

It is again noted that the value of $\theta$ is a designer selected parameter. From this, the following relationship is then determined.

$$v_{\rho-1} = \frac{1}{(a_\theta\alpha_{\rho-1} + b_\theta)}$$

Let, $$f_i(x) = a_i \cdot x + b_i, i=0, \ldots, \sigma-1$$

According to this, the corresponding GRS code, $C_{GRS}$, can be defined as follows:

$$C_{GRS}=\{c_i=(v_0 \cdot f_i(\alpha_0), \ldots, v_{\rho-1} \cdot f_i(\alpha_{\rho-1})) | i=0, \ldots, \sigma-1\}$$

From this GRS code, $C_{GRS}$, the individual elements of each of the codewords of the GRS code, $C_{GRS}$, are then subsequently mapped according to the CSI mapping as described above thereby forming the right hand side matrix, $H_2$, as follows. Because of its size, the matrix is broken into 2 separate portions, such that $H_2=[H_{21} \ H_{22}]$.

$$H_{21} = \begin{bmatrix} CSI(c_{0,\rho-\sigma}) & & & \\ CSI(c_{1,\rho-\sigma}) & CSI(c_{1,\rho-\sigma+1}) & & \\ & & \ddots & \\ & & CSI(c_{\theta,\rho-\sigma+\theta-1}) & CSI(c_{\theta,\rho-\sigma+\theta}) \end{bmatrix}_{(\sigma-1)\times(\rho-\sigma+\theta)}$$

-continued $$H_{22} = \begin{bmatrix} \ddots & & \\ CSI(c_{\sigma-2,\rho-3}) & CSI(c_{\sigma-2,\rho-2}) & \\ & CSI(c_{\sigma-1,\rho-2}) & CSI(c_{\sigma-1,\rho-1}) \end{bmatrix}_{(\sigma-1)\times((\rho-1)-(\rho-\sigma+\theta))}$$

Together, each of the matrices of $H_2=[H_{21}\ H_{22}]$ (i.e., $H_{21}$ and $H_{22}$) form the entire $H_2=[H_{21}\ H_{22}]$ matrix which is a $\sigma\times\rho$ matrix.

$$H_2 = \begin{bmatrix} I & & & & & I_m \\ I & I & & & & \\ & \ddots & & & & \\ & & I & I & & I \\ & & & \ddots & & \\ & & & & I & I \\ & & & & & I & I_m \end{bmatrix}$$

Similarly, the left hand side matrix, $H_1$, is formed by puncturing the following:

$$H_1 = \begin{bmatrix} CSI(c_{0,0}) & \cdots & CSI(c_{0,\rho-\sigma-1}) \\ \vdots & \ddots & \vdots \\ CSI(c_{\sigma-1,1}) & \cdots & CSI(c_{\sigma-1,\rho-\sigma-1}) \end{bmatrix}$$

Corollary 4: Let LDPC(H) be the LDPC code generated by the parity check matrix, H, having the form, $H=[H_1\ H_2]$, and let $\delta$ be the minimum column weight of the left hand side matrix, $H_1$, then the minimum distance, $d_{min}(H)$, is given as follows:

$$d_{min}(H) \geq \delta+1.$$

Again, this is an improvement over the previous Irregular Code I, in that, it will typically have a smaller minimum distance.

Irregular Code IV

This irregular LDPC code IV is somewhat similar to the irregular LDPC code I describe above with the difference being that the top right sub-matrix of the right hand side matrix, $H_2$, is punctured to be all 0s.

Let the parity check matrix, H, have the form as follows: $H=[H_1\ H_2]$, where $H_2$ is a $\sigma(q-1)\times\sigma(q-1)$ sub-matrix. The right hand side matrix, $H_2$, initially has the following form:

$$H_2 = \begin{bmatrix} I & & & & \\ I & I & & & \\ & I & I & & \\ & & & \ddots & \\ & & & & I & I \end{bmatrix}$$

The sub-matrices, I, are identity matrices. As can be seen, the top right sub-matrix of the right hand side matrix, $H_2$, is punctured to be all 0s.

Some additional examples are provided below.

EXAMPLE 2

Let $q=109, \rho=18$ and $\theta=6$. Then an irregular LDPC code $C_{108}$ can be constructed by a 648×1944 matrix consisting of 108 distinct 108×108 CSI sub-matrices. The matrix $H_2$ has the form of (EQ 26). The code has maximum bit degree. 6 and maximum check degree 18. Using the density evolution theorem given in the following reference [4], we choose the distribution of degree in $H_1$ being 327 columns with weight 6 (i.e., bits with degree 6) and 972 columns with weight 4 (i.e., bits with degree 4).

[4] "Joint proposal for LDPC Codes," Hughes Network System, ST Microelectronics and Texas Instrument, WWiSE Advanced Coding "Ad hoc" meeting, May 6, 2005.

Then by Proposition 4, this irregular code has minimum distance at least 5. All the checks have the same degree, i.e. 11. The following table shows the construction of the parity check matrix H of the LDPC code $C_{108}$.

The table consists of 108 entries. Every entry represents a 108×108 sub-matrix, where an actual number in the entry location indicates the shift position that is used to construct the CSI sub-matrix, and the empty spaces indicates an all zero-valued (i.e., all elements are 0) 108×108 sub-matrix.

| 59 | 0  |    | 78 | 22 | 98  |    | 40 | 17 | 85 |    | 58 | 15 | 14 |    |    |    |    |
|----|----|----|----|----|-----|----|----|----|----|----|----|----|----|----|----|----|----|
| 24 | 27 | 33 |    | 65 | 101 | 11 |    | 67 | 8  | 91 |    | 52 | 64 |    |    |    |    |
| 17 |    | 97 | 90 | 23 |     | 64 | 53 | 32 |    | 95 | 67 |    |    | 19 | 2  |    |    |
| 8  | 2  |    | 42 | 95 | 17  |    | 77 | 25 | 69 |    | 44 |    |    |    | 7  | 40 |    |
| 37 | 82 | 25 |    | 70 | 36  | 73 |    | 16 | 64 | 78 |    |    |    |    |    | 33 | 77 |
| 84 |    | 76 | 35 | 29 |     | 95 | 0  | 45 |    | 87 | 1  |    |    |    |    |    | 72 |

Figure 6:
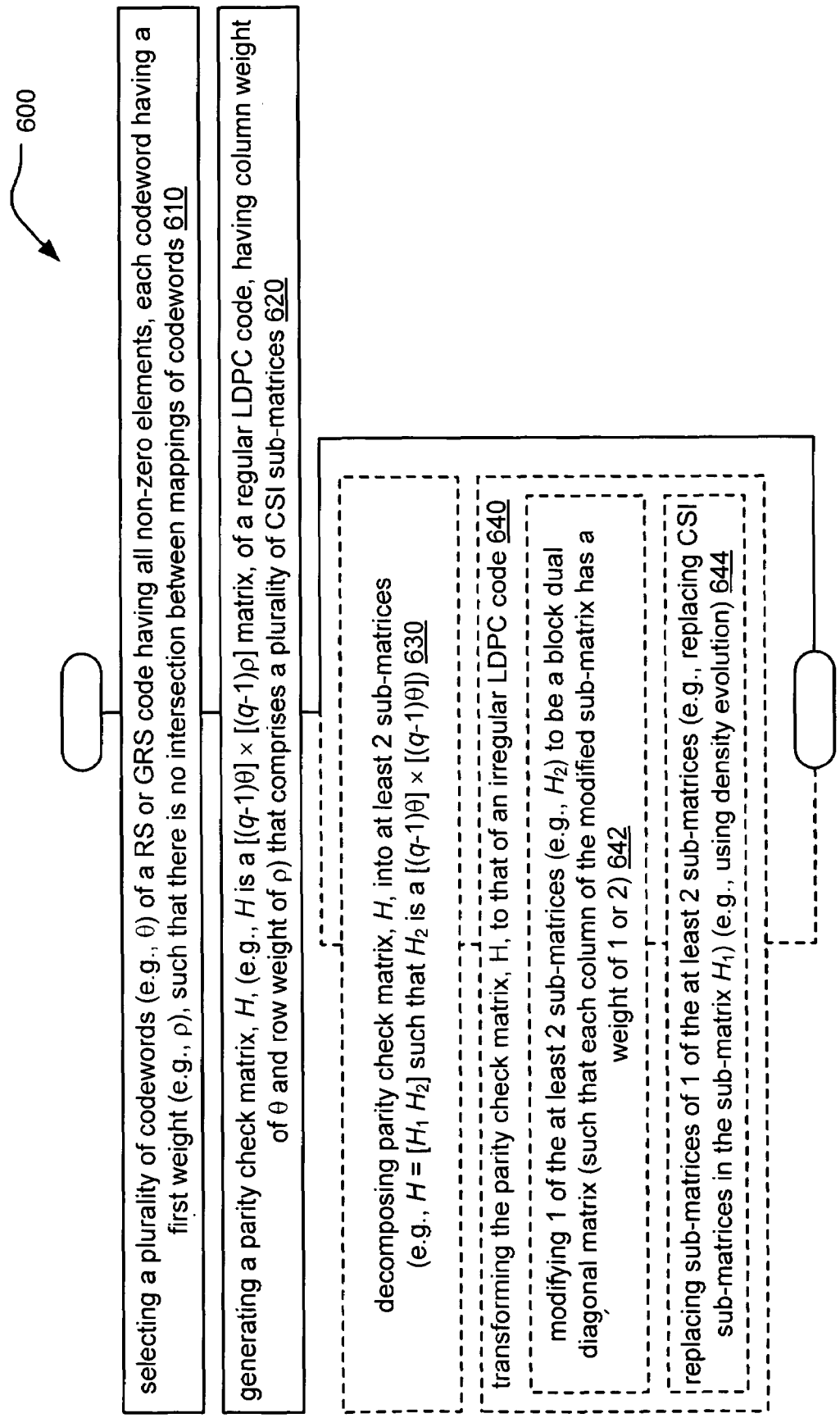
FIG. 6 illustrates an embodiment of a method for constructing a parity check matrix corresponding to a regular or an irregular LDPC code.

FIG. 6 illustrates an embodiment of a method 600 for constructing a parity check matrix corresponding to a regular or an irregular LDPC code.

As shown in a block 610, the method 600 begins by selecting a plurality of codewords (e.g., θ) of a RS (Reed-Solomon) or GRS (Generalized Reed-Solomon) code having all non-zero elements. Also, each codeword of the selected plurality of codewords has a first weight (e.g., p). Moreover, the conditions as prescribed above by (EQ 14) must also be satisfied, in that, there should be no intersection between the mappings of the selected codewords.

Then, as shown in a block 620, the method 600 continues by generating a parity check matrix, H, (e.g., H is a [[(q−1) θ×(q−1)ρ] matrix, of a regular LDPC code, having column weight of θ and row weight of ρ). This parity check matrix, H, is composed of a plurality of CSI sub-matrices. This parity check matrix, H, also corresponds to a regular LDPC code. Based on the exponent, $i_0$, of the primitive element, $\alpha$ (i.e., depicted as $\alpha^{i_0}$), of the individual elements of the selected RS or 15 GRS codewords, that particular row, $i_0$, of the identity sub-matrix is cyclic shifted thereby generating a CSI (Cyclic Shifted Identity) sub-matrix. As an example, if the CSI sub-matrix is depicted as being, $I_s(\alpha^3)$, then that particular identity sub-matrix corresponding to that element of the RS or GRS codeword undergoes cyclic shifting of the 3rd row (i.e., where $i_0=3$, from $\alpha^{i_0}=\alpha^3$).

As shown in a block 630, the parity check matrix, H, that corresponds to a regular LDPC code may be decomposed into at least 2 separate sub-matrices (e.g., $H=[H_1 \; H_2]$). Thereafter, as shown in a block 640, this decomposed parity check matrix, H, may be transformed to correspond to an irregular LDPC code. As shown in a block 642, the method 600 involves modifying 1 of the at least 2 sub-matrices (e.g., $H_2$) to be a block dual diagonal matrix (such that each column of the modified sub-matrix has a weight of 1 or 2). Also, as shown in a block 644, the method 600 involves replacing sub-matrices of 1 of the at least 2 sub-matrices (e.g., CSI sub-matrices in the sub-matrix $H_1$). For example, this may be performed using the density evolution approach as is known in the art.

In this disclosure, a performance diagram is described in the context of BLER (Block Error Rate) versus $E_b/N_o$ (ratio of energy per bit $E_b$ to the Spectral Noise Density $N_o$). BLER is oftentimes used in the context of wireless communications where if any one bit in a block is determined to be in error, then the entire block is determined to be in error. In some other communication system application, performance may be viewed in terms of BER (Bit Error Rate) vs. $E_b/N_o$. This term $E_b/N_o$ is the measure of SNR (Signal to Noise Ratio) for a digital communication system. When looking at these performance curves, the BLER may be determined for any given $E_b/N_o$ (or SNR) thereby providing a relatively concise representation of the performance of the decoding approach.

Figure 7:
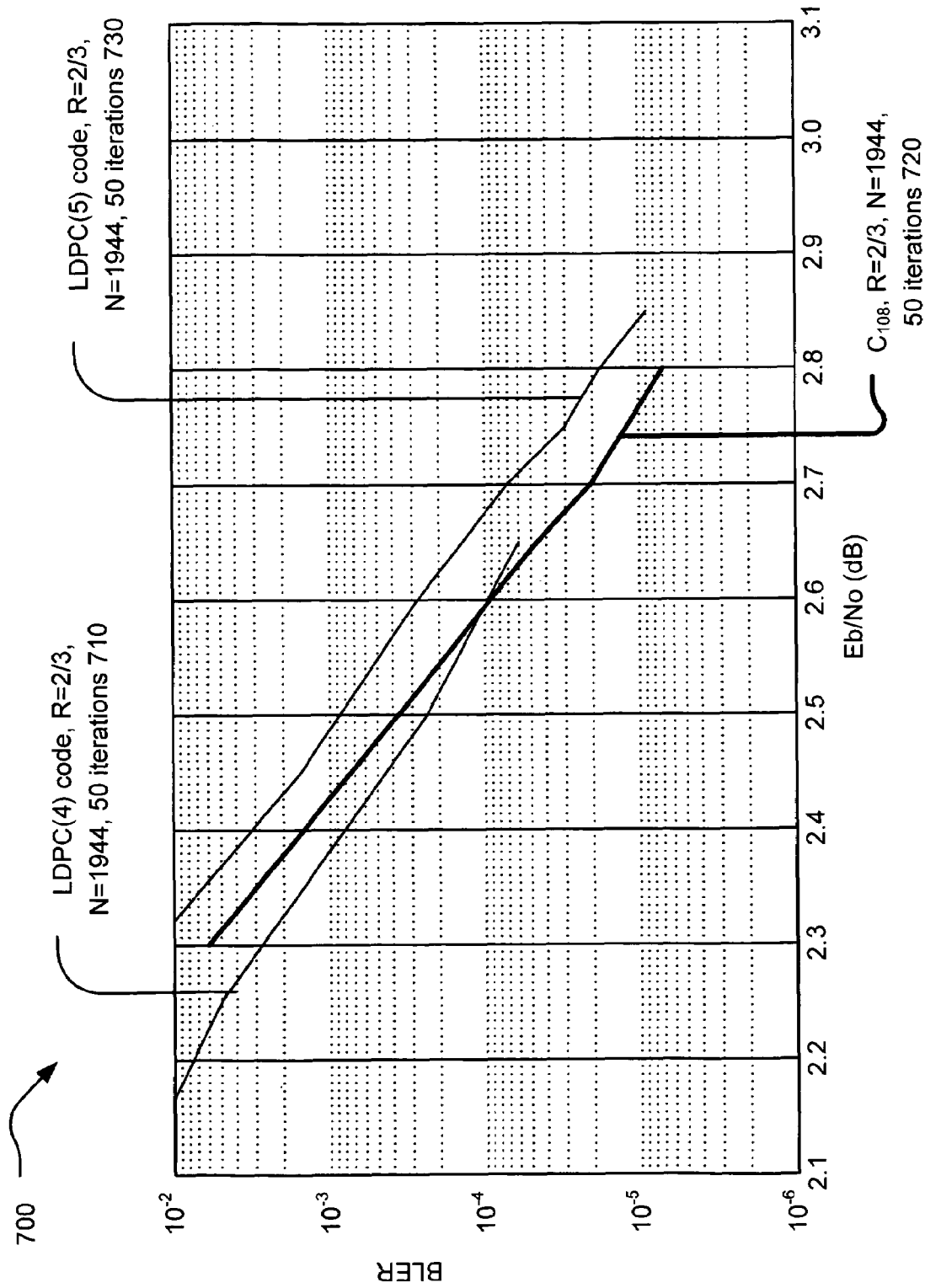
FIG. 7 illustrates an embodiment of a performance comparison between two different LDPC codes (i.e., LDPC(4) and LDPC(5)) and an LDPC code ($C_{108}$), whose parity check matrix includes at least one CSI sub-matrix.

FIG. 7 illustrates an embodiment of a performance comparison 700 between two different LDPC codes (i.e., LDPC (4) and LDPC(5)) and an LDPC code ($C_{108}$), whose parity check matrix includes at least one CSI sub-matrix.

This performance comparison is made of an LDPC code whose corresponding parity check matrix has CSI (Cyclic Shifted Identity) sub-matrices. Specifically, the FIG. 7 gives the performance curves of the LDPC code $C_{108}$, that is generated as described above, and some other LDPC codes. Each of these LDPC codes has a code rate of ⅔ (i.e., R=⅔), N=1944, and the performance is shown when performing 50 decoding iterations.

The performance curve corresponding to the LDPC code $C_{108}$, (depicted using reference numeral 720) is shown as having a lower error floor that both LDPC(4) code and LDPC (5) code, and a better performance (i.e., approximately 0.5 better) LDPC(5).

The performance curve corresponding to the LDPC(4) code is depicted using reference numeral 710, and the LDPC (4) code is described in detail in the following reference:

[4] "Joint proposal for LDPC Codes," Hughes Network System, ST Microelectronics and Texas Instrument, WWiSE Advanced Coding "Ad hoc" meeting, May 6, 2005.

The performance curve corresponding to the LDPC(5) code is depicted using reference numeral 730, and the LDPC (5) code is described in detail in the following reference:

[5] Paul Gray and Keith Chugg, "F-LDPC for 802.1 In advanced ECC," TrellisWare Technologies, Inc, (TWT-018), May 6, 2005.

Several different LDPC codes that have been generated using principles described herein as described are compared to other codes below. In each of these LDPC codes, the base matrix, that is used to generate the parity check matrix corresponding to the LDPC code, includes 24 columns. Certain of sub-matrices employed therein is also a CSI (Cyclic Shifted Identity) matrix as described in detail above as well; other of the sub-matrices are the all-zero matrix (e.g., a matrix including all 0 valued elements). The 3 different block sizes of the LDPC codes that are compared below are as follows:

1. 1872=78×24
2. 1248=52×24
3. 624=26×24

The redundancy part of the parity check matrix, H, may be an upper (or lower) triangular matrix. Such a triangular arrangement of the parity check matrix, H, can be desirable in that it allows for easy back substitution encoding (e.g., there is no need to permute the columns). However, some of the embodiments described below employ redundancy parts of their corresponding parity check matrix, H, that are not upper (or lower) triangular matrices as well.

Figure 8:
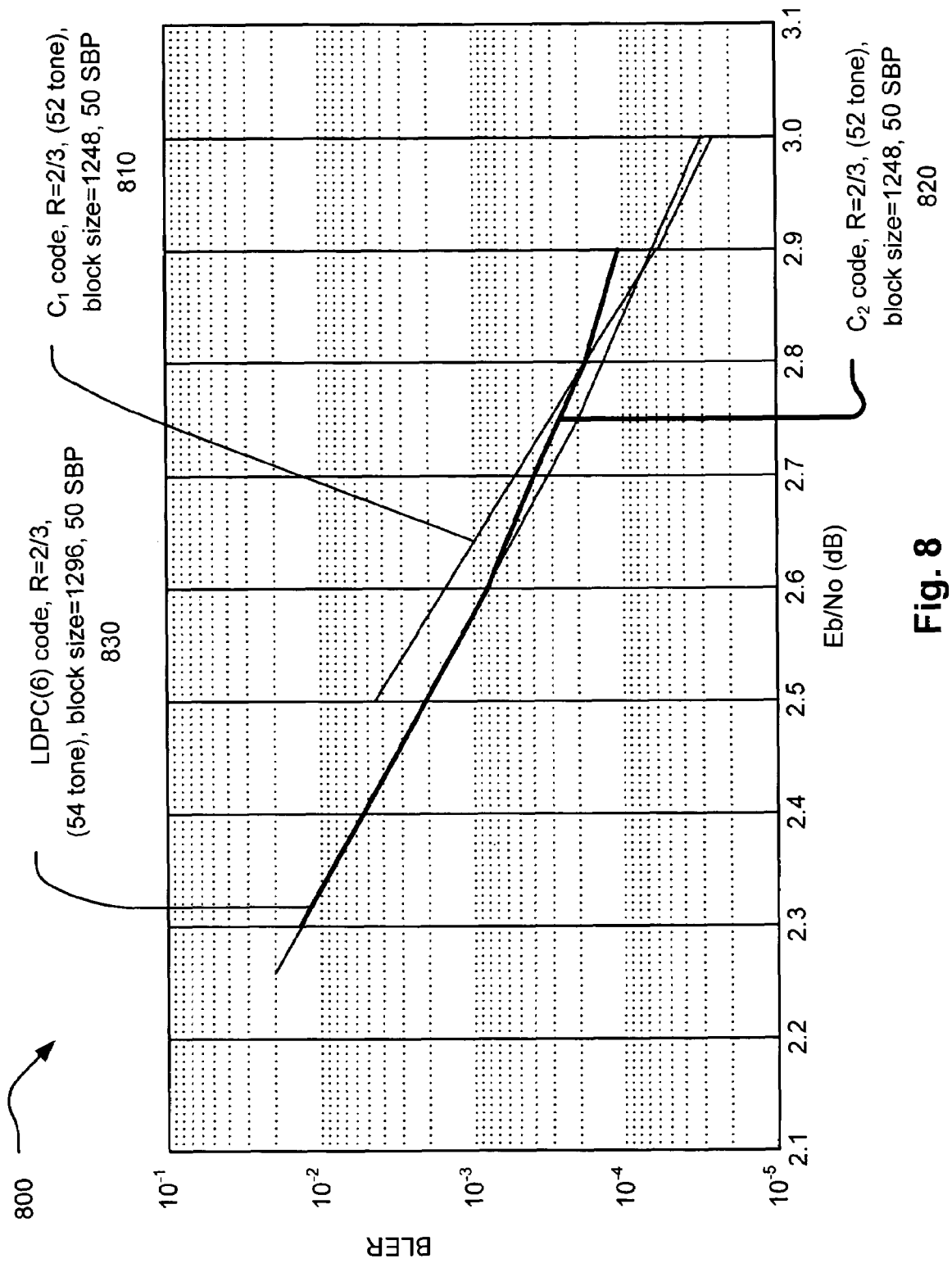
FIG. 8 illustrates an embodiment of a performance comparison between an LDPC code (i.e., LDPC(6)) and an LDPC code ($C_1$) and an LDPC code ($C_2$), whose parity check matrices include at least one CSI sub-matrix.

FIG. 8 illustrates an embodiment of a performance comparison 800 between an LDPC code (i.e., LDPC(6)) and an LDPC code ($C_1$) and an LDPC code ($C_2$), whose parity check matrices include at least one CSI sub-matrix.

The following table (representing LDPC code $C_1$, having a block size of 1248) consists of a plurality of entries such that every entry represents a 52×52 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 52×52 sub-matrix. The table (representing LDPC code $C_1$, having a block size of 1248) is depicted using two paragraphs because of its width. The entire Table includes 8 rows and 24 columns. The first Table portion includes columns 1-12 and the second Table portion includes columns 13-24.

Rows 1-8, Columns 1-12

| | | | | | | | | | | | |
|---|---|---|---|---|---|---|---|---|---|---|---|
| 19 | 6 | 34 | 47 | 17 |    | 1 |    | 33 |    | 2 |    |
| 27 | 43 | 21 | 8 |    | 49 |    | 13 |    | 10 |    | 35 |
| 21 | 44 | 29 | 45 | 23 |    | 38 |    | 47 |    | 5 |    |
| 36 | 9 | 23 | 46 |    | 47 |    | 12 |    | 1 |    | 17 |
| 45 | 50 | 38 | 11 | 25 |    | 33 |    | 1 |    | 42 |    |
| 3 | 14 | 47 | 0 |    | 39 |    | 24 |    | 25 |    | 42 |
| 9 | 11 | 5 | 16 | 49 |    | 42 |    | 3 |    | 37 |    |
| 30 | 36 | 11 | 13 |    | 18 |    | 4 |    | 17 |    | 2 |

Rows 1-8, Columns 13-24

| | | | | | | | | | | | |
|---|---|---|---|---|---|---|---|---|---|---|---|
| 1 |    | 18 |    | 0 |    |    |    |    |    |    |    |
|    | 7 |    | 38 |    | 8 |    | 0 |    |    |    |    |
| 11 |    | 32 |    |    |    | 12 |    | 0 |    |    |    |
|    | 14 |    | 39 |    |    |    | 11 |    | 0 |    |    |

-continued

```
51       9              23   0
   31       47              29   0
31       46                     30   0
      3       20                     33   0
```

The LDPC code C1 corresponding to this table is depicted as $C_1$ code, R=⅔, 52 tone), block size=1248, 50 SBP 810 in the corresponding diagram.

The following table (representing LDPC code $C_2$, also having a block size of 1248) consists of a plurality of entries such that every entry represents a 52×52 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 52×52 sub-matrix. One difference between this LDPC code $C_2$ and the LDPC code $C_1$ described above is that the redundancy part of the parity check matrix, H, of the LDPC code $C_2$ is not triangular. Also, the LDPC code $C_2$ has a minimum column weight of 2. The table (representing LDPC code $C_2$, having a block size of 1248) is depicted using two paragraphs because of its width. The entire Table includes 8 rows and 24 columns. The first Table portion includes columns 1-12 and the second Table portion includes columns 13-24.

Rows 1-8, Columns 1-12

```
24  51   1        6            32           42
48  20        1        49   8        46
 1  19              2                    17        36
17  10   3              24        5              12
13   4       38              2              6            3
17   6              47        25        2
 0  24  19              34              35        6
14  31        0              45              18       29
```

Rows 1-8, Columns 13-24

```
43  21   8  36  49  45
44  29  45  23          38  51
 9  23  46  31                  12  14
50  38  11  25                       1  14
14  47   0  14                              25   3
11   5  16  49                                      37   1
36  11  13   7                                               2  39
 8  32  38  13  15                                              33
```

The LDPC code $C_2$ corresponding to this table is depicted as $C_2$ code, R=⅔, (52 tone), block size=1248, 50 SBP 820 in the corresponding diagram.

The performances of these two LDPC codes ($C_1$ code, R=⅔, (52 tone), block size=1248, 50 SBP 810 and $C_2$ code, R=⅔, (52 tone), block size=1248, 50 SBP 820) compared to LDPC(6) code, R=⅔, (54 tone), block size=1296, 50 SBP 830.

Figure 9:
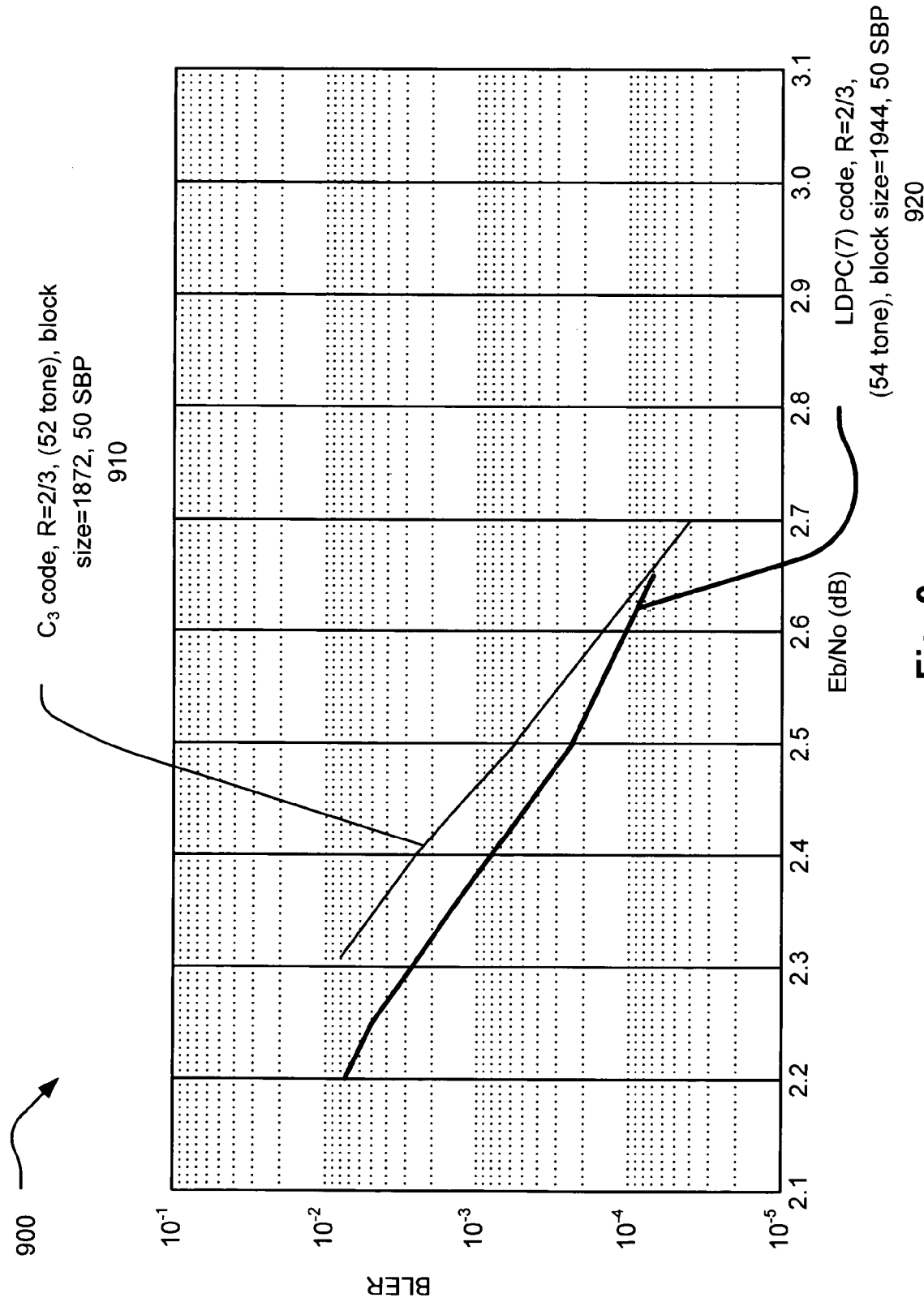
FIG. 9 illustrates an embodiment of a performance comparison between a different LDPC code (i.e., LDPC(7)) and an LDPC code ($C_{3a}$ or $C_{3b}$), whose parity check matrix includes at least one CSI sub-matrix.

FIG. 9 illustrates an embodiment of a performance comparison 900 between a different LDPC code (i.e., LDPC(7)) and an LDPC code ($C_{3a}$ or $C_{3b}$), whose parity check matrix includes at least one CSI sub-matrix.

The following table (representing LDPC code $C_{3a}$, having a block size of 1872) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix. The table (representing LDPC code $C_{3a}$, having a block size of 1872) is depicted using two paragraphs because of its width. The entire Table includes 8 rows and 24 columns. The first Table portion includes columns 1-12 and the second Table portion includes columns 13-24.

Rows 1-8, Columns 1-12

```
55  45  52  19  60        30        71        61
72  70  57   8        21        56        68         5
17  30  74  72  59        56        64        34
64  49  19  32        74        12        25        21
 6  16  66  12  21         0        63        21
 9  66   8  57        53        75         0        16
19  37  11  68  10        70        25         4
46  26  21   0        70        61        57         1
```

Rows 1-8, Columns 13-24

```
65        12         0  48
      0        37         0  42
75        26                   0   7
      72         9                   0  23
68        77                           0  74
      68        64                           0   2
67        25                                       0  71
       4        20                                       0
```

The following table (representing LDPC code $C_{3b}$, also having a block size of 1872) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix. The table (representing LDPC code $C_{3b}$, having a block size of 1872) is depicted using two paragraphs because of its width. The entire Table includes 8 rows and 24 columns. The first Table portion includes columns 1-12 and the second Table portion includes columns 13-24.

Rows 1-8, Columns 1-12

```
55  45  52  19  60        30        71        61
72  70  57   8        21        56        68         5
17  30  74  72  59        56        64        34
64  49  19  32        74        12        25        21
 6  16  66  12  21         0        63        21
 9  66   8  57        53        75         0        16
19  37  11  68  10        70        25         4
46  26  21   0        70        61        57         1
```

Rows 1-8, Columns 13-24

```
65        12                                48   0
      0        37                      42   0
75        26                       7   0
      72         9                    23   0
68        77                  74   0
      68        64            2   0
67        25           71   0
       4        20    0
```

Either of the LDPC codes $C_{3a}$ or $C_{3b}$ is corresponding to the appropriate table depicted above is referred to as $C_3$ code, R=⅔, (52 tone), block size=1872, 50 SBP 910 in the corresponding diagram.

The performance of either these two LDPC codes ($C_{3a}$ or $C_{3b}$ depicted as $C_3$ code, R=⅔, (52 tone), block size=1872, 50 SBP 910) is compared to LDPC(7) code, R=⅔, (54 tone), block size=1944, 50 SBP 920.

Figure 10:
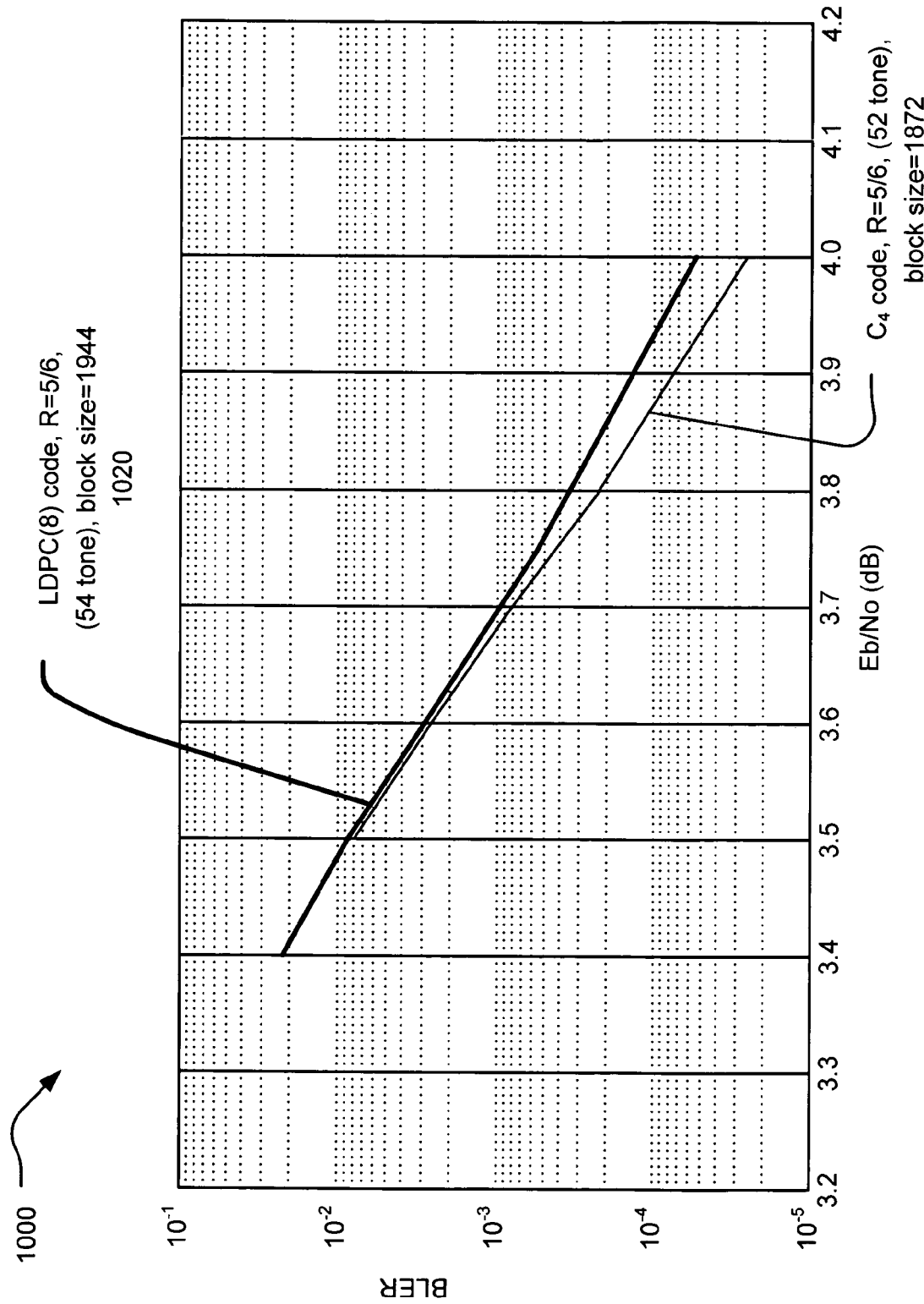
FIG. 10 illustrates an embodiment of a performance comparison between a different LDPC code (i.e., LDPC(8)) and an LDPC code ($C_4$), whose parity check matrix includes at least one CSI sub-matrix.

FIG. 10 illustrates an embodiment of a performance comparison 1000 between a different LDPC code (i.e., LDPC(8)) and an LDPC code ($C_4$), whose parity check matrix includes at least one CSI sub-matrix.

The following table (representing LDPC code $C_4$, having a block size of 1872) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix. The table (representing LDPC code $C_4$, having a block size of 1872) is depicted using two paragraphs because of its width. The entire Table includes 4 rows and 24 columns. The first Table portion includes columns 1-12 and the second Table portion includes columns 13-24.

Rows 1-4, Columns 1-12

| 66 | 37 | 61 | 53 | 26 | 51 | 33 | 63 | 59 | 24 | 10 | 56 |
|---|---|---|---|---|---|---|---|---|---|---|---|
| 1  | 3  | 70 | 0  | 63 | 55 | 28 | 53 | 35 | 65 | 61 | 26 |
| 66 | 25 | 3  | 5  | 72 | 41 | 65 | 57 | 30 | 55 | 37 | 67 |
| 5  | 6  | 68 | 66 | 5  | 7  | 74 | 4  | 67 | 59 | 32 | 57 |

Rows 1-4, Columns 13-24

| 16 | 50 | 44 | 55 | 69 | 72 | 29 | 17 | 0  |    |    |    |
|---|---|---|---|---|---|---|---|---|---|---|---|
| 12 | 58 | 18 | 52 | 46 | 57 | 71 | 74 | 61 | 0  |    |    |
| 63 | 28 | 14 | 60 | 20 | 54 | 48 | 59 |    |    | 57 | 0  |
| 0  | 69 | 65 | 30 | 16 | 62 | 22 | 56 |    |    | 45 | 0  |

The LDPC code $C_4$ corresponding to the table depicted above is referred to as $C_4$ code, R=⅚, (52 tone), block size=1872 1010 in the corresponding diagram.

The performance of this LDPC codes ($C_4$ code, R=⅚, (52 tone), block size=1872 1010) is compared to LDPC(8) code, R=⅚, (54 tone), block size=1944 1020.

It is noted that many of the LDPC codes presented and compared below have been constructed from a GRS code of a finite field (Galois field) GF(79).

Figure 11:
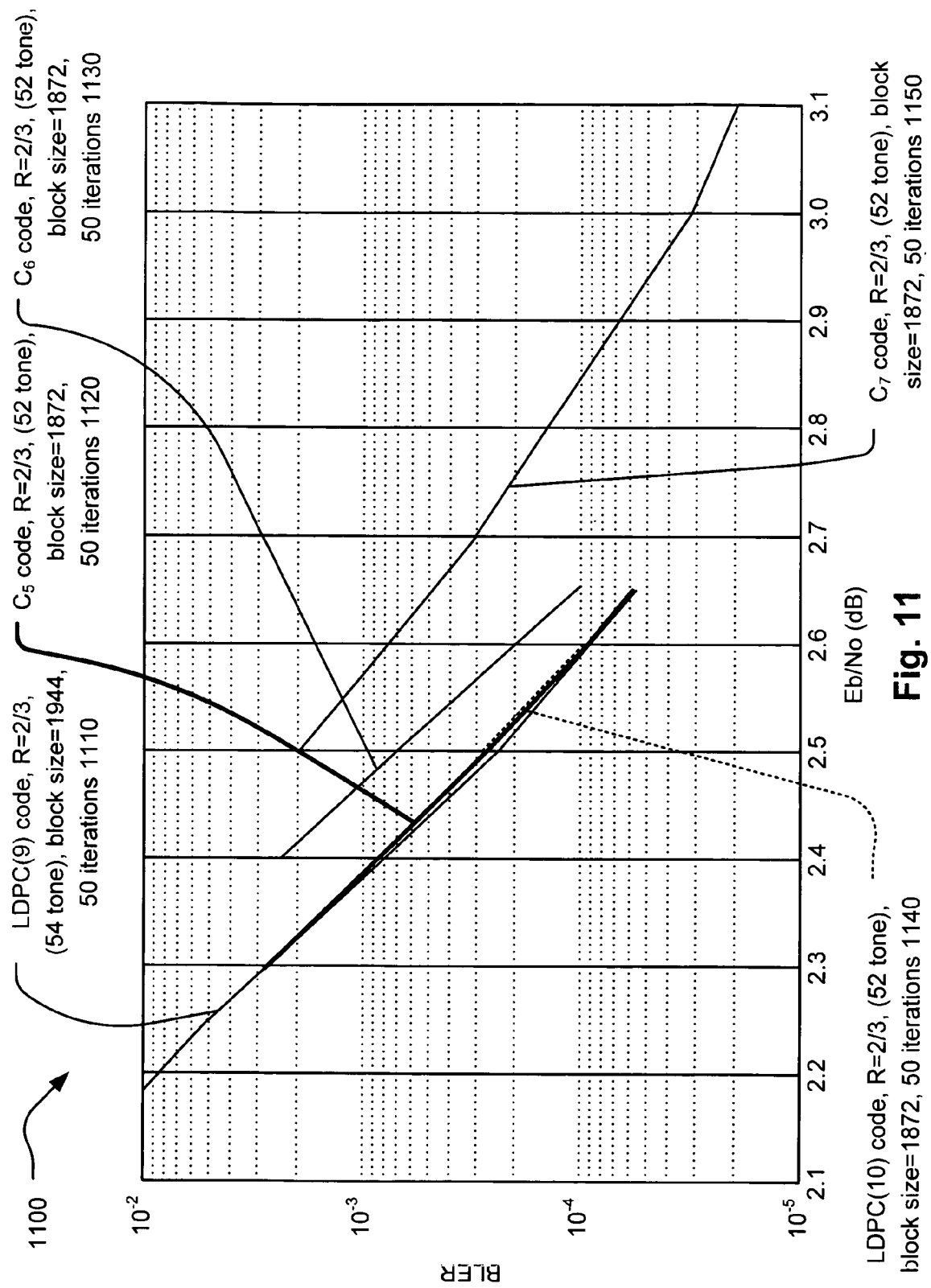
FIG. 11 illustrates an embodiment of a performance comparison between two different LDPC codes (i.e., LDPC(9) and LDPC(10)) and 3 other LDPC codes ($C_5$, $C_6$, and $C_7$), whose parity check matrices include at least one CSI sub-matrix.

FIG. 11 illustrates an embodiment 1100 of a performance comparison between two different LDPC codes (i.e., LDPC(9) and LDPC(10)) and 3 other LDPC codes ($C_5$, $C_6$, and $C_7$), whose parity check matrices include at least one CSI sub-matrix.

The performance of the LDPC code, LDPC(9), after performing 50 decoding iterations, is depicted by reference numeral 1110. LDPC(9) has a code rate of R=⅔, (54 tone), and a block size=1944.

The performance of the LDPC code, $C_5$, after performing 50 decoding iterations, is depicted by reference numeral 1120. LDPC code, $C_5$, has a code rate of R=⅔, (52 tone), and a block size=1872.

The performance of the LDPC code, $C_6$, after performing 50 decoding iterations, is depicted by reference numeral 1130. LDPC code, $C_6$, has a code rate of R=⅔, (52 tone), and a block size=1872.

The performance of the LDPC code, LDPC(10), after performing 50 decoding iterations, is depicted by reference numeral 1140. LDPC(10) has a code rate of R=⅔, (54 tone), and a block size=1872.

The performance of the LDPC code, $C_7$, after performing 50 decoding iterations, is depicted by reference numeral 1150. LDPC code, $C_7$, has a code rate of R=⅔, (52 tone), and a block size=1872.

The performance of the LDPC code, LDPC(10), after performing 50 decoding iterations, is depicted by reference numeral 1110. LDPC(9) has a code rate of R=⅔, (54 tone), and a block size=1944.

Figure 12:
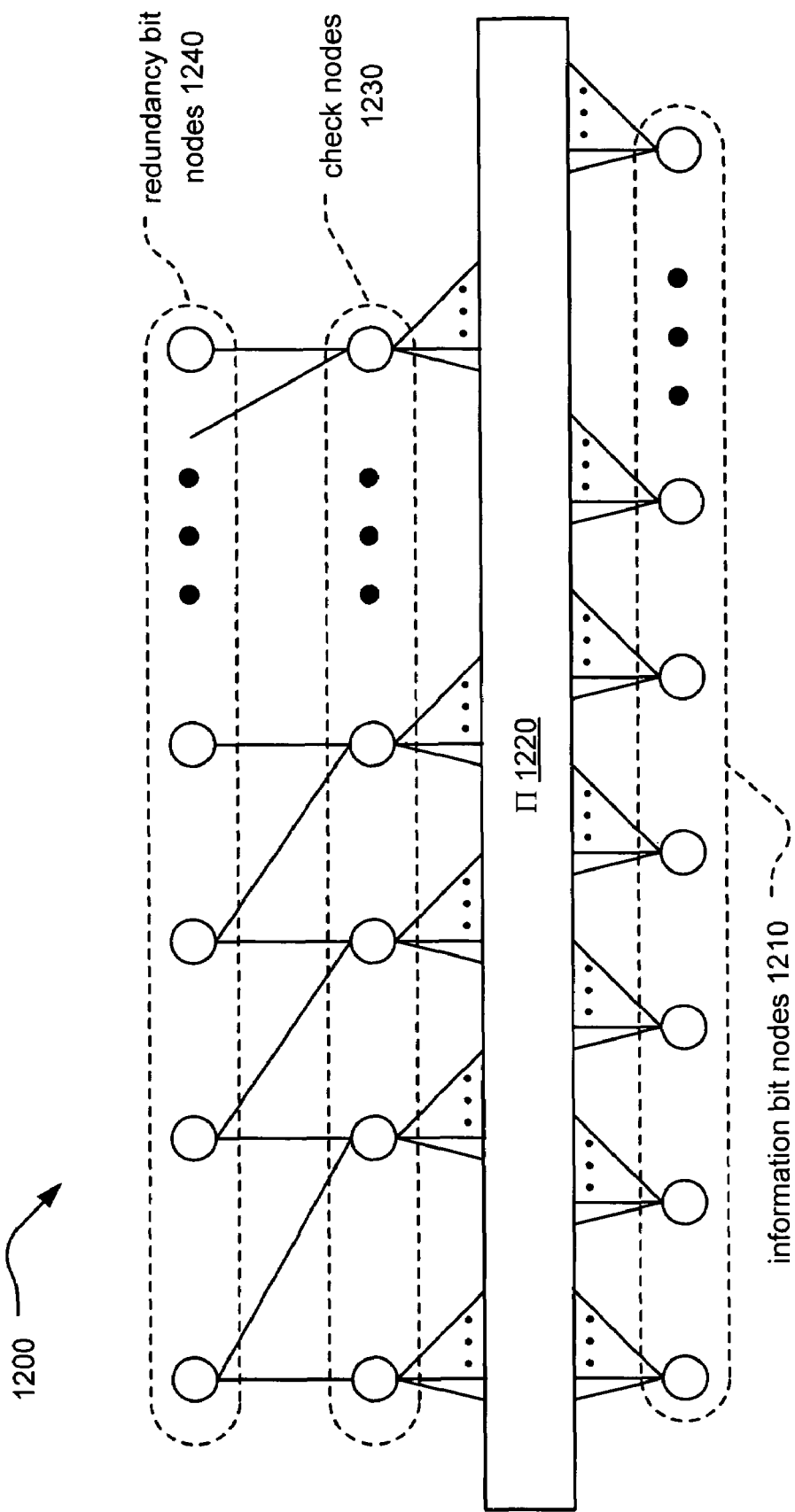
FIG. 12 illustrates an embodiment of the construction of one of the LDPC codes whose performance is depicted within FIG. 11 (i.e., LDPC(10)).

FIG. 12 illustrates an embodiment 1200 of the construction of one of the LDPC codes whose performance is depicted within FIG. 11 (i.e., LDPC(10)).

The following table (representing LDPC(10)) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix.

A table (representing LDPC code, LDPC(10)) is provided using 2 paragraphs because of its size. The entire Table includes 8 rows and 24 columns. The first Table portion depicts rows 1-8 and columns 1-12, and the second Table portion depicts rows 1-8 and columns 13-24.

Rows 1-8, Columns 1-12

| 69 | 40 | 37 | 72 | 40 | 37 | 25 |    | 7  |    |    | 58 |
|---|---|---|---|---|---|---|---|---|---|---|---|
| 1  | 59 | 65 | 76 | 6  | 46 |    | 51 |    | 61 |    |    |
| 75 | 73 | 59 | 31 | 75 | 26 |    |    | 23 |    | 52 |    |
| 25 | 45 | 37 | 51 | 3  | 63 | 21 |    |    | 21 |    | 29 |
| 70 | 36 | 25 | 74 | 51 | 14 |    | 50 |    |    | 58 |    |
| 74 | 2  | 18 | 41 | 69 | 61 |    |    | 35 |    |    | 52 |
| 75 | 63 | 74 | 60 | 50 | 58 | 60 |    |    | 32 |    |    |
| 48 | 33 | 68 | 61 | 73 | 53 |    | 53 |    |    | 67 |    |

Rows 1-8, Columns 13-24

|    |    | 55 |    | 0  |    |    |    |    |    |    | D  |
|---|---|---|---|---|---|---|---|---|---|---|---|
| 51 |    |    |    | 60 | 0  | 0  |    |    |    |    |    |
|    | 72 |    |    |    |    | 0  | 0  |    |    |    |    |
|    |    | 6  |    |    |    |    | 0  | 0  |    |    |    |
| 32 |    |    | 76 |    |    |    |    | 0  | 0  |    |    |
|    | 8  |    |    |    |    |    |    |    | 0  | 0  |    |
| 72 |    | 19 |    |    |    |    |    |    |    | 0  | 0  |
|    | 77 |    | 53 |    |    |    |    |    |    |    | 0  |

The "D" entry in the upper-right hand portion of the Table can be depicted as follows:

$$D = \begin{bmatrix} 0 & 0 & \ldots & 0 & 0 & 0 & 0 \\ 1 & 0 & \ldots & 0 & 0 & 0 & 0 \\ 0 & 1 & \ldots & 0 & 0 & 0 & 0 \\ 0 & 0 & \ldots & 0 & 0 & 0 & 0 \\ \vdots & \vdots & \vdots & \vdots & \vdots & \vdots & \vdots \\ 0 & 0 & \ldots & 0 & 1 & 0 & 0 \\ 0 & 0 & 0 & 0 & 0 & 1 & 0 \end{bmatrix}_{z \times z}.$$

Graphically, a plurality of information bit nodes 1210 connect to a plurality of check nodes 1230 via a plurality of edges according to a predetermined permutation block (depicted as II1220). Appropriate row and column permuting provides the redundancy bit nodes 1240 having connectivity as depicted in the top of the diagram. By this construction, it can be seen that a large open loop exists having a size of 624.

Figure 13:
FIG. 13 illustrates an embodiment of the permutation of one of the LDPC codes whose performance is depicted within FIG. 11 (i.e., LDPC(10)).

FIG. 13 illustrates an embodiment 1300 of the permutation of one of the LDPC codes whose performance is depicted within FIG. 11 (i.e., LDPC(10)). Of particular note with respect to this embodiment is the upper right hand 3×3 sub-matrix that is provided here as well for ease of the reader.

$$\begin{bmatrix} 0 & 0 & 0 \\ 1 & 0 & 0 \\ 0 & 1 & 0 \end{bmatrix}$$

Figure 14:
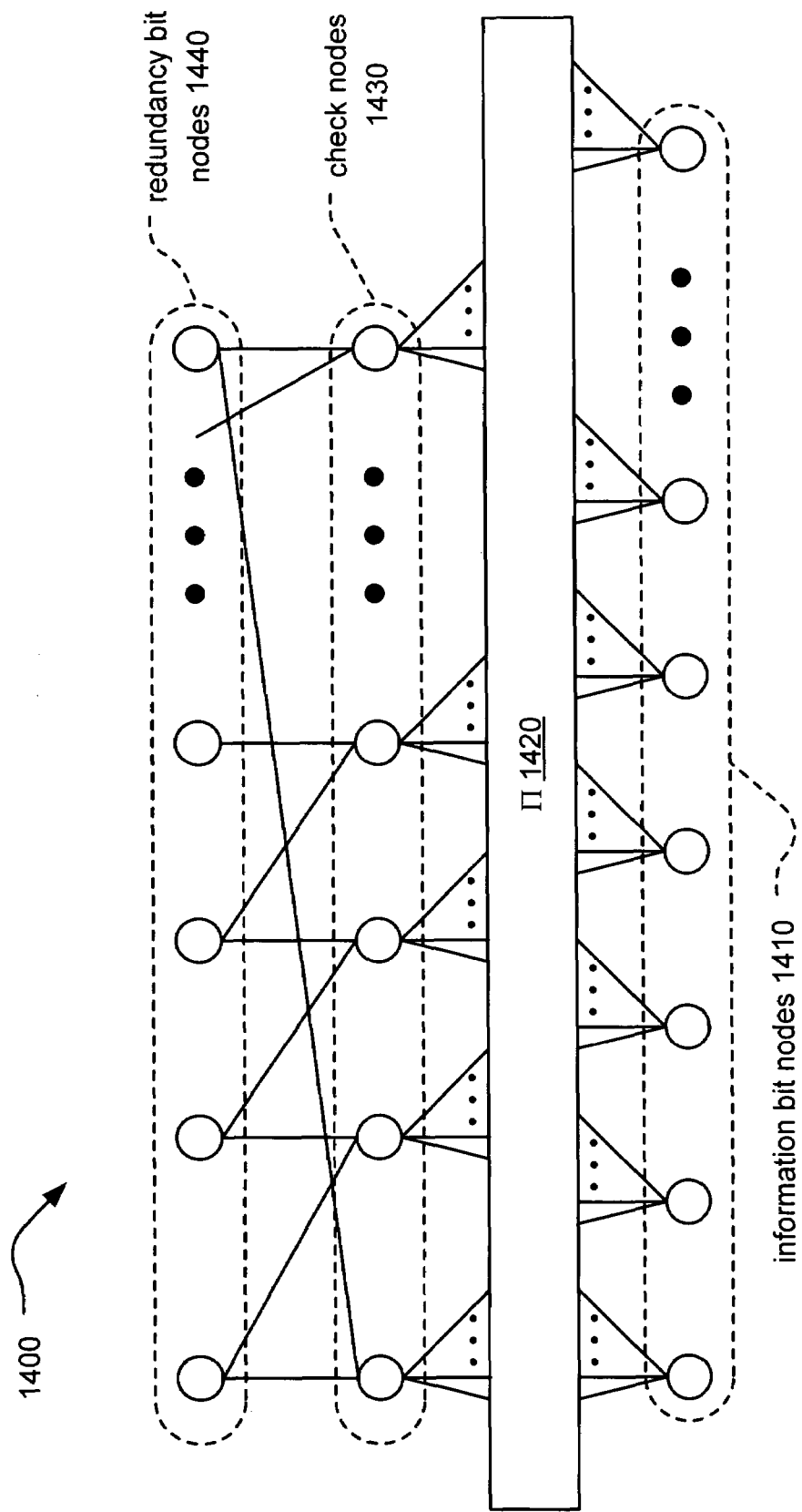
FIG. 14 illustrates an embodiment of the construction of one of the LDPC codes whose performance is depicted within FIG. 11 (i.e., LDPC code ($C_5$)).

FIG. 14 illustrates an embodiment 1400 of the construction of one of the LDPC codes whose performance is depicted within FIG. 11 (i.e., LDPC code ($C_5$)).

The following table (representing LDPC code ($C_5$)) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix.

A table (representing LDPC code, LDPC code ($C_5$)) is provided using 2 paragraphs because of its size. The entire Table includes 8 rows and 24 columns. The first Table portion depicts rows 1-8 and columns 1-12, and the second Table portion depicts rows 1-8 and columns 13-24.

Rows 1-8, Columns 1-12

| 69 | 40 | 37 | 72 | 40 | 37 | 25 |    | 7  |    |    | 58 |
|----|----|----|----|----|----|----|----|----|----|----|----|
| 1  | 59 | 65 | 76 | 6  | 46 |    | 51 |    | 61 |    |    |
| 75 | 73 | 59 | 31 | 75 | 26 |    |    | 23 |    | 52 |    |
| 25 | 45 | 37 | 51 | 3  | 63 | 21 |    |    | 21 |    | 29 |
| 70 | 36 | 25 | 74 | 51 | 14 |    | 50 |    |    | 58 |    |
| 74 | 2  | 18 | 41 | 69 | 61 |    |    | 35 |    |    | 52 |
| 75 | 63 | 74 | 60 | 50 | 58 | 60 |    |    | 32 |    |    |
| 48 | 33 | 68 | 61 | 73 | 53 |    | 53 |    |    | 67 |    |

Rows 1-8, Columns 13-24

|    |    | 55 |    | 0  |    |    |    |    |    |    | -1 |
| 51 |    |    | 60 | 0  | 0  |    |    |    |    |    |    |
|    | 72 |    |    |    | 0  | 0  |    |    |    |    |    |
|    |    | 6  |    |    |    | 0  | 0  |    |    |    |    |
| 32 |    |    | 76 |    |    |    | 0  | 0  |    |    |    |
|    | 8  |    |    |    |    |    |    | 0  | 0  |    |    |
| 72 |    | 19 |    |    |    |    |    |    | 0  | 0  |    |
|    | 77 |    | 53 |    |    |    |    |    |    | 0  | 0  |

Of special note is the "-1" entry in the upper-right hand portion of the Table.

Graphically, a plurality of information bit nodes 1410 connect to a plurality of check nodes 1430 via a plurality of edges according to a predetermined permutation block (depicted as II1420). Appropriate row and column permuting provides the redundancy bit nodes 1440 having connectivity as depicted in the top of the diagram. By this construction, it can be seen that a large cycle of size 624 exists.

Figure 15:
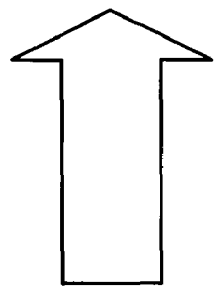
FIG. 15 and FIG. 16 illustrate embodiments of the permutation of two of the LDPC codes whose performance is depicted within FIG. 11 (i.e., LDPC code ($C_5$) and LDPC code ($C_6$)).
Figure 16:
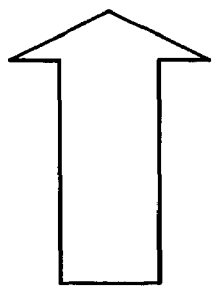

FIG. 15 and FIG. 16 illustrate embodiments of the permutation of two of the LDPC codes whose performance is depicted within FIG. 11 (i.e., LDPC code ($C_5$) and LDPC code ($C_6$)).

Referring to embodiment 1500 of the FIG. 15 depicting LDPC code ($C_5$), of particular note with respect to this embodiment is the upper right hand 3×3 sub-matrix that is provided here as well for ease of the reader.

$$\begin{bmatrix} 0 & 0 & 1 \\ 1 & 0 & 0 \\ 0 & 1 & 0 \end{bmatrix}.$$

As such, the upper-right hand entry of the $0^{th}$ row, $11^{th}$ column entry is "1", as can be seen on the left hand side portion of this diagram before performing the permutation.

The following table (representing LDPC code ($C_6$)) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), the empty spaces indicates an all zero-valued (i.e., all elements are 0) 78×78 sub-matrix.

An alternative LDPC code construction is also presented here for LDPC code ($C_6$). A table (representing LDPC code, LDPC code ($C_6$)) is provided using 2 paragraphs because of its size. The entire Table includes 8 rows and 24 columns. The first Table portion depicts rows 1-8 and columns 1-12, and the second Table portions depicts rows 1-8 and columns 13-24.

Rows 1-8, Columns 1-12

| 14 | 51 | 70 | 17 | 25 |    |    |    |    | 39 | 76 |    | 71 |
| 32 | 60 | 4  | 9  | 20 | 67 |    |    |    |    | 65 | 76 |    |
| 29 | 67 | 10 | 57 |    | 28 | 52 |    |    |    |    | 22 | 23 |
| 21 | 57 | 63 | 51 | 33 |    | 48 | 25 |    |    |    |    | 45 |
| 68 | 42 | 24 | 62 | 49 | 68 |    | 55 | 53 |    |    |    |    |
| 9  | 2  | 26 | 9  |    | 3  | 53 |    | 76 | 33 |    |    |    |
| 17 | 21 | 36 | 69 |    |    | 1  | 14 |    | 72 | 66 |    |    |
| 64 | 30 | 57 | 19 |    |    |    | 26 | 13 |    | 54 | 15 |    |

Rows 1-8, Columns 13-24

| 52 |    |    |    | 0  |    |    |    |    |    |    |    |
| 77 | 47 |    |    |    | 0  | 0  |    |    |    |    |    |
|    | 29 | 51 |    |    |    | 0  | 0  |    |    |    |    |
| 65 |    | 56 | 66 |    |    |    | 0  | 0  |    |    |    |
| 30 | 63 |    | 0  |    |    |    |    | 0  | 0  |    |    |
|    | 1  | 30 |    |    |    |    |    |    | 0  | 0  |    |
|    |    | 64 | 71 |    |    |    |    |    |    | 0  | 0  |
|    |    | 51 |    |    |    |    |    |    |    |    | 0  | 0  |

After appropriate row and column permuting, the redundancy bit part had generated 8 big open loops of size 78. However, because the bit degrees of this particular LDPC code ($C_6$), it has a larger minimum distance than some of the other LDPC codes presented herein. Therefore, even when performing as few as 12 decoding iterations the LDPC code ($C_6$) can provide a lower error floor than either of the LDPC (10) or the LDPC code ($C_6$) presented above when performing a full 50 decoding iterations.

Referring to embodiment 1600 of the FIG. 16 depicting LDPC code ($C_6$), of particular note with respect to this embodiment is the upper right hand 3×3 sub-matrix that is provided here as well for ease of the reader.

$$\begin{bmatrix} 0 & 0 & 0 \\ 0 & 0 & 0 \\ 0 & 0 & 0 \end{bmatrix},$$

which is an all zero value sub-matrix.

Yet another embodiment and means for constructing an LDPC code is presented below that can provide for hardware savings in an actual implementation. This LDPC code construction is presented for LDPC code ($C_7$).

The following table (representing LDPC code ($C_7$)) consists of a plurality of entries such that every entry represents a 78×78 sub-matrix, where an actual number in the entry location indicates the shift position that is used to construct the CSI sub-matrix (e.g., right cyclic shifting of the identity matrix by that number of positions), and the empty spaces indicates an all zero-valued (i.e., all elements are 0) 78×78 sub-matrix.

A table (representing LDPC code ($C_7$)) is provided using 2 paragraphs because of its size. The entire Table includes 8 rows and 24 columns. The first Table portion depicts rows 1-8 and columns 1-12, and the second Table portion depicts rows 1-8 and columns 13-24.

Rows 1-8, Columns 1-12

```
22      5      15      77      39
    3      58      37      6      64
47      1      51      49      46      32
    30      37      33      26      21      55
54      26      13      73      57      44
    14      8      43      30      72      13
49      45      69      36              11
    39      62      17      14              59
```

Rows 1-8, Columns 13-24

```
54      75      0                          -1
    30      14      0      0
    52              0      0
            16              0      0
20                                  0      0
    29                              0      0
12      16                              0  0
    45      42                              0  0
```

Of special note is the "−1" entry in the upper-right hand portion of the Table.

This LDPC code ($C_7$) provides a significant hardware savings. The total number of edges is 5615 which provides a 27% hardware savings when compared to a previous embodiment. The maximum bit degree is 4 which provides approximately a 15% to 20% time savings in terms of decoding processing. The maximum check degree is 9 which provides approximately a 10% time savings in terms of decoding processing. Overall, the total hardware savings can be approximated to be 30%.

Figure 17:
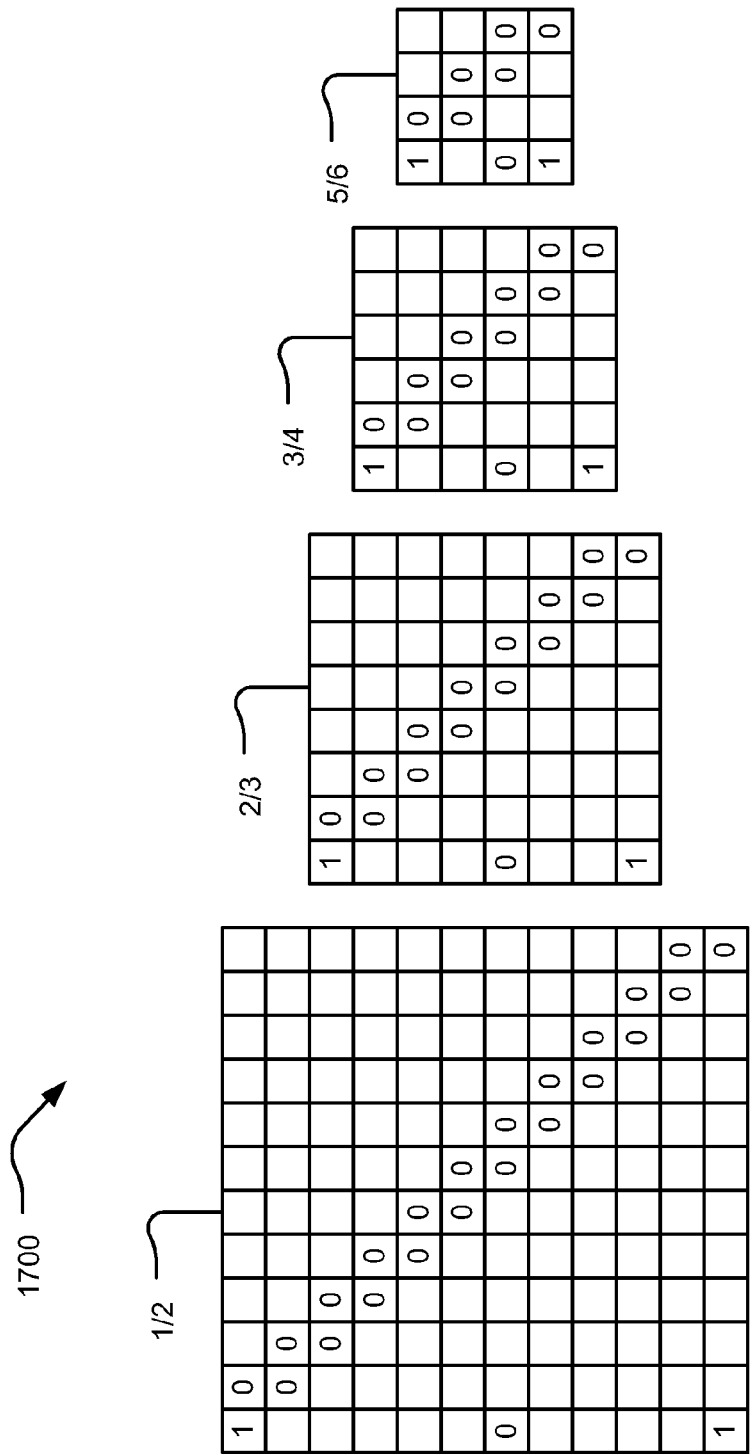
FIG. 17 and FIG. 18 illustrate two embodiments of parity portion constraints for parity check matrices as a function of code rate.
Figure 18:
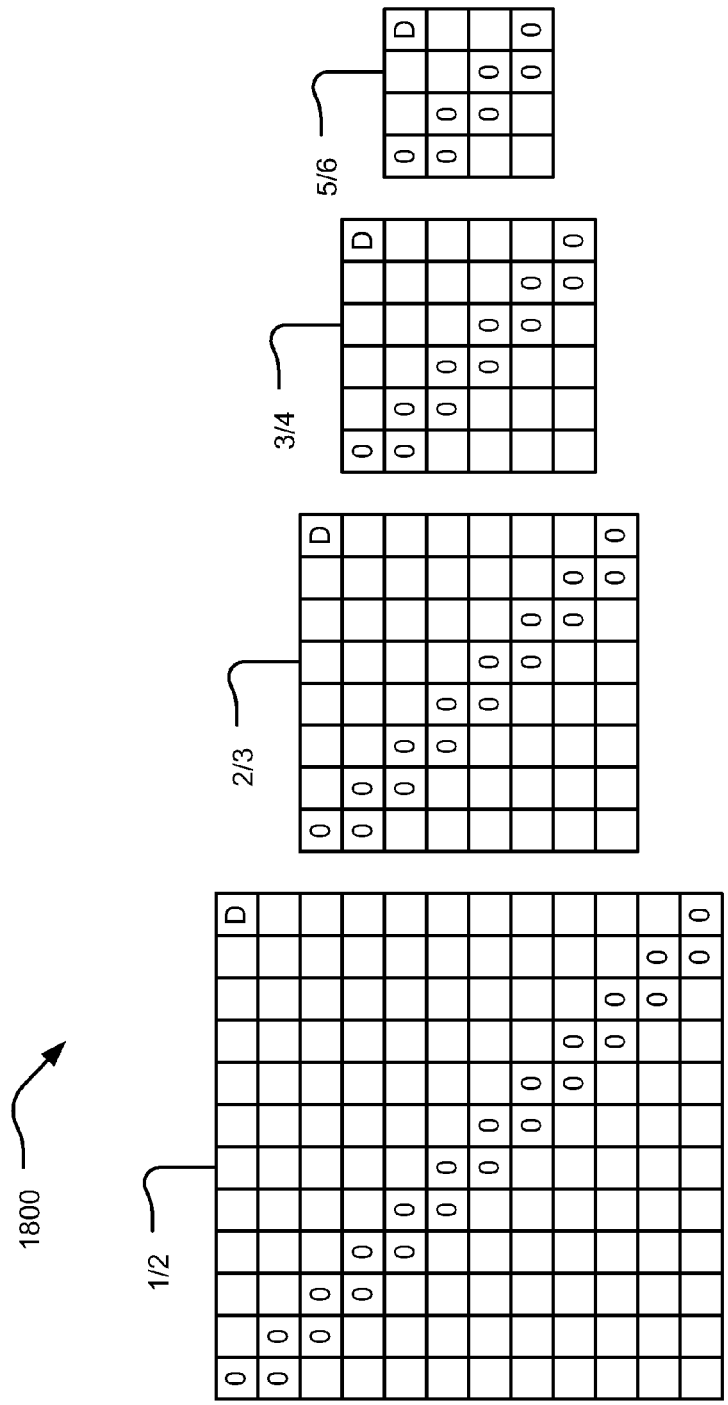

FIG. 17 and FIG. 18 illustrate two embodiments of parity portion constraints for parity check matrices as a function of code rate.

Referring to embodiment 1700 of the FIG. 17, the parity portion constraints are provided for each of the code rates of ½, ⅔, ¾, and ⅚. Each of the sub-matrices of these matrices is a CSI (Cyclic Shifted Identity) matrix. However, the performance of an LDPC generated according to this parity portion constraint is not going to be very good because of the breaking of the large open loop therein to form several smaller open loops. This principle is described in more detail below as well.

Referring to embodiment 1800 of the FIG. 18, alternative parity portion constraints are provided for each of the code rates of ½, ⅔, ¾, and ⅚. Of note are the "D" entries in the upper-right hand portion of these matrices. This embodiment provides for a large open loop which can provide for good performance. However, each of the sub-matrices are not uniformly defined because of the "D" matrices, which are not CSI matrices. The format of the "D" matrix is depicted explicitly above.

Figure 19:
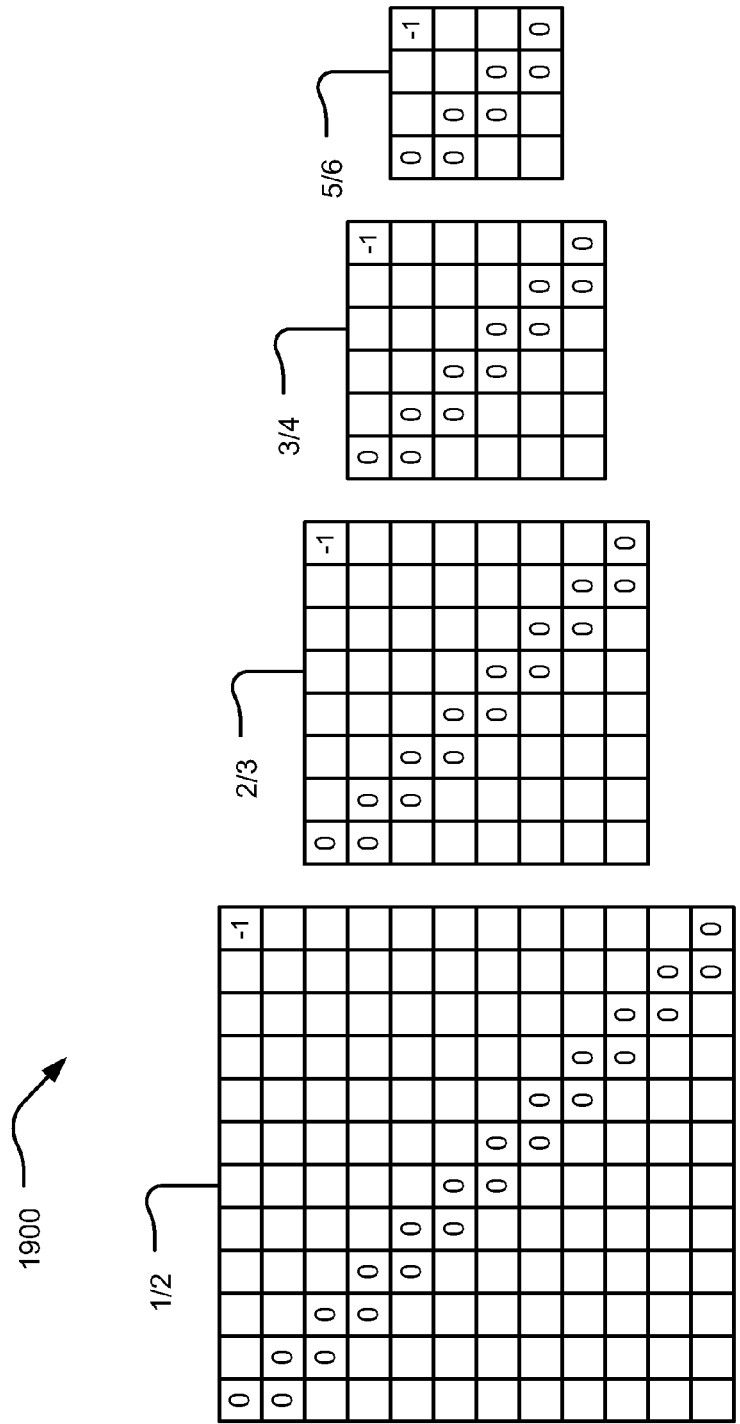
FIG. 19 and FIG. 20 illustrate two alternative embodiments of parity portion constraints for parity check matrices as a function of code rate.
Figure 20:
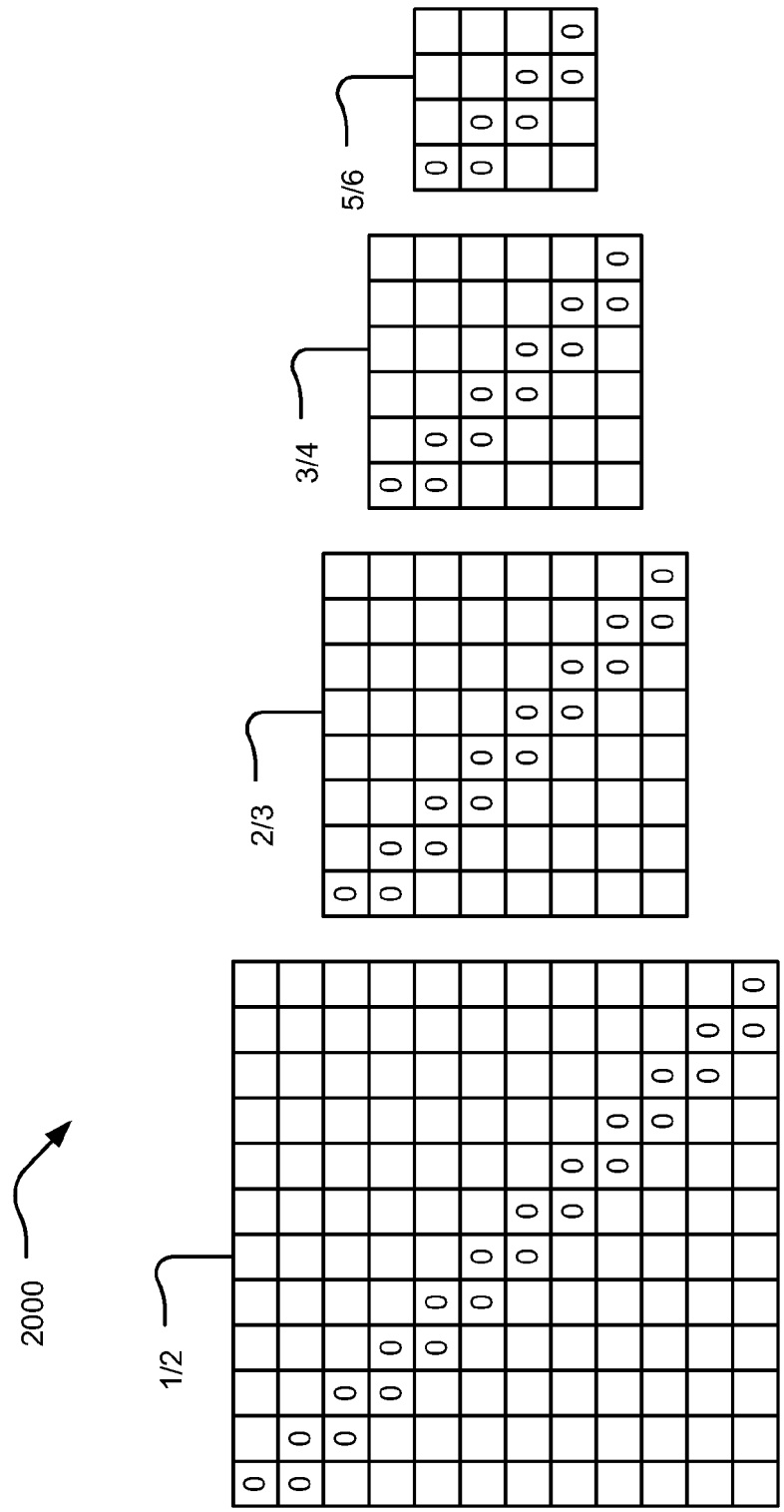

FIG. 19 and FIG. 20 illustrate two alternative embodiments of parity portion constraints for parity check matrices as a function of code rate.

Referring to embodiment 1900 of the FIG. 19, other alternative parity portion constraints are provided for each of the code rates of ½, ⅔, ¾, and ⅚. Of note are the "−1" entries in the upper-right hand portion of these matrices. All of the sub-matrices of this embodiment are CSI matrices. In addition, is provides a large cycle having the same size as the large open loop of the parity portion constraint of the embodiment 1800 of the FIG. 18. Also, each of the bit nodes has a degree greater than 1 (i.e., 2 or more).

Referring to embodiment 1900 of the FIG. 20, even other alternative parity portion constraints are provided for each of the code rates of ½, ⅔, ¾, and ⅚. This embodiment provides for a wide variety of encoding means and also provides for a large minimum distance thereby ensuring a very high error correcting capability.

Figure 21:
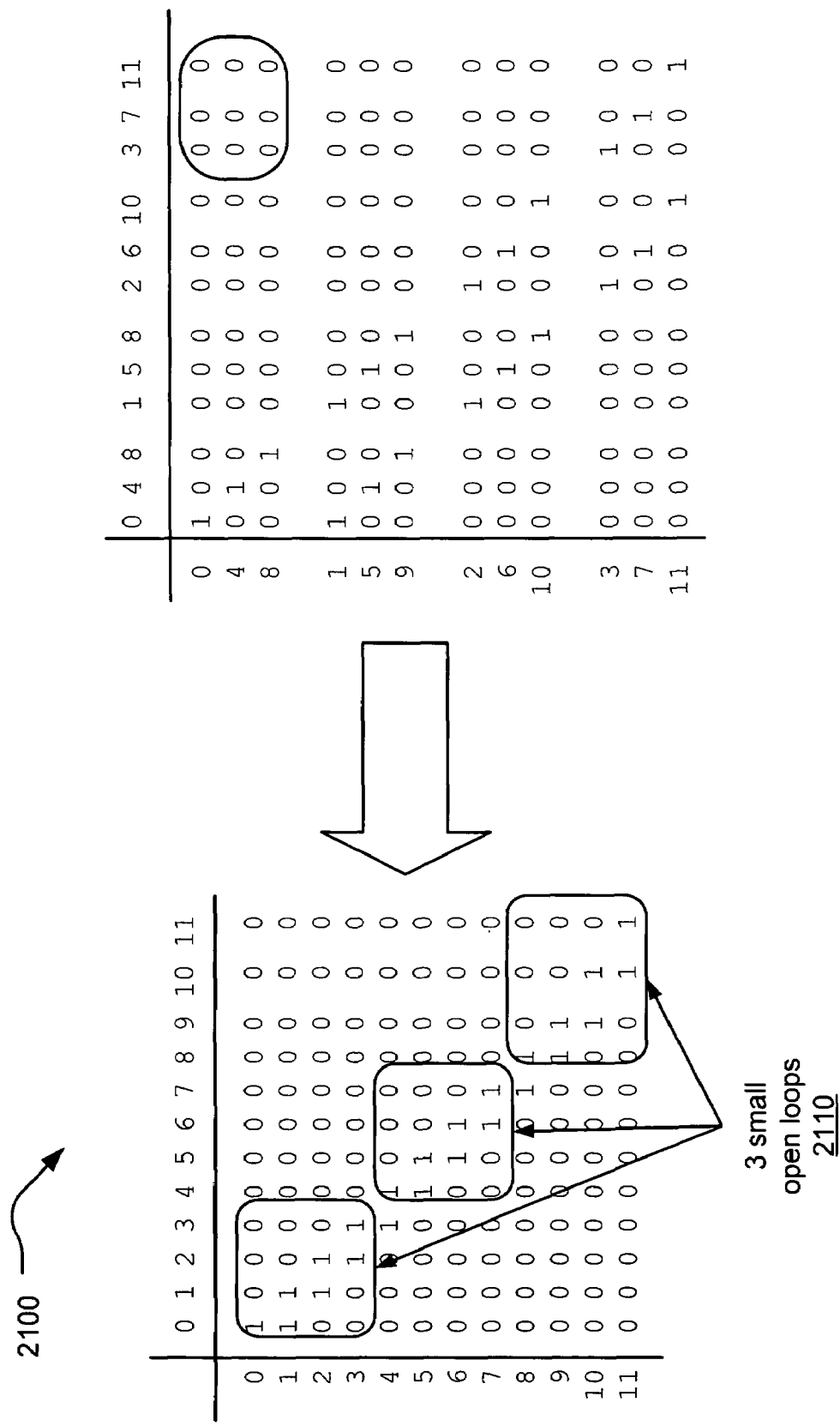
FIG. 21 illustrates an embodiment of the permutation of one of the LDPC codes whose performance is depicted below within FIG. 24 (i.e., LDPC code ($C_9$)), and specifically the small loops existent therein.

FIG. 21 illustrates an embodiment 2100 of the permutation of one of the LDPC codes whose performance is depicted below within FIG. 24 (i.e., LDPC code ($C_9$)), and specifically the small loops existent therein. This LDPC code ($C_9$) is generated according to the parity portion constraint of the embodiment 1700 of the FIG. 17.

Of particular note with respect to this embodiment is the upper right hand 3×3 sub-matrix that is provided here as well for ease of the reader.

$$\begin{bmatrix} 0 & 0 & 0 \\ 0 & 0 & 0 \\ 0 & 0 & 0 \end{bmatrix},$$

which is an all zero-valued sub-matrix.

As can be seen, there are also 3 small open loops (depicted using reference numeral 2110 on the left hand side of the diagram).

Figure 22:
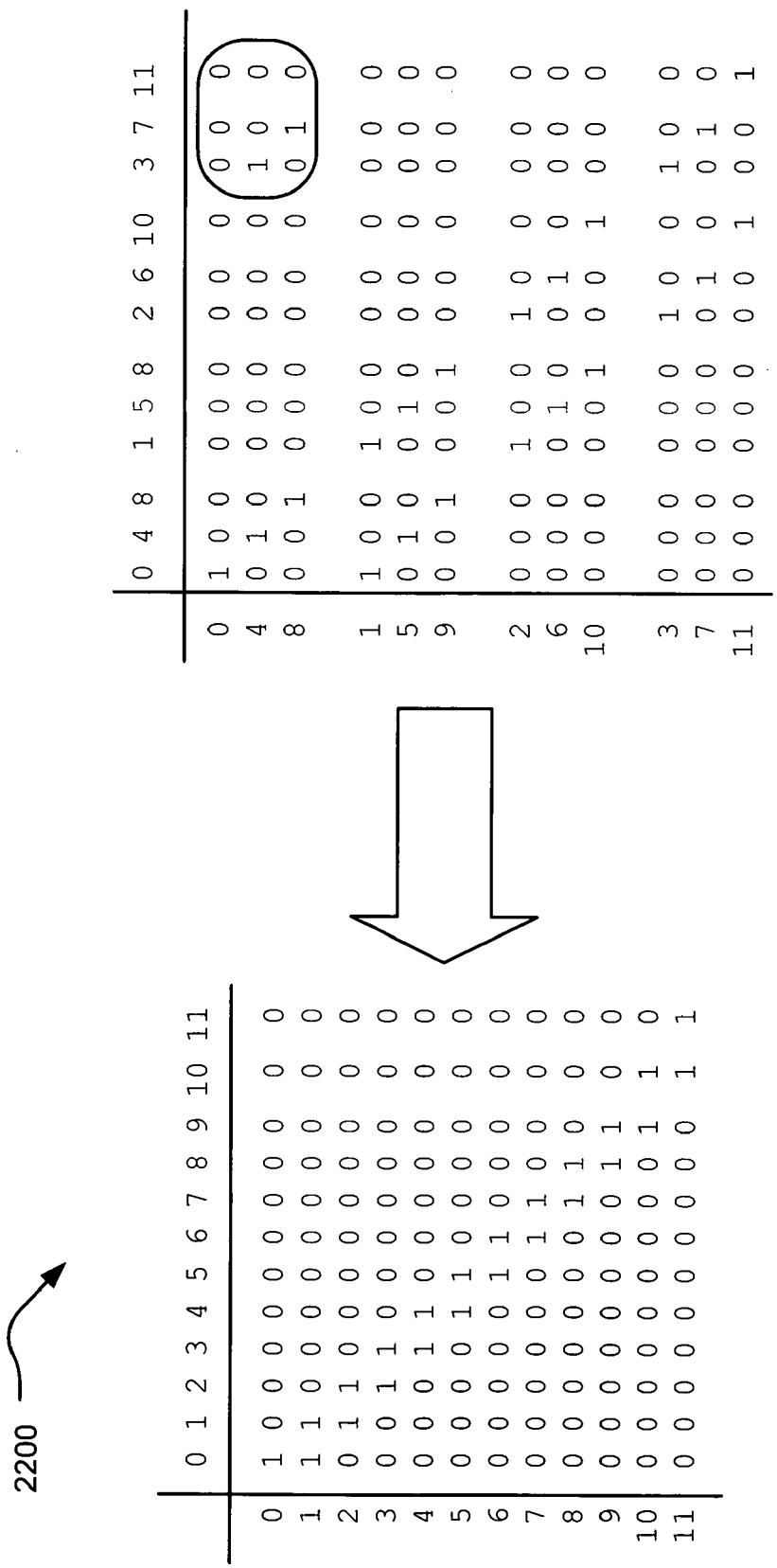
FIG. 22 illustrates an embodiment of the permutation of one of the LDPC codes whose performance is depicted below within FIG. 24 (i.e., LDPC(11)), and specifically the small loops existent therein.

FIG. 22 illustrates an embodiment 2200 of the permutation of one of the LDPC codes whose performance is depicted below within FIG. 24 (i.e., LDPC(11)), and specifically the small loops existent therein.

This LDPC(11) is generated according to the parity portion constraint of the embodiment 1800 of the FIG. 18. Of particular note with respect to this embodiment is the upper right hand 3×3 sub-matrix that is provided here as well for ease of the reader.

$$\begin{bmatrix} 0 & 0 & 0 \\ 1 & 0 & 0 \\ 0 & 1 & 0 \end{bmatrix}.$$

This embodiment provides a very large open loop.

Figure 23:
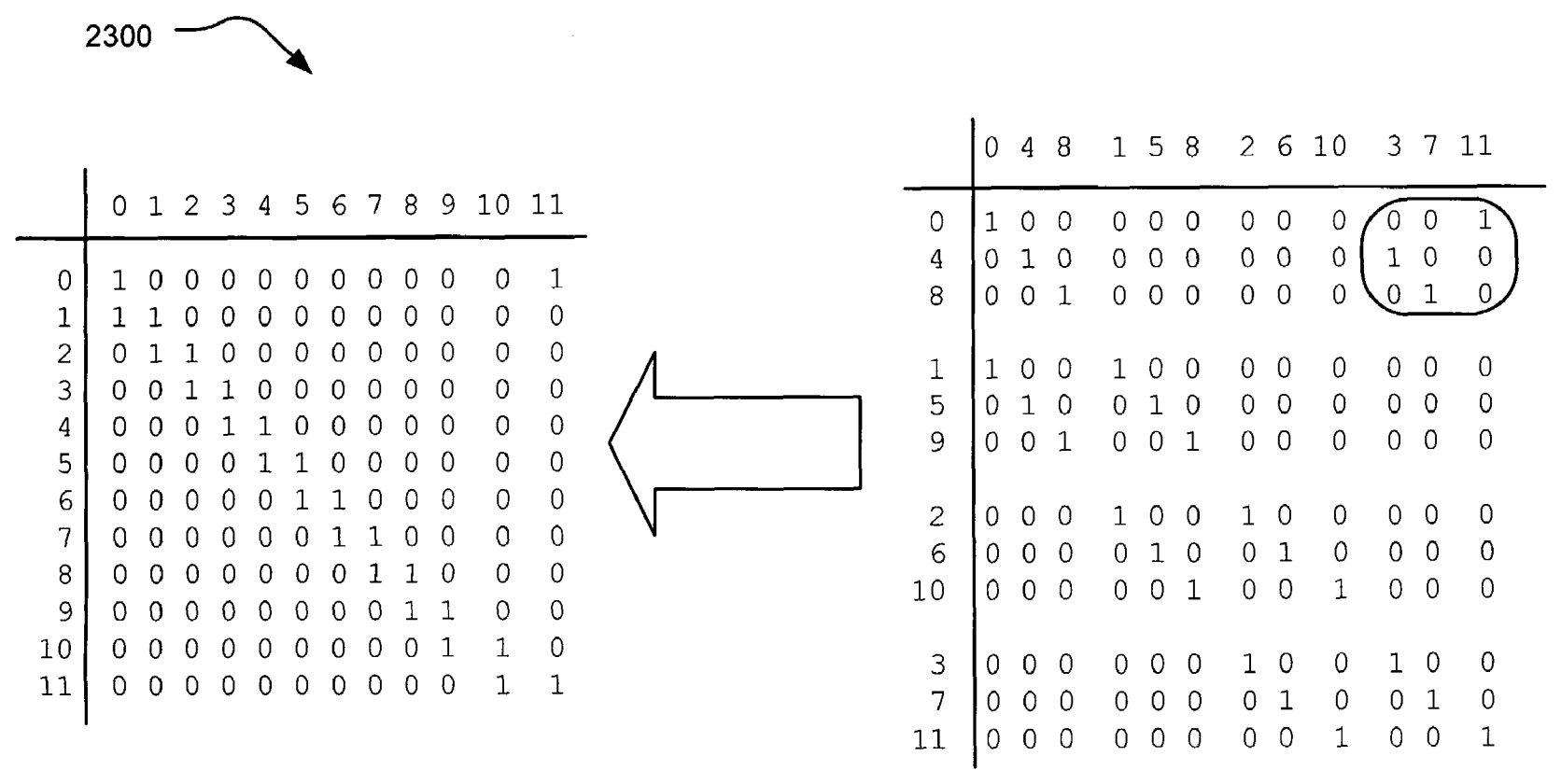

FIG. 23 illustrates an embodiment of the permutation of one of the LDPC codes whose performance is depicted below within FIG. 24 (i.e., LDPC code ($C_8$)), and specifically the small loops existent therein. This LDPC code ($C_8$) is generated according to the parity portion constraint of the embodiment 1900 of the FIG. 19.

Of particular note with respect to this embodiment is the upper right hand 3×3 sub-matrix that is provided here as well for ease of the reader.

$$\begin{bmatrix} 0 & 0 & 1 \\ 1 & 0 & 0 \\ 0 & 1 & 0 \end{bmatrix}.$$

As such, the upper-right hand entry of the $0^{th}$ row, $11^{th}$ column entry is "1", as can be seen on the left hand side portion of this diagram before performing the permutation.

Figure 24:
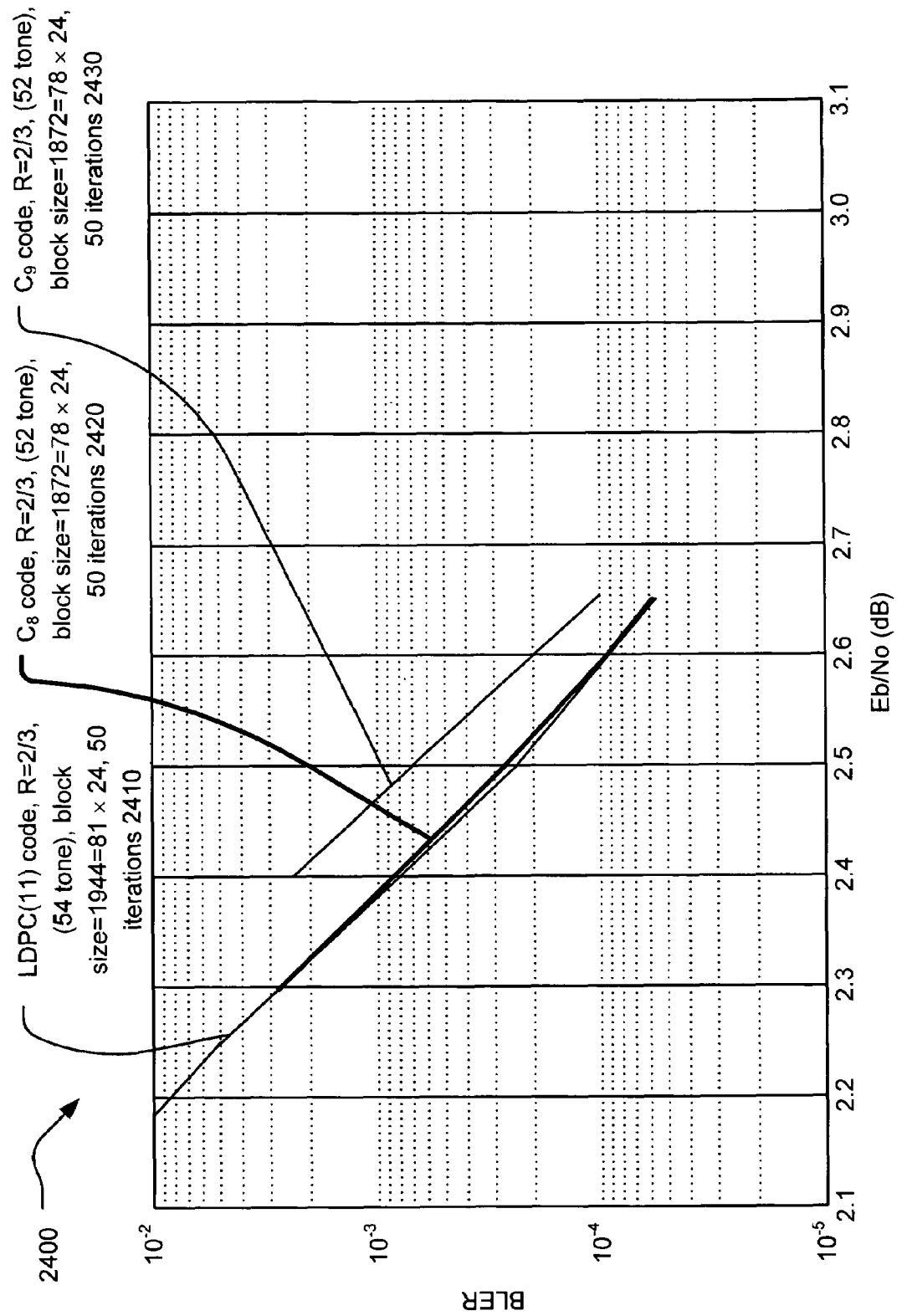
FIG. 24 illustrates an embodiment of a performance comparison between an LDPC code (i.e., LDPC(11)) and 2 other LDPC codes ($C_8$ and $C_9$), whose parity check matrices include at least one CSI sub-matrix.

FIG. 24 illustrates an embodiment of a performance comparison between an LDPC code (i.e., LDPC(11)) and 2 other LDPC codes ($C_8$ and $C_9$), whose parity check matrices include at least one CSI sub-matrix.

The performance of the LDPC code, LDPC(11), after performing 50 decoding iterations, is depicted by reference numeral 2410. LDPC(11) has a code rate of R=⅔, (54 tone), and a block size=1944=81×24.

The performance of the LDPC code, $C_8$, after performing 50 decoding iterations, is depicted by reference numeral 2420. LDPC code, $C_8$, has a code rate of R=⅔, (52 tone), and a block size=1872=78×24.

The performance of the LDPC code, $C_9$, after performing 50 decoding iterations, is depicted by reference numeral 2430. LDPC code, $C_9$, has a code rate of R=⅔, (52 tone), and a block size=1872=78×24.

Figure 25:
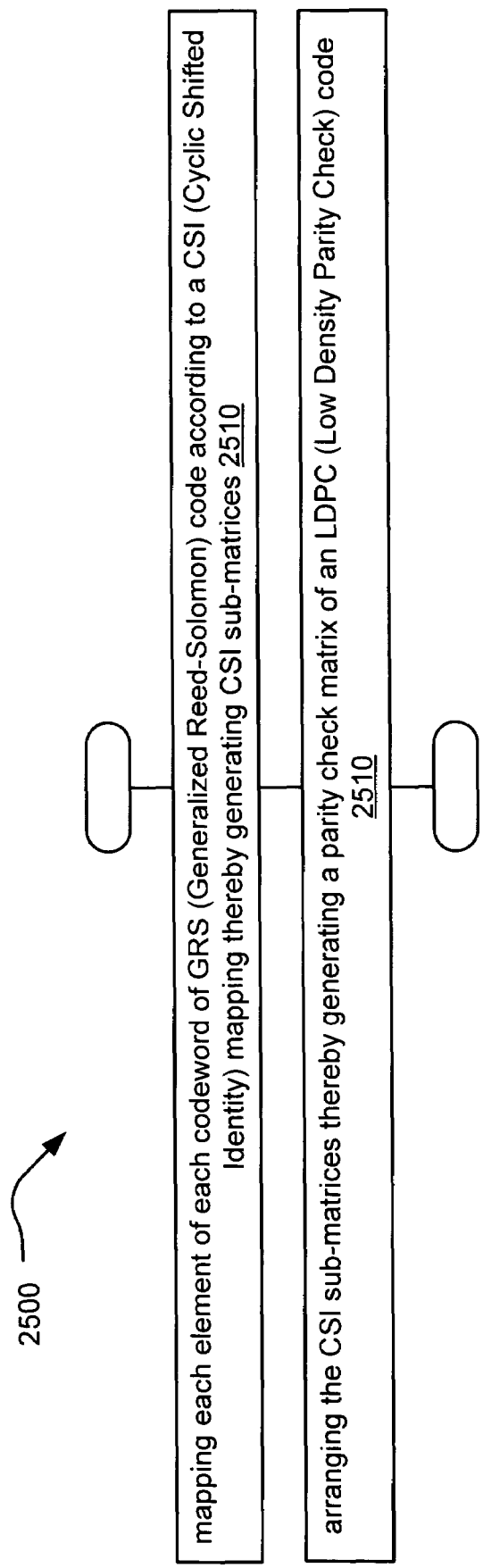
FIG. 25 and FIG. 26 illustrate alternative embodiments of methods for constructing a parity check matrix corresponding to a regular or an irregular LDPC code.
Figure 26:
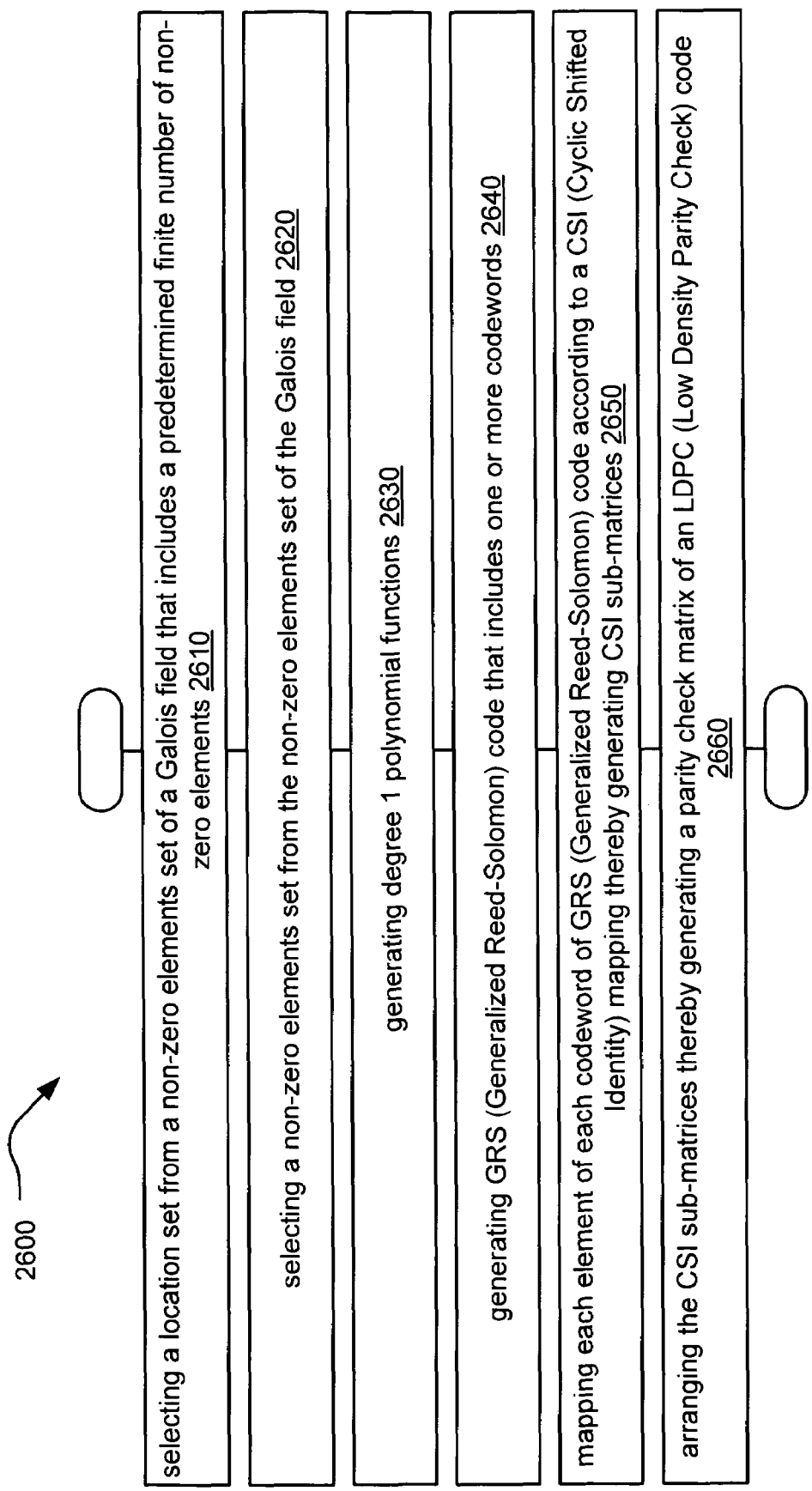

FIG. 25 and FIG. 26 illustrate alternative embodiments of methods for constructing a parity check matrix corresponding to a regular or an irregular LDPC code.

Referring to method 2500 of the FIG. 25, the method 2500 involves mapping each element of each codeword of GRS (Generalized Reed-Solomon) code according to a CSI (Cyclic Shifted Identity) mapping thereby generating CSI sub-matrices, as shown in a block 2510. Then, the method involves arranging the CSI sub-matrices thereby generating a parity check matrix of an LDPC (Low Density Parity Check) code, as shown in a block 2520. Great latitude is provided to the manner in which the plurality of CSI sub-matrices is arranged, and several possible embodiments are provided above.

Referring to method 2600 of the FIG. 26, the method 2600 involves selecting a location set from a non-zero elements set of Galois field that includes a predetermined finite number of non-zero elements, as shown in a block 2610. The non-zero elements set of Galois field includes one less element (i.e., no all 0 valued element) than an original Galois field. The method 2600 then continues by selecting a non-zero elements set from the non-zero elements set of Galois field, as shown in a block 2620.

Thereafter, the method 2600 involves generating a number of degree 1 polynomial functions, as shown in a block 2630. Each of these degree 1 polynomial function is a function of one corresponding coefficient of a number of coefficients and one constant of a number of constants. The number of coefficients and the number of constants are determined by the location set and the non-zero elements set. Several embodiments above describe and show possible means by which these values may be determined based on some constraints set forth by a designer. For example, the constraints set forth in the design of the LDPC code determine the structure of the LDPC code. Moreover, each degree 1 polynomial function of the number of degree 1 polynomial functions is a non-scalar multiple of every other 1 polynomial function of the number of degree 1 polynomial functions.

The method 2600 then involves generating GRS code that includes one or more codewords, as shown in a block 2640. Each codeword of the GRS code includes a number of codeword elements, and each codeword element of each codeword is a product of one element of the non-zero elements set and a resultant generated from one degree 1 polynomial function of the number of degree 1 polynomial functions evaluated at one element of the location set.

As shown in a block 2650, the method 2600 then involves mapping each element of each codeword of the GRS code according to a CSI (Cyclic Shifted Identity) mapping thereby generating CSI sub-matrices. The method 2600 then involves arranging the CSI sub-matrices thereby generating a parity check matrix of an LDPC code, as shown in a block 2660.

As mentioned above, once the low density parity check matrix, H, is available for use in decoding processing at a receiving end of a communication channel, the corresponding generator matrix, G, of the LDPC code may be generated straightforwardly from the low density parity check matrix, H. Having this information allows a designer to implement the encoding processing (using the generator matrix, G, of the LDPC code) at the transmitter end of the communication channel and also to decoding processing (using the low density parity check matrix, H, of the LDPC code) at the receiver end of the communication channel.

Figure 27:
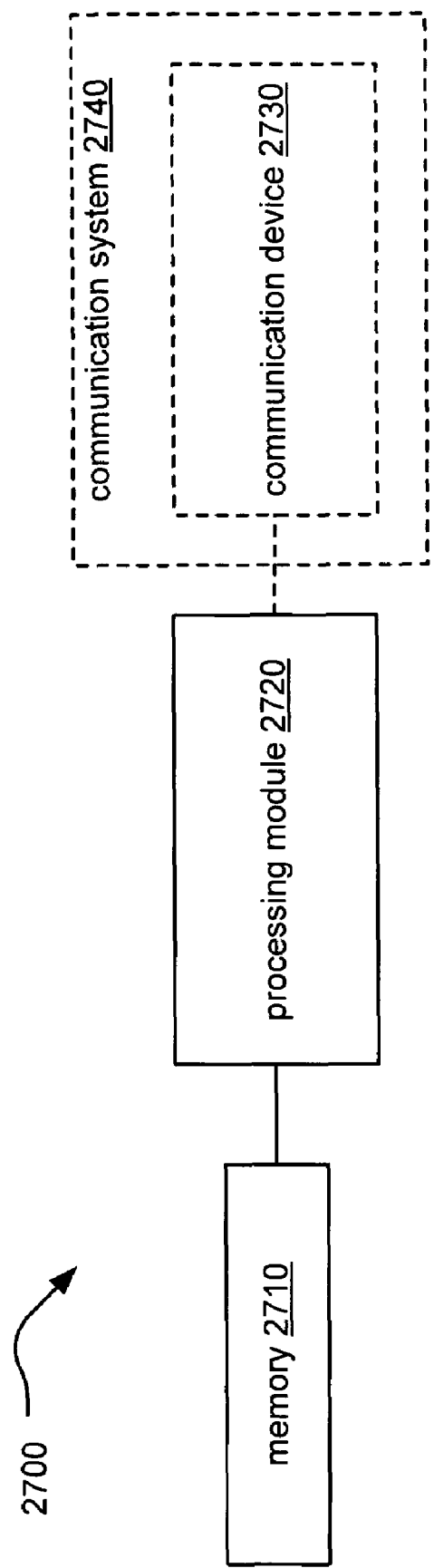
FIG. 27 illustrates an embodiment of an apparatus that is operable to construct a parity check matrix corresponding to a regular or an irregular LDPC code.

FIG. 27 illustrates an embodiment of an apparatus 2700 that is operable to construct a parity check matrix corresponding to a regular or an irregular LDPC code. The apparatus 2700 includes a processing module 2720. and a memory 2710. The memory 2710 is coupled to the processing module, and the memory 2710 is operable to store operational instructions that enable the processing module 2720 to perform a variety of functions. The processing module 2720 is operable to map each element of each codeword of a plurality of codewords of GRS (Generalized Reed-Solomon) code according to a CSI (Cyclic Shifted Identity) mapping thereby generating a plurality of CSI sub-matrices. The processing module 2720 is also operable to arrange the plurality of CSI sub-matrices thereby generating a parity check matrix of an LDPC code.

The processing module 2720 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 2710 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 2720 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The apparatus 2700, in conjunction with additional operational instructions that can be stored in the memory 2710, can be implemented to perform additional functions as well when constructing a parity check matrix of an LDPC code. For example, the parity check matrix of an LDPC code can be implemented to perform analogous operations as described within the method 2600 of the FIG. 26.

If desired in some embodiments, the parity check matrix of the LDPC code can be provided from the apparatus 2700 to a communication system 2740 that is operable to employ and perform error correcting coding using that LDPC code. The parity check matrix of the LDPC code can also be provided from the apparatus 2700 to any of a variety of communication devices 2730 implemented within the communication system 2740 as well. This way, a completed integrated means is provided by which the parity check matrix of the LDPC code (and from which a generator matrix of the LDPC code may be constructed) can be constructed in hardware and provided to one or more the communication devices 2730 implemented within a communication system 2740 to employ that LDPC code. If desired, the apparatus 2720 can be designed to generate multiple parity check matrices corresponding to multiple LDPC codes as well. In some embodiments, the apparatus 2720 can selectively provide different information (corresponding to different LDPC codes) to different communication devices and/or communication systems. That way, different communication links between different communication devices can employ different error correcting coding. Clearly, the apparatus 2720 could also provide the same information (corresponding to a singular LDPC code) to each of different communication devices and/or communication systems as well without departing from the scope and spirit of the invention.

Any of the methods and apparatus described herein can be implemented to form any of the various embodiments of parity check matrices corresponding to any of the LDPC codes (both regular and irregular) described herein.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A method, comprising:
   selecting a location set from a non-zero elements set of a Galois field that includes a predetermined finite number of non-zero elements;
   selecting a non-zero elements set from the non-zero elements set of the Galois field;
   generating a plurality of degree 1 polynomial functions, wherein:
   each degree 1 polynomial function is a function of one corresponding coefficient of a plurality of coefficients and one constant of a plurality of constants, wherein the plurality of coefficients and the plurality of constants are determined by the location set and the non-zero elements set; and
   each degree 1 polynomial function of the plurality of degree 1 polynomial functions is a non-scalar multiple of every other 1 polynomial function of the plurality of degree 1 polynomial functions; and
   generating GRS (Generalized Reed-Solomon) code that includes the plurality of codewords;
   mapping each element of each codeword of a plurality of codewords of the GRS code according to a CSI (Cyclic Shifted Identity) mapping thereby generating a plurality of CSI sub-matrices; and
   arranging the plurality of CSI sub-matrices thereby generating a parity check matrix of an LDPC (Low Density Parity Check) code.

2. The method claim 1, wherein:
   the method is performed within a communication device; and
   the communication device is implemented within at least one of a satellite communication system, a wireless communication system, a wired communication system, and a fiber-optic communication system.

3. The method claim 1, wherein:
   each codeword of the GRS code includes a plurality of codeword elements; and
   each codeword element of each codeword of the plurality of codewords is a product of one element of the non-zero elements set and a resultant generated from one degree 1 polynomial function of the plurality of degree 1 polynomial functions evaluated at one element of the location set.

4. The method claim 1, further comprising:
   puncturing at least one CSI sub-matrix of the plurality of CSI sub-matrices of the parity check matrix thereby transforming the parity check matrix of the LDPC code to a parity check matrix of an irregular LDPC code.

5. The method claim 1, further comprising:
   performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:
   each sub-matrix of the second plurality of sub-matrixes that is situated along a diagonal of the second sub-matrix is an identity matrix;
   each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and
   each remaining sub-matrix of the second plurality of sub-matrices of the second sub-matrix is an all zero-valued sub-matrix.

6. The method claim 5, further comprising:
   puncturing at least one sub-matrix of the first plurality of sub-matrices of the first sub-matrix thereby transforming the parity check matrix of the LDPC code to a parity check matrix of an irregular LDPC code.

7. The method claim 5, further comprising:
puncturing at least one element of the first sub-matrix thereby transforming the parity check matrix of the LDPC code to a parity check matrix of an irregular LDPC code.

8. The method claim 1, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:
 each sub-matrix of the second plurality of sub-matrixes that is situated along a diagonal of the second sub-matrix is an identity matrix;
 each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;
 a sub-matrix of the plurality of sub-matrices situated in an upper right hand corner of the second sub-matrix is a CSI sub-matrix is generated by cyclic shifting an identity matrix by 1 position; and
 each remaining sub-matrix of the second plurality of sub-matrices of the second sub-matrix is an all zero-valued sub-matrix.

9. The method claim 8, further comprising:
punturing at least one sub-matrix of the first plurality of sub-matrices of the first sub-matrix thereby transforming the parity check matrix of the LDPC code to a parity check matrix of an irregular LDPC code.

10. The method claim 8, further comprising:
punturing at least one element of the first sub-matrix thereby transforming the parity check matrix of the LDPC code to a parity check matrix of an irregular LDPC code.

11. The method claim 1, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:
 each sub-matrix of the second plurality of sub-matrixes that is situated along a diagonal of the second sub-matrix is an identity matrix;
 each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and
 an upper right hand sub-matrix of the second plurality of sub-matrices situated in an upper right hand corner of the second sub-matrix is a CSI sub-matrix is generated by cyclic shifting an identity matrix by 1 position and puncturing any non-zero element in a top row of the upper right hand sub-matrix of the second plurality of sub-matrices;
each remaining sub-matrix of the second plurality of sub-matrices of the second sub-matrix is an all zero-valued sub-matrix.

12. The method claim 11, further comprising:
punturing at least one sub-matrix of the first plurality of sub-matrices of the first sub-matrix thereby transforming the parity check matrix of the LDPC code to a parity check matrix of an irregular LDPC code.

13. The method claim 11, further comprising:
punturing at least one element of the first sub-matrix thereby transforming the parity check matrix of the LDPC code to a parity check matrix of an irregular LDPC code.

14. The method claim 11, further comprising:
performing at least one of row permutation and column permutation to the second sub-matrix, wherein:
 each diagonal element of the second sub-matrix is a 1 value;
 each element of the second sub-matrix having a 1 value along the diagonal directly above and adjacent thereto and also having a 1 value along the diagonal directly right and adjacent thereto also is a value of 1; and
 each remaining element of the second sub-matrix is a value of 0.

15. The method claim 1, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:
 each sub-matrix of the second plurality of sub-matrixes that is situated along a diagonal of the second sub-matrix is an identity matrix;
 each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;
 a sub-matrix of the second plurality of sub-matrices situated in an upper right hand corner of the second sub-matrix is a CSI sub-matrix is generated by cyclic shift an identity matrix by 1 position;
 a row of the second sub-matrix includes three identity sub-matrices; and
 a sub-matrix of the second plurality of sub-matrices situated in a lower right hand corner of the second sub-matrix is a CSI sub-matrix is generated by cyclic shifting an identity matrix by 1 position.

16. The method claim 15, further comprising:
selecting the row of the second sub-matrix that includes three identity sub-matrices.

17. The method claim 15, further comprising:
punturing at least one sub-matrix of the first plurality of sub-matrices of the first sub-matrix thereby transforming the parity check matrix of the LDPC code to a parity check matrix of an irregular LDPC code.

18. The method claim 15, further comprising:
punturing at least one element of the first sub-matrix thereby transforming the parity check matrix of the LDPC code to a parity check matrix of an irregular LDPC code.

19. A method, comprising:
selecting a location set from a non-zero elements set of a Galois field that includes a predetermined finite number of non-zero elements;
selecting a non-zero elements set from the non-zero elements set of the Galois field;
generating a plurality of degree 1 polynomial functions, wherein:
 each degree 1 polynomial function is a function of one corresponding coefficient of a plurality of coefficients and one constant of a plurality of constants, wherein the plurality of coefficients and the plurality of constants are determined by the location set and the non-zero elements set; and each degree 1 polynomial function of the plurality of degree 1 polynomial functions is a non-scalar multiple of every other 1 polynomial function of the plurality of degree 1 polynomial functions;

generating GRS (Generalized Reed-Solomon) code that includes a plurality of codewords, wherein:

each codeword of the GRS code includes a plurality of codeword elements; and each codeword element of each codeword of the plurality of codewords is a product of one element of the non-zero elements set and a resultant generated from one degree 1 polynomial function of the plurality of degree 1 polynomial functions evaluated at one element of the location set; and mapping each element of each codeword of the plurality of codewords of the GRS code according to a CSI (Cyclic Shifted Identity) mapping thereby generating a plurality of CSI sub-matrices;

arranging the plurality of CSI sub-matrices thereby generating a parity check matrix of an LDPC (Low Density Parity Check) code.

20. The method claim 19, further comprising:
puncturing at least one CSI sub-matrix of the plurality of CSI sub-matrices of the parity check matrix thereby transforming the parity check matrix of the LDPC code to a parity check matrix of an irregular LDPC code.

21. The method claim 19, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:

each sub-matrix of the second plurality of sub-matrixes that is situated along a diagonal of the second sub-matrix is an identity matrix;

each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and each remaining sub-matrix of the second plurality of sub-matrices of the second sub-matrix is an all zero-valued sub-matrix.

22. The method claim 19, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:

each sub-matrix of the second plurality of sub-matrixes that is situated along a diagonal of the second sub-matrix is an identity matrix;

each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;

a sub-matrix of the plurality of sub-matrices situated in an upper right hand corner of the second sub-matrix is a CSI sub-matrix is generated by cyclic shifting an identity matrix by 1 position; and each remaining sub-matrix of the second plurality of sub-matrices of the second sub-matrix is an all zero-valued sub-matrix.

23. The method claim 19, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:

each sub-matrix of the second plurality of sub-matrixes that is situated along a diagonal of the second sub-matrix is an identity matrix;

each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and an upper right hand sub-matrix of the second plurality of sub-matrices situated in an upper right hand corner of the second sub-matrix is a CSI sub-matrix is generated by cyclic shifting an identity matrix by 1 position and puncturing any non-zero element in a top row of the upper right hand sub-matrix of the second plurality of sub-matrices;

each remaining sub-matrix of the second plurality of sub-matrices of the second sub-matrix is an all zero-valued sub-matrix.

24. The method claim 19, further comprising:
performing at least one of row permutation and column permutation to the parity check matrix of the LDPC code thereby arranging the parity check matrix into a first sub-matrix that includes a first plurality of sub-matrices and a second sub-matrix that includes a second plurality of sub-matrices, wherein:

each sub-matrix of the second plurality of sub-matrixes that is situated along a diagonal of the second sub-matrix is an identity matrix;

each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;

a sub-matrix of the second plurality of sub-matrices situated in an upper right hand corner of the second sub-matrix is a CSI sub-matrix is generated by cyclic shift an identity matrix by 1 position;

a row of the second sub-matrix includes three identity sub-matrices; and a sub-matrix of the second plurality of sub-matrices situated in a lower right hand corner of the second sub-matrix is a CSI sub-matrix is generated by cyclic shifting an identity matrix by 1 position.

25. An apparatus, comprising:
a processing module; and
a memory, coupled to the processing module, that is operable to store operational instructions that enable the processing module to:

select a location set from a non-zero elements set of a Galois field that includes a predetermined finite number of non-zero elements;

select a non-zero elements set from the non-zero elements set of the Galois field;

generate a plurality of degree 1 polynomial functions, wherein:
  each degree 1 polynomial function is a function of one corresponding coefficient of a plurality of coefficients and one constant of a plurality of constants, wherein the plurality of coefficients and the plurality of constants are determined by the location set and the non-zero elements set; and
  each degree 1 polynomial function of the plurality of degree 1 polynomial functions is a non-scalar multiple of every other 1 polynomial function of the plurality of degree 1 polynomial functions;
generate GRS (Generalized Reed-Solomon) code that includes the plurality of codewords;
map each element of each codeword of a plurality of codewords of the code according to a CSI (Cyclic Shifted Identity) mapping thereby generating a plurality of CSI sub-matrices; and
arrange the plurality of CSI sub-matrices thereby generating a parity check matrix of an LDPC (Low Density Parity Check) code.

26. The apparatus of claim 25, wherein:
the apparatus is a communication device; and
the communication device is implemented within at least one of a satellite communication system, a wireless communication system, a wired communication system, and a fiber-optic communication system.

27. The apparatus claim 25, wherein:
each codeword of the GRS code includes a plurality of codeword elements; and
each codeword element of each codeword of the plurality of codewords is a product of one element of the non-zero elements set and a resultant generated from one degree 1 polynomial function of the plurality of degree 1 polynomial functions evaluated at one element of the location set.

28. The apparatus of claim 25, wherein:
the memory, coupled to the processing module, is operable to store operational instructions that enable the processing module to:
puncture at least one CSI sub-matrix of the plurality of CSI sub-matrices of the parity check matrix thereby transforming the parity check matrix of the LDPC code to a parity check matrix of an irregular LDPC code.

29. An apparatus, comprising:
an input that receives an LDPC (Low Density Parity Check) coded signal; and
an LDPC decoder that employs an LDPC matrix to decode the LDPC coded signal to make an estimate of an information bit encoded therein; and wherein:
the LDPC matrix, composed of a plurality of sub-matrices each having a common size, is partitioned into a left hand side matrix and a right hand side matrix;
each sub-matrix within the right hand side matrix is an all zero-valued sub-matrix except those sub-matrices identified below in (a) and (b):
  (a) each sub-matrix located on a diagonal of the right hand side matrix is a CSI (Cyclic Shifted Identity) sub-matrix; and
  (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix.

30. The apparatus of claim 29, wherein:
each sub-matrix of the left hand side matrix is either an all zero-valued sub-matrix or a CSI sub-matrix.

31. The apparatus of claim 30, wherein:
one of the plurality of sub-matrices in the left hand side matrix is an identity sub-matrix or a CSI sub-matrix having undergone a cyclic shift of 0.

32. The apparatus of claim 29, wherein:
each CSI sub-matrix identified in (a) and (b) is an identity sub-matrix or a CSI sub-matrix having undergone a cyclic shift of 0.

33. The apparatus of claim 29, wherein:
one of the CSI sub-matrices identified in (a) and (b) is an identity sub-matrix or a CSI sub-matrix having undergone a cyclic shift of 0.

34. The apparatus of claim 29, wherein:
each of the plurality of sub-matrices is a square sub-matrix.

35. The apparatus of claim 29, wherein:
the right hand side matrix is a square matrix.

36. The apparatus of claim 29, wherein:
each of the plurality of sub-matrices is a 108×108 square sub-matrix having 108 rows and 108 columns.

37. The apparatus of claim 29, wherein:
an irregular LDPC code is used to generate the LDPC coded signal.

38. The apparatus of claim 37, wherein:
all check equations of the irregular LDPC code have a same degree.

39. The apparatus of claim 29, wherein:
the apparatus is a wireless communication device.

40. The apparatus of claim 29, wherein:
the apparatus is a communication device; and
the communication device is a transceiver.

41. The apparatus of claim 29, wherein:
the apparatus is a communication device; and
the communication device is a receiver.

42. The apparatus of claim 29, wherein:
the apparatus is a communication device; and
the communication device is implemented within at least one of a satellite communication system, a wireless communication system, a wired communication system, and a fiber-optic communication system.

* * * * *